United States Patent
Rzepiela et al.

(10) Patent No.: US 7,893,703 B2
(45) Date of Patent: Feb. 22, 2011

(54) SYSTEMS AND METHODS FOR CONTROLLING DEPOSITION OF A CHARGE ON A WAFER FOR MEASUREMENT OF ONE OR MORE ELECTRICAL PROPERTIES OF THE WAFER

(75) Inventors: Jeffrey A. Rzepiela, Sunnyvale, CA (US); Yiping Feng, Cupertino, CA (US); Shiyou Pei, Saratoga, CA (US); Alexander Kagan, San Jose, CA (US); Jianou Shi, Milpitas, CA (US); Sergio Edelstein, Los Gatos, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 22 days.

(21) Appl. No.: 11/465,893

(22) Filed: Aug. 21, 2006

(65) Prior Publication Data
US 2007/0069759 A1    Mar. 29, 2007

Related U.S. Application Data

(60) Provisional application No. 60/709,736, filed on Aug. 19, 2005.

(51) Int. Cl.
*G01R 31/308* (2006.01)
(52) U.S. Cl. .................................. 324/754.24
(58) Field of Classification Search .......... 324/455–457
See application file for complete search history.

(56) References Cited

U.S. PATENT DOCUMENTS

| | | |
|---|---|---|
| 3,495,269 A | 2/1970 | Mutschler et al. |
| 3,496,352 A | 2/1970 | Jugle |
| 3,715,656 A | 2/1973 | Hyde et al. |
| 3,855,527 A | 12/1974 | Masopust |
| 3,990,005 A | 11/1976 | Abbe et al. |

(Continued)

FOREIGN PATENT DOCUMENTS

JP        2002025791 A  *  1/2002

(Continued)

OTHER PUBLICATIONS

U.S. Appl. No. 10/701,112, filed Nov. 4, 2003, Samsavar et al.

(Continued)

*Primary Examiner*—Ha Tran T Nguyen
*Assistant Examiner*—Richard Isla Rodas
(74) *Attorney, Agent, or Firm*—Ann Marie Mewherter

(57) ABSTRACT

Systems and methods for controlling deposition of a charge on a wafer for measurement of one or more electrical properties of the wafer are provided. One system includes a corona source configured to deposit the charge on the wafer and a sensor configured to measure one or more conditions within the corona source. This system also includes a control subsystem configured to alter one or more parameters of the corona source based on the one or more conditions. Another system includes a corona source configured to deposit the charge on the wafer and a mixture of gases disposed within a discharge chamber of the corona source during the deposition of the charge. The mixture of gases alters one or more parameters of the charge deposited on the wafer.

18 Claims, 21 Drawing Sheets

U.S. PATENT DOCUMENTS

| | | | |
|---|---|---|---|
| 3,995,216 A | 11/1976 | Yun | |
| 4,326,165 A | 4/1982 | Szedon | |
| 4,460,866 A | 7/1984 | Feuerbaum et al. | |
| 4,599,558 A | 7/1986 | Castellano, Jr. et al. | |
| 4,629,898 A | 12/1986 | Orloff et al. | |
| 4,734,721 A | 3/1988 | Boyer | |
| 4,812,756 A * | 3/1989 | Curtis et al. | 324/750 |
| 5,008,617 A | 4/1991 | Czubatyj et al. | |
| 5,023,561 A | 6/1991 | Hillard | |
| 5,065,103 A | 11/1991 | Slinkman et al. | |
| 5,097,204 A | 3/1992 | Yoshizawa et al. | |
| 5,216,362 A | 6/1993 | Verkuil | |
| 5,220,277 A | 6/1993 | Reitinger | |
| 5,469,064 A * | 11/1995 | Kerschner et al. | 324/537 |
| 5,485,091 A | 1/1996 | Verkuil | |
| 5,498,974 A | 3/1996 | Verkuil et al. | |
| 5,500,607 A | 3/1996 | Verkuil | |
| 5,581,194 A | 12/1996 | Lowell | |
| 5,594,247 A | 1/1997 | Verkuil | |
| 5,644,223 A | 7/1997 | Verkuil | |
| 5,650,731 A | 7/1997 | Fung et al. | |
| 5,661,408 A | 8/1997 | Kamieniecki et al. | |
| 5,742,658 A | 4/1998 | Tiffin et al. | |
| 5,767,691 A | 6/1998 | Verkuil | |
| 5,767,693 A * | 6/1998 | Verkuil | 324/767 |
| 5,773,989 A | 6/1998 | Edelman et al. | |
| 5,834,941 A | 11/1998 | Verkuil | |
| 5,852,232 A | 12/1998 | Samsavar et al. | |
| 5,866,806 A | 2/1999 | Samsavar et al. | |
| 5,948,485 A | 9/1999 | Amano et al. | |
| 5,948,972 A | 9/1999 | Samsavar et al. | |
| 5,955,661 A | 9/1999 | Samsavar et al. | |
| 5,963,783 A | 10/1999 | Lowell et al. | |
| 5,977,558 A | 11/1999 | Lee | |
| 5,999,010 A | 12/1999 | Arora et al. | |
| 6,011,404 A | 1/2000 | Ma et al. | |
| 6,060,709 A | 5/2000 | Verkuil | |
| 6,072,320 A | 6/2000 | Verkuil | |
| 6,091,257 A | 7/2000 | Verkuil | |
| 6,097,196 A | 8/2000 | Verkuil | |
| 6,104,206 A * | 8/2000 | Verkuil | 324/765 |
| 6,121,783 A | 9/2000 | Horner | |
| 6,191,605 B1 | 2/2001 | Miller | |
| 6,201,999 B1 | 3/2001 | Jevtic | |
| 6,202,029 B1 * | 3/2001 | Verkuil et al. | 702/64 |
| 6,224,638 B1 | 5/2001 | Jevtic et al. | |
| 6,267,005 B1 | 7/2001 | Samsavar et al. | |
| 6,291,254 B1 | 9/2001 | Chou et al. | |
| 6,367,413 B1 | 4/2002 | Sill et al. | |
| 6,452,412 B1 | 9/2002 | Jarvis et al. | |
| 6,486,682 B1 | 11/2002 | Wang et al. | |
| 6,522,150 B2 * | 2/2003 | Fujita | 324/455 |
| 6,538,462 B1 | 3/2003 | Lagowski et al. | |
| 6,569,691 B1 | 5/2003 | Jastrzebski et al. | |
| 6,600,333 B1 | 7/2003 | Martin et al. | |
| 6,665,623 B1 | 12/2003 | Pasadyn et al. | |
| 6,680,621 B2 | 1/2004 | Savtchouk et al. | |
| 6,694,284 B1 | 2/2004 | Nikoonahad et al. | |
| 6,701,612 B2 * | 3/2004 | Khandros et al. | 29/842 |
| 6,734,696 B2 | 5/2004 | Horner et al. | |
| 6,759,255 B2 | 7/2004 | Xu et al. | |
| 6,771,092 B1 | 8/2004 | Fung et al. | |
| 6,791,310 B2 | 9/2004 | Smith | |
| 6,793,759 B2 * | 9/2004 | Chaudhury et al. | 156/272.6 |
| 6,803,241 B2 | 10/2004 | Eom et al. | |
| 6,891,610 B2 | 5/2005 | Nikoonahad et al. | |
| 7,012,438 B1 | 3/2006 | Miller et al. | |
| 7,064,565 B1 | 6/2006 | Xu et al. | |
| 7,075,318 B1 | 7/2006 | Zhang et al. | |
| 7,103,484 B1 | 9/2006 | Shi et al. | |
| 7,110,238 B1 * | 9/2006 | Xu et al. | 361/220 |
| 7,358,748 B1 | 4/2008 | Miller et al. | |
| 2002/0160600 A1 | 10/2002 | Eckert et al. | |
| 2002/0179864 A1 | 12/2002 | Fielden et al. | |
| 2002/0182760 A1 | 12/2002 | Wack et al. | |
| 2002/0188417 A1 | 12/2002 | Levy et al. | |
| 2003/0137662 A1 | 7/2003 | Janik et al. | |
| 2004/0183556 A1 | 9/2004 | Wada et al. | |
| 2005/0057755 A1 | 3/2005 | Johnson et al. | |
| 2005/0124151 A1 | 6/2005 | Cheng et al. | |
| 2005/0206402 A1 | 9/2005 | Shi et al. | |
| 2006/0022698 A1 * | 2/2006 | Eom et al. | 324/765 |
| 2007/0018674 A1 * | 1/2007 | Cho et al. | 324/765 |
| 2007/0109003 A1 | 5/2007 | Shi et al. | |

FOREIGN PATENT DOCUMENTS

| | | |
|---|---|---|
| WO | WO 98/57358 | 12/1998 |
| WO | WO01/29568 | 4/2001 |

OTHER PUBLICATIONS

U.S. Appl. No. 11/078,669, filed Mar. 10, 2005, Shi et al.

U.S. Appl. No. 11/021,555, filed Dec. 22, 2004, McWhirter et al.

Dieter K Schroder, Surface voltage and surface photovoltage: history, theory and applications, Institute of Physics Publishing, Mea. Sci. Technol. 12 (2001), pp. R16-R31.

International Search Report and Written Opinion for PCT/US06/32822 filed on Aug. 21, 2006.

Sze; "Physics of Semiconductor Devices," pp. 369; 2nd edition, Wiley-Interscience, 1981.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Miller, "A New Approach for Measuring Oxide Thickness," Semiconductor International, Jul. 1995, pp. 147-148.

Numerical Recipes in C. The Art of Scientific Computing, 2nd Ed.,© Cambridge University Press 1988, 1992, p. 683.

Weinberg, "Tunneling of Electrons from Si into Thermally Grown SiO2," Solid-State Electronics, 1977, vol. 20, pp. 11-18.

Verkuil, "Rapid Contactless Method for Measuring Fixed Oxide Charge ASsociated with Silicon Processing," IBM Technical Disclousre Bulletin, vol. 24, No. 6, 1981, pp. 3048-3053.

Contactless Photovoltage vs. Bias Method for Determining Flat-Band Voltage, IBM Technical Disclosure Bulletin, vol. 32, vol. 9A, 1990, pp. 14-17.

Contactless Electrical Equivalent Oxide Thickness Measurement, IBM Technical Disclosure Bulletin, vol. 29, No. 10, 1987, pp. 4622-4623.

Voltage—Wikipedia, the free encyclopedia, http://en.wikipedia.org/w/index.php?title=Voltage&printable=yes, Apr. 10, 2006, pp. 1-4.

U.S. Appl. No. 10/677,445 (Horner et al.) entitled Methods for Non-Contacting Differential Voltage Measurements filed Oct. 2, 2003.

U.S. Appl. No. 11/460,505 (Samsavar et al.) entitled Contactless Charge Measurement of Product Wafers and Control of Corona Generation and Deposition filed Jul. 27, 2006.

U.S. Appl. No. 11/460,517 (Samsavar et al.) entitled Contactless Charge Measurement of Product Wafers and Control of Corona Generation and Deposition filed Jul. 27, 2006.

* cited by examiner

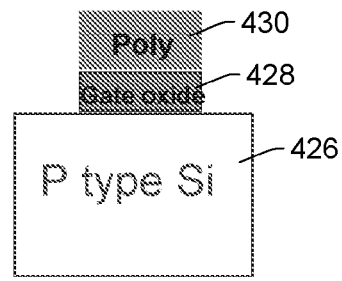
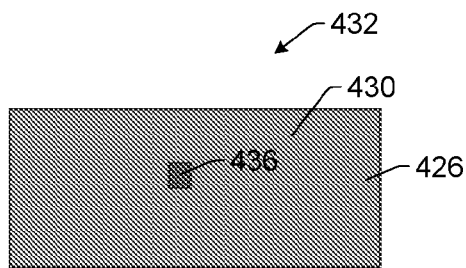
Fig. 34        Fig. 35
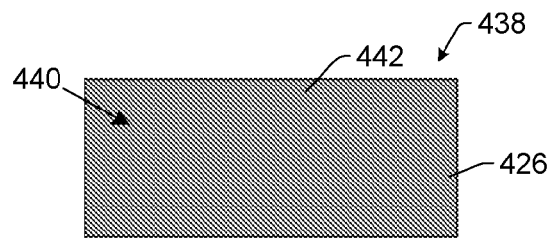
Fig. 36
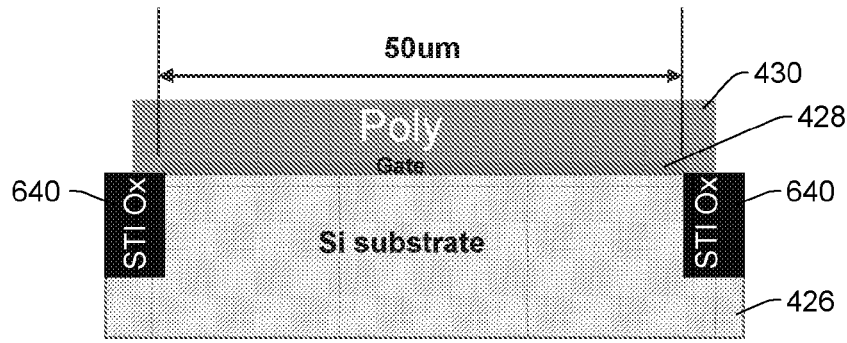
Fig. 36a
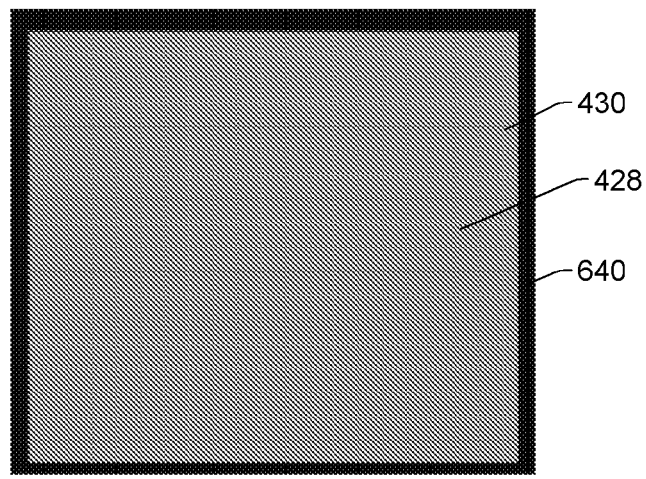
Fig. 36b

SYSTEMS AND METHODS FOR CONTROLLING DEPOSITION OF A CHARGE ON A WAFER FOR MEASUREMENT OF ONE OR MORE ELECTRICAL PROPERTIES OF THE WAFER

PRIORITY CLAIM

This application claims priority to U.S. Provisional Application No. 60/709,736 entitled "Test Pads, Methods, and Systems for Measuring Properties of a Wafer, and Systems and Methods for Controlling Deposition of a Charge on a Wafer for Measurement of One or More Electrical Properties of the Wafer," filed Aug. 19, 2005, which is incorporated by reference as if fully set forth herein.

BACKGROUND OF THE INVENTION

1. Field of the Invention

The present invention generally relates to test pads, methods, and systems for measuring properties of a wafer. Certain embodiments relate to methods for assessing plasma damage of a wafer. Other embodiments relate to methods and systems for controlling deposition of a charge on a wafer for measurement of one or more electrical properties of the wafer.

2. Description of the Related Art

The following description and examples are not admitted to be prior art by virtue of their inclusion in this section.

Fabricating semiconductor devices such as logic and memory devices typically includes processing a substrate such as a semiconductor wafer using a number of semiconductor fabrication processes to form various features and multiple levels of the semiconductor devices. For example, insulating (or dielectric) films may be formed on multiple levels of a substrate using deposition processes such as chemical vapor deposition ("CVD"), physical vapor deposition ("PVD"), and atomic layer deposition ("ALD"). In addition, insulating films may be formed on multiple levels of a substrate using a thermal growth process. For example, a layer of silicon dioxide may be thermally grown on a substrate by heating the substrate to a temperature of greater than about 700° C. in an oxidizing ambient such as $O_2$ or $H_2O$. Such insulating films electrically isolate conductive structures of a semiconductor device formed on the substrate.

Measuring and controlling properties of such insulating films is an important aspect of semiconductor device manufacturing. A number of techniques are presently available for such measurements. For example, electrical measurement techniques, which rely on physical contact between a conductive electrode and an upper surface of an insulating film, are able to determine relevant electrical properties of insulating films using capacitance vs. voltage ("C-V") and current vs. voltage ("I-V") measurements. Such measurements have a long history and established utility. However, the necessity of direct physical electrical contact with the insulating film is particularly undesirable in many manufacturing situations.

Non-contacting electrical test techniques have been developed to provide electrical capacitance, electrical thickness, and electrical conductivity information about insulating films. Non-contacting electrical measurements of dielectric properties have a unique advantage of providing electrically derived information without the requirement of physical contact between an electrode and an insulating film. These techniques typically use an ion generation source such as a corona source, and a non-contacting voltage measurement sensor such as a Kelvin Probe or a Monroe Probe to determine electrical properties of the films. Examples of such techniques are illustrated in U.S. Pat. Nos. 5,485,091 to Verkuil, 5,594,247 to Verkuil et al., 5,767,693 to Verkuil, 5,834,941 to Verkuil, 6,060,709 to Verkuil et al., 6,072,320 to Verkuil, 6,091,257 to Verkuil et al., 6,097,196 to Verkuil et al., 6,104,206 to Verkuil, 6,121,783 to Horner et al., 6,191,605 to Miller et al., and 6,202,029 to Verkuil et al., which are incorporated by reference as if fully set forth herein.

Although such techniques are non-contacting, these techniques are often performed on monitor wafers. The term "monitor wafer" is generally used to refer to a wafer that is processed prior to processing one or more product wafers, or a "lot" of product wafers. The term "product wafer" is generally used to refer to a wafer that is processed using a number of semiconductor fabrication processes to form multiple semiconductor devices thereon. In contrast, a monitor wafer is typically only processed in a single semiconductor fabrication process and then recycled or discarded. As such, semiconductor devices are not formed on monitor wafers. Various measurements of the monitor wafer may also be performed prior to processing the lot. The measurements of the monitor wafer may be used to assess the performance of the process. In this manner, the process may be evaluated and potentially altered prior to processing the lot. Therefore, such a method may increase the probability that the process will be within process limits when product wafers are processed.

As the value of semiconductor wafers increases, and the demand for better throughput and more efficient tool usage increases, methods that utilize monitor wafers are becoming increasing undesirable. For example, methods that include processing and measuring a monitor wafer require materials and labor to create and measure the monitor wafer thereby increasing manufacturing costs and reducing throughput. In addition, measurements performed on monitor wafers may not accurately reflect properties of product wafers for a number of reasons. For example, monitor wafers and product wafers may have different characteristics prior to a process that may affect the properties of the wafers after the process. Such characteristics may include, but are not limited to, topography, underlying layers formed on the wafers, and structures formed on the wafers. The characteristics of monitor wafers and product wafers are different because the monitor wafers and the product wafers may be processed differently prior to using the monitor wafers to evaluate a process. For example, the product wafers may be processed using a number of different semiconductor manufacturing processes while a monitor wafer may not be processed using these processes or may be processed using only a subset of these processes. Therefore, a process may not be accurately evaluated, monitored, and controlled using measurements performed on a monitor wafer.

The systems and methods described above may use a corona source in uncontrolled ambient conditions. Corona sources have been used in such uncontrolled ambient conditions for many years and in various processes. For example, corona technology has long been used in xerographic processes such as photocopying and laser printing. The level of corona control required by and used in such applications is only driven by the need to transfer toner particles. This transfer mechanism is relatively insensitive to the level of corona, the species being produced, and the production of byproduct species. In an additional example, electrostatic precipitators commonly use the corona process as part of a pollution control technology. These corona applications are typically relatively large scale in nature, and the industrial applications for which they are designed are also relatively insensitive to the level of corona, the species being produced, and the production of byproduct species. Examples of corona sources are illustrated in U.S. Pat. Nos. 3,495,269 to Mutschler et al., 3,496,352 to Jugle, and 4,734,721 to Boyer et al, which are incorporated by reference as if fully set forth herein.

As described above, non-contacting electrical test methodologies have been developed, which make use of corona sources as a means of depositing charge on the surface of a semiconductor wafer. Examples of corona sources for such methodologies are illustrated in U.S. Pat. Nos. 5,485,091 to Verkuil, 5,594,247 to Verkuil et al., and 5,644,223 to Verkuil, which are incorporated by reference as if fully set forth herein. This application may be commonly referred to as semiconductor metrology. This particular application of corona technology is sensitive to variations in corona deposition and contamination from corona deposition. Corona generation in ambient conditions, however, may produce a number of undesirable byproducts. Such byproducts may include, but are not limited to, ozone, ammonium nitride, and nitric acid. In addition, the electric fields and high voltages may attract particulates into the vicinity of the corona source. In a conventional corona deposition system, such byproducts and particulates may accumulate over time and may deposit onto a wafer and/or change the production of species being created. Therefore, such byproducts and particulates may reduce the accuracy of measurements performed on a semiconductor wafer using a corona source, the accuracy of alterations made to a process using such measurements, and the yield of semiconductor manufacturing processes monitored and altered using a corona source for measurements of electrical properties.

Accordingly, it may be desirable to develop test pads, methods, and systems for measuring properties of a wafer, particularly a patterned wafer, such as plasma damage and electrical properties with relatively high accuracy by reducing the effects of underlying structures on the electrical properties of the structure being measured and/or using controlled deposition of a charge on the wafer.

SUMMARY OF THE INVENTION

The following description of various embodiments is not to be construed in any way as limiting the subject matter of the appended claims.

One embodiment relates to a test pad formed on a wafer. The test pad includes a test structure configured such that one or more electrical properties of the test structure can be measured. The test pad also includes a conductive layer formed between the test structure and the wafer. The conductive layer prevents structures located under the test structure between the conductive layer and the wafer from affecting the one or more electrical properties of the test structure during measurement.

In one embodiment, the wafer includes a patterned wafer. In one such embodiment, the test structure and the conductive layer are formed in a scribe line of the patterned wafer. In another embodiment, the conductive layer has an area that is larger than an area of the test structure. In some embodiments, the test structure includes an intermetal dielectric (IMD) structure. In one such embodiment, the one or more electrical properties include an in-plane dielectric constant of the IMD structure. In another such embodiment, the one or more electrical properties include an out-of-plane dielectric constant of the IMD structure. In an additional such embodiment, the one or more electrical properties include leakage of the IMD structure. In yet another such embodiment, the one or more electrical properties include a surface voltage ($V_s$) map of the IMD structure.

In some embodiments, the conductive layer is electrically connected to the wafer by one or more other conductive structures formed between the conductive layer and the wafer.

In an additional embodiment, the test structure includes insulating structures and conductive structures formed between the insulating structures. In another embodiment, the test structure includes insulating structures and trenches formed between the insulating structures. In one such embodiment, the one or more electrical properties include an in-plane electrical property of the insulating structures. In another such embodiment, the one or more electrical properties include an out-of-plane electrical property of the insulating structures.

In some embodiments, more than one of the test pads are formed on the wafer. The test structures of the more than one test pad include insulating structures and trenches formed between the insulating structures. The test structures of at least some of the more than one test pad have different pitches and different trench widths. In one such embodiment, the one or more electrical properties include a line-to-line dielectric constant of the insulating structures. In an additional embodiment, more than one of the test pads are formed on the wafer, the test structures of the more than one test pad include insulating structures and trenches formed between the insulating structures, and the test structures of at least some of the more than one test pad have substantially the same trench width and different insulating structure line widths.

In one embodiment, the test structure includes vias formed in an insulating structure. In one such embodiment, the one or more electrical properties include an in-plane electrical property of the insulating structure. In another such embodiment, the one or more electrical properties include an out-of-plane electrical property of the insulating structure. In an additional such embodiment, the vias are arranged in a two-dimensional array in the test structure. In a further embodiment, the test structure includes vias formed in an insulating structure and conductive structures formed in the vias.

In some embodiments, the test structure includes insulating structures configured as a serpentine structure. The serpentine structure electrically isolates two different sets of conductive structures. Each of the different sets of conductive structures is coupled to a test area. In another embodiment, the test pad includes an additional test structure configured such that one or more electrical properties of the additional test structure can be measured. The test structure and the additional test structure include insulating structures configured as serpentine structures. The serpentine structures electrically isolate two different sets of conductive structures. At least one characteristic of the serpentine structures or the two different sets of conductive structures of the test structure and the additional test structure is different.

In an additional embodiment, the test structure includes a gate structure. In another embodiment, the test structure is formed by a front end of line (FEOL) process. In a further embodiment, the one or more electrical properties can be measured by measuring an out-of-plane voltage of the test structure. In yet another embodiment, the test structure has one or more characteristics that are substantially the same as one or more characteristics of a device structure formed on the wafer. In additional embodiments, the structures located under the test structure include additional test structures. In this manner, the test pad may include a "stack" of test structures.

In one embodiment, the one or more electrical properties are measured using a non-contact measurement technique. In another embodiment, the one or more electrical properties are measured using a contact measurement technique. Each of the embodiments of the test pad described above may be further configured as described herein.

An additional embodiment relates to a different test pad formed on a wafer. This test pad includes a gate structure configured such that one or more electrical properties of the gate structure can be measured. The test pad also includes an isolated insulator pad formed between the gate structure and the wafer. The isolated insulator pad prevents structures located under the gate structure between the isolated insulator pad and the wafer from affecting the one or more electrical properties of the gate structure during measurement.

In one embodiment, the gate structure includes a source, a gate electrode, and a drain. In another embodiment, the gate structure includes a source, a gate electrode, a drain, and a gate dielectric. In some embodiments, the one or more electrical properties include an out-of-plane electrical property of the gate structure. In another embodiment, the one or more electrical properties include an in-plane electrical property of the gate structure. In an additional embodiment, the one or more electrical properties include a threshold voltage ($V_t$) of the gate structure.

In some embodiments, neighboring structures are formed on a layer of the wafer on which the gate structure is formed. In one such embodiment, the isolated insulator pad also prevents the neighboring structures from affecting the one or more electrical properties of the gate structure during measurement. In another embodiment, the isolated insulator pad has an area that is larger than an area of the gate structure. In a further embodiment, the gate structure has one or more characteristics that are substantially the same as one or more characteristics of a device structure formed on the wafer.

In one embodiment, the wafer includes a patterned wafer, and the gate structure and the isolated insulator pad are formed in a scribe line of the patterned wafer. In another embodiment, more than one of the test pads are formed on the wafer in an arrangement such that across wafer variations in the one or more electrical properties of the gate structure can be measured.

In an additional embodiment, the one or more electrical properties can be measured using a non-contact measurement technique. In another embodiment, the one or more electrical properties can be measured using a non-contact measurement technique in which a charge is deposited on only a portion of the gate structure. In a further embodiment, the one or more electrical properties can be measured using a contact measurement technique. Each of the embodiments of the test pad described above may be further configured as described herein.

An additional embodiment relates to a different test pad formed on a wafer. The test pad includes a gate structure formed on the wafer. One or more electrical properties of the gate structure can be measured for FEOL gate in-line monitoring.

In one embodiment, the gate structure includes a polysilicon layer formed on the wafer. In another embodiment, the gate structure includes an isolated polysilicon structure. In an additional embodiment, the gate structure includes a polysilicon layer formed on a gate dielectric layer. In a further embodiment, the test pad has a test area that is about 60 µm×about 60 µm.

In some embodiments, the one or more electrical properties can be measured by measuring capacitance-voltage characteristics of the gate structure. As described above, in one embodiment, the gate structure includes a polysilicon layer formed on a gate dielectric layer. In one such embodiment, the one or more electrical properties include an equivalent oxide thickness (EOT) of the gate dielectric layer. In another such embodiment, the one or more electrical properties include a leakage characteristic of the gate dielectric layer. In a further embodiment, the one or more electrical properties include one or more in-plane electrical properties of the gate structure.

In another embodiment, the test pad is formed in a scribe line of the wafer. In an additional embodiment, the gate in-line monitoring includes gate quality monitoring. In some embodiments, the gate structures has one or more characteristics that are substantially the same as one or more characteristics of a device structure formed on the wafer. In a further embodiment, more than one of the test pads are formed on the wafer in an arrangement such that across wafer variations in the one or more electrical properties of the gate structure can be measured.

In one embodiment, the one or more electrical properties can be measured using a non-contact measurement technique. In another embodiment, the one or more electrical properties can be measured using a contact measurement technique. In an additional embodiment, the one or more electrical properties include $V_s$. In a further embodiment, the one or more electrical properties include interface trap density (Dit). In yet another embodiment, the one or more electrical properties include $V_t$.

In one embodiment, the gate in-line monitoring includes gate dielectric process control. In another embodiment, the gate in-line monitoring includes polysilicon plasma etch damage monitoring. In an additional embodiment, the gate in-line monitoring includes pre-spacer ion implantation damage monitoring. In a further embodiment, the gate in-line monitoring includes spacer deposition and etch process monitoring. In yet another embodiment, the gate in-line monitoring includes source and drain ion implantation damage monitoring. In another embodiment, the gate in-line monitoring includes salicide sinter strip anneal monitoring. In an additional embodiment, the gate in-line monitoring includes contact dielectric deposition and chemical-mechanical polishing (CMP) charging monitoring. Each of the embodiments of the test pad described above may be further configured as described herein.

An additional embodiment relates to a test pad formed on a wafer that includes an array of shallow trench isolation (STI) structures formed on the wafer. One or more electrical properties of the STI structures can be measured for monitoring quality of the STI structures.

In one embodiment, the array is formed in a scribe line on the wafer. In another embodiment, the test pad has an area of about 75 µm by about 75 µm. In an additional embodiment, one or more characteristics of the STI structures are substantially the same as one or more characteristics of STI structures of device structures formed on the wafer. In some embodiments, the one or more electrical properties include effective capacitance. In a further embodiment, the one or more electrical properties include a $V_s$ map. Each of the embodiments of the test pad described above may be further configured as described herein.

A further embodiment relates to a different test pad formed on a wafer. The test pad includes a box oxide layer formed on the wafer. The test pad also includes one or more silicon (Si) structures formed on the box oxide layer. In addition, the test pad includes one or more gate dielectric structures formed on the one or more Si structures. One or more electrical properties of the box oxide layer and the one or more gate dielectric structures can be measured.

In one embodiment, the one or more electrical properties include capacitance of the box oxide layer and capacitance of the one or more gate dielectric structures. In another embodiment, the test pad is formed in a scribe line of the wafer. In some embodiments, the one or more electrical properties can be measured using a non-contact measurement technique. In a further embodiment, the one or more electrical properties can be measured using a contact measurement technique.

In an additional embodiment, the one or more gate dielectric structures and the one or more Si structures have substantially the same area. In another embodiment, each of the one or more gate dielectric structures has substantially the same area as the one or more Si structures on which each of the one or more gate dielectric structures is formed. In one embodiment, the one or more Si structures have different areas. In one such embodiment, each of the one or more gate dielectric structures has substantially the same area as the one or more Si structures on which each of the one or more gate dielectric structures is formed.

In a further embodiment, at least one of the one or more gate dielectric structures has an area that is different than an area of the one or more Si structures on which the at least one of the one or more gate dielectric structures is formed. In another embodiment, at least one of the one or more gate dielectric structures has an area that is less than an area of the one or more Si structures on which the at least one of the one or more gate dielectric structures is formed. In one such embodiment, the at least one of the one or more gate dielectric structures is located entirely within the area of the one or more Si structures on which the at least one of the one or more gate dielectric structures is formed. Each of the embodiments of the test pad described above may be further configured as described herein.

A further embodiment relates to a method for determining one or more electrical properties of a test pad formed on a wafer. The method includes depositing a first corona charge in a first corona deposition spot on a gate dielectric structure of the test pad. The gate dielectric structure is formed on a Si structure. The Si structure is formed on a box oxide layer, which is formed on the wafer. The method also includes measuring a first voltage of the test pad after depositing the first corona charge. In addition, the method includes depositing a second corona charge in a second corona deposition spot on the gate dielectric structure. The second corona deposition spot has an area that is different than an area of the first corona deposition spot. The method further includes measuring a second voltage of the test pad after depositing the second corona charge. Furthermore, the method includes determining one or more electrical properties of one or more structures of the test pad using the first voltage and the second voltage.

In one embodiment, the area of the second corona deposition spot is larger than the area of the first corona deposition spot. In another embodiment, the first and second voltages are measured using a non-contact measurement technique. In an additional embodiment, the first and second voltages are measured using a contact measurement technique.

In one embodiment, depositing the first corona charge is performed using a first corona gun, and depositing the second corona charge is performed using a second corona gun. In a different embodiment, depositing the first and second corona charges are performed using a single corona gun and different voltage settings of one or more electrodes of the single corona gun.

In one embodiment, the one or more electrical properties include capacitance of the gate dielectric structure and capacitance of the box oxide layer. In another embodiment, the gate dielectric structure and the Si structure have substantially the same area. Each of the step(s) of the method described above may be performed as described further herein. Each of the embodiments of the method described above may include any other step(s) of any other method(s) described herein. In addition, the test pad for which the method is performed may be further configured as described herein. Furthermore, each of the embodiments of the method described above may be performed by any of the system embodiments described herein.

An additional embodiment relates to a method for determining one or more electrical properties of one or more structures formed on a wafer. The method includes depositing a first corona charge on a first of two test pads formed on the wafer in a first corona deposition spot. Each of the two test pads includes a gate dielectric structure formed on a Si structure. The gate dielectric structures and the Si structures of the two test pads have substantially the same area. The Si structures of the two test pads are formed on a box oxide layer, which is formed on the wafer. The method also includes measuring a first voltage of the first of the two test pads after depositing the first corona charge. In addition, the method includes depositing a second corona charge on a second of the two test pads in a second corona deposition spot. The second corona deposition spot has an area that is different than an area of the first corona deposition spot. The method further includes measuring a second voltage of the second of the two test pads after depositing the second corona charge. Furthermore, the method includes determining one or more electrical properties of one or more structures of the two test pads using the first voltage and the second voltage.

In one embodiment, the area of the second corona deposition spot is larger than the area of the first corona deposition spot. In another embodiment, the first and second voltages are measured using a non-contact measurement technique. In an additional embodiment, the first and second voltages are measured using a contact measurement technique.

In some embodiments, depositing the first corona charge is performed using a first corona gun, and depositing the second corona charge is performed using a second corona charge. In a different embodiment, depositing the first and second corona charges are performed using a single corona gun and different voltage settings of one or more electrodes of the single corona gun. In another embodiment, the one or more electrical properties include capacitance of the gate dielectric structures and capacitance of the box oxide layer.

Each of the step(s) of the method described above may be performed as described further herein. Each of the embodiments of the method described above may include any other step(s) of any other method(s) described herein. In addition, the two test pads for which the method is performed may be further configured as described herein. Furthermore, each of the embodiments of the method described above may be performed by any of the system embodiments described herein.

An additional embodiment relates to a method for determining one or more electrical properties of two test structures of a test pad formed on a wafer. The method includes depositing a first corona charge on a first of the two test structures. Each of the two test structures includes a gate dielectric structure formed on a Si structure. The gate dielectric structures of the two test structures have different areas. The Si structures of the two test structures have different areas. The Si structures of the two test structures are formed on a box oxide layer, which is formed on the wafer.

The method also includes measuring a first voltage of the first of the two test structures after depositing the first corona charge. In addition, the method includes depositing a second corona charge on a second of the two test structures. The method further includes measuring a second voltage of the second of the two test structures after depositing the second corona charge. Furthermore, the method includes determining one or more electrical properties of the two test structures using the first voltage and the second voltage.

In one embodiment, the first and second voltages are measured using a non-contact measurement technique. In another embodiment, the first and second voltages are measured using a contact measurement technique. In an additional embodiment, depositing the first and second corona charges are performed using a single corona gun. In some embodiments, the one or more electrical properties include capacitance of the gate dielectric structures and capacitance of the box oxide layer. In a further embodiment, the gate dielectric structure and the Si structure of the first of the two test structures have substantially the same area, and the gate dielectric structure and the Si structure of the second of the two test structures have substantially the same area. In yet another embodiment, the test pad is formed in a scribe line of the wafer.

Each of the step(s) of the method described above may be performed as described further herein. Each of the embodiments of the method described above may include any other step(s) of any other method(s) described herein. In addition, the test pad for which the method is performed may be further configured as described herein. Furthermore, each of the embodiments of the method described above may be performed by any of the system embodiments described herein.

A further embodiment relates to a method for determining one or more electrical properties of a test pad formed on a wafer. The method includes depositing a corona charge on the test pad. The test pad includes a gate dielectric structure formed on a Si structure. The gate dielectric structure has an area that is less than an area of the Si structure. The Si structure is formed on a box oxide layer, which is formed on the wafer. The method also includes measuring a voltage of the test pad after depositing the corona charge. In addition, the method includes determining one or more electrical properties of one or more structures of the test pad using the voltage.

In one embodiment, the voltage is measured using a non-contact measurement technique. In another embodiment, the voltage is measured using a contact measurement technique. In some embodiments, the gate dielectric structure is located entirely within the area of the Si structure. In a further embodiment, the one or more electrical properties include capacitance of the gate dielectric structure and capacitance of the box oxide layer. In yet another embodiment, the test pad is formed in a scribe line of the wafer.

Each of the step(s) of the method described above may be performed as described further herein. Each of the embodiments of the method described above may include any other step(s) of any other method(s) described herein. In addition, the test pad for which the method is performed may be further configured as described herein. Furthermore, each of the embodiments of the method described above may be performed by any of the system embodiments described herein.

An additional embodiment relates to a different test pad formed on a wafer. The test pad includes an oxide layer formed on the wafer. The test pad also includes a Si structure formed on the oxide layer. One or more electrical properties of the oxide layer can be measured to monitor quality of the oxide layer.

In one embodiment, the one or more electrical properties of the oxide layer can be measured to monitor quality of an interface between the oxide layer and the Si structure. In another embodiment, the test pad is formed in an active area (AA) of the wafer. In some embodiments, the test pad has an area of about 50 μm by about 50 μm. In an additional embodiment, the one or more electrical properties of the oxide layer can be measured by measuring a $V_s$ map across an upper surface of the test pad. In some embodiments, the one or more electrical properties can be measured using a non-contact measurement technique. In a further embodiment, the one or more electrical properties can be measured using a contact measurement technique. Each of the embodiments of the test pad described above may be further configured as described herein.

Another embodiment relates to a method for assessing plasma damage of a wafer. The method includes measuring one or more electrical properties of a test structure formed on the wafer. The method also includes determining an index characterizing the plasma damage of the test structure using the one or more electrical properties. The plasma damage is caused by a process performed on the wafer.

In some embodiments, one or more characteristics of the test structure are substantially the same as one or more characteristics of device structures formed on the wafer. In one embodiment, the wafer includes a patterned wafer. In such an embodiment, the test structure may be formed in a scribe line on the patterned wafer. In another such embodiment, the test structure may include different structures formed in a scribe line on the wafer. The different structures have substantially the same characteristics as different device structures formed on the wafer such that the index also characterizes the plasma damage of the different device structures.

In another embodiment, the test structure includes trenches formed in an insulating structure, and the one or more electrical properties include an in-plane electrical property of the insulating structure. In an additional embodiment, the test structure includes vias formed in an insulating structure, and the one or more electrical properties include an out-of-plane electrical property of the insulating structure.

In some embodiments, the method includes measuring one or more additional properties of the test structure using one or more optical techniques. In one such embodiment, the method also includes determining an in-plane electrical property of the test structure using the one or more electrical properties and the one or more additional properties. In another such embodiment, determining the index includes determining the index using the one or more electrical properties and the one or more additional properties.

In one embodiment, the index is a weighted index. In another embodiment, the plasma damage includes surface charge non-uniformity, bulk film damage, and interface damage. In some embodiments, the test structure includes an IMD structure. In a different embodiment, the test structure includes a gate structure. In a further embodiment, the test structure includes an STI structure, and the plasma damage includes leakage at a corner of a lining oxide of the STI structure. In some embodiments, the test structure includes a portion of the wafer surrounded by one or more trenches, a pad oxide layer formed on an upper surface of the portion of the wafer, and a lining oxide formed on side surfaces of the portion of the wafer, side surfaces of the pad oxide layer, and an upper surface of the wafer in the one or more trenches. In another embodiment, the test structure includes one or more P wells, one or more N wells, or a combination thereof In one such embodiment, the plasma damage includes plasma charging that takes place during one or more ion implantation processes used to form the one or more P wells, the one or more N wells, or the combination thereof In a further embodiment, the test structure includes one or more layers of wiring formed on the wafer above a gate structure, and the plasma damage includes damage to the gate structure caused by one or more processes used to form the one or more layers of wiring.

In one embodiment, the measuring step is performed using a non-contact measurement technique. In a different embodiment, the measuring step is performed using a contact measurement technique.

In another embodiment, the method includes monitoring one or more parameters of the process using the index. In additional embodiments, the method includes altering one or more parameters of a process tool based on the index. The process tool performed the process on the wafer. Each of the step(s) of the method described above may be performed as described further herein. Each of the embodiments of the method described above may include any other step(s) of any other method(s) described herein. In addition, the test pad on which the method is performed may be further configured as described herein. Furthermore, each of the embodiments of the method described above may be performed by any of the system embodiments described herein.

Yet another embodiment relates to a different method for assessing plasma damage of a wafer. This method includes measuring one or more electrical properties of a device structure formed on the wafer. The method also includes determining an index characterizing the plasma damage of the device structure using the one or more electrical properties. The plasma damage is caused by a process performed on the wafer.

In one embodiment, measuring the one or more electrical properties includes measuring a $V_s$ at more than one location within a die formed on the wafer. In one such embodiment, the more than one location are within different types of areas of the die. In another embodiment, the plasma damage includes a surface charge profile within a die formed on the wafer. In some embodiments, measuring the one or more electrical properties includes measuring a $V_s$ at substantially the same within die location for more than one die formed on the wafer. In one such embodiment, the method includes comparing the $V_s$'s to determine $V_s$ uniformity across the wafer. In another embodiment, the plasma damage includes surface charge uniformity across the wafer.

Each of the step(s) of the method described above may be performed as described further herein. Each of the embodiments of the method described above may include any other step(s) of any other method(s) described herein. In addition, the device structure on which the method is performed may be further configured as described herein. Furthermore, each of the embodiments of the method described above may be performed by any of the system embodiments described herein.

A further embodiment relates to a test pad formed on a wafer. The test pad includes one or more layers of wiring formed on the wafer above a gate structure. The test pad also includes one or more test structures electrically coupled to the gate structure. One or more electrical properties of the gate structure can be measured by performing measurements on the one or more test structures. Damage to the gate structure caused by one or more processes used to form the one or more layers of wiring can be determined using the one or more electrical properties.

In one embodiment, the one or more test structures include at least one antenna structure electrically connected to the gate structure by a via. In one such embodiment, the damage includes plasma damage. In another such embodiment, the at least one antenna structure includes a serpentine structure. In an additional embodiment, the one or more test structures include a conductive structure formed on a top layer of the one or more layers of wiring. The conductive structure is electrically connected to the gate structure. In a further embodiment, the one or more test structures include a dielectric structure formed on a top layer of the one or more layers of wiring. In some embodiments, the one or more electrical properties include EOT, leakage, Dit, total charge deposition, or flatband voltage ($V_{fb}$). Each of the embodiments of the test pad described above may be further configured as described herein.

An additional embodiment relates to a test structure formed on a wafer. The test structure includes a portion of the wafer surrounded by one or more trenches. The test structure also includes a pad oxide layer formed on an upper surface of the portion of the wafer. In addition, the test structure includes a lining oxide formed on side surfaces of the portion of the wafer, side surfaces of the pad oxide layer, and an upper surface of the wafer in the one or more trenches. One or more electrical properties of the test structure can be measured and used to determine an index characterizing plasma damage of the test structure caused by a process performed on the wafer.

In one embodiment, the one or more trenches include one or more STI structures. In another embodiment, the one or more electrical properties include leakage of the lining oxide proximate an upper corner of the portion of the wafer. In an additional embodiment, the test structure is configured as an AA bulk pattern having an area of about 50 μm by about 50 μm. In some embodiments, the test structure is configured as an AA bulk pattern, and the one or more electrical properties of the test structure can be measured by scanning one or more lines along an edge of the bulk pattern with a probe.

In another embodiment, the test structure is included in an AA island pattern formed on the wafer. In one such embodiment, each island in the AA island pattern includes the test structure described above. In another such embodiment, the AA island pattern has overall dimensions of about 50 μm by about 50 μm. In an additional such embodiment, each island in the AA island pattern has a width of about 0.05 μm to about 0.2 μm. In a further such embodiment, the one or more electrical properties of the test structure can be measured by performing one or more measurements on one or more islands in the AA island pattern using a probe. In yet a further such embodiment, the one or more electrical properties of the test structure can be measured by performing one or more measurements on areas between islands in the AA island pattern using a probe.

In one embodiment, the test structure includes a silicon nitride layer formed on the pad oxide layer. In another embodiment, the test structure includes a dielectric formed in the one or more trenches. In one such embodiment, an upper surface of the dielectric is not in the same plane as an upper surface of the pad oxide layer. In some embodiments, the plasma damage includes damage of the pad oxide layer due to removal of a silicon nitride layer from the pad oxide layer.

In one embodiment, the test structure includes a dielectric formed in the one or more trenches. In one such embodiment, an upper surface of the dielectric is substantially planar with an upper surface of the pad oxide layer. In some such embodiments, the plasma damage includes damage of the pad oxide layer due to removal of a silicon nitride layer from the pad oxide layer. In additional such embodiments, the plasma damage includes damage of the pad oxide layer and the dielectric due to CMP of the dielectric. Each of the embodiments of the test structure described above may be further configured as described herein.

Another embodiment relates to a test structure formed on a wafer. This test structure includes an epitaxial layer formed on the wafer. The test structure also includes one or more P wells, one or more N wells, or a combination thereof formed through the epitaxial layer and into the wafer. One or more electrical properties of the test structure can be measured and used to determine an index characterizing plasma damage of the test structure caused by a process performed on the wafer.

In one embodiment, the plasma damage includes plasma charging due to one or more ion implantation processes used to form the one or more P wells, the one or more N wells, or the combination thereof. In another embodiment, the test structure includes a dielectric layer formed on an upper surface of the test structure. In an additional embodiment, the test structure includes a dielectric layer formed on upper surfaces of the one or more P wells, the one or more N wells, or the combination thereof. In one such embodiment, the dielectric layer is not formed on an upper surface of the epitaxial layer.

In some embodiments, the test structure is configured as an AA bulk pattern. In another embodiment, the test structure is configured as an AA bulk pattern having an area of about 50 µm by about 50 µm. In a further embodiment, the test structure is configured as an AA bulk pattern, and the one or more electrical properties include a $V_a$ map of the AA bulk pattern. Each of the embodiments of the test structure described above may be further configured as described herein.

Yet another embodiment relates to a test structure formed on a wafer. This test structure includes a gate structure formed on the wafer. One or more electrical properties of the gate structure can be measured and used to determine an index characterizing plasma damage of the gate structure caused by a process performed on the wafer.

In one embodiment, the gate structure includes insulating structures formed in the wafer and a dielectric layer formed on upper surfaces of the wafer and the insulating structures. In one such embodiment, the plasma damage includes plasma damage of the dielectric structure. In another embodiment, the gate structure is configured as an AA bulk pattern on the wafer, and the one or more electrical properties of the gate structure are measured at approximately the center of the AA bulk pattern.

In an additional embodiment, the gate structure includes a gate dielectric structure formed on the wafer and a gate electrode structure formed on the gate dielectric structure. In one such embodiment, the plasma damage includes plasma damage of the gate electrode structure. In a further embodiment, the test structure is included in an array of test structures arranged in an AA island pattern on the wafer. In yet another embodiment, the gate structure has one or more characteristics that are substantially the same as one or more characteristics of a device structure formed on the wafer.

In one embodiment, the gate structure includes a gate dielectric structure formed on the wafer, a gate electrode structure formed on the gate dielectric structure, and STI structures formed in the wafer and partially underlying the gate electrode structure. In one such embodiment, the one or more electrical properties include EOT of the gate dielectric structure. In another such embodiment, the one or more electrical properties include leakage index ($J_g$) of the gate dielectric structure. In an additional such embodiment, the process includes a polysilicon etch process. In a further such embodiment, an area of the test structure defined by an area of the gate dielectric structure is used as a test pad for measurement of the one or more electrical properties. In one such embodiment, the test pad has an area of about 50 µm by about 50 µm.

In another embodiment, the gate structure includes patterned gate dielectric structures formed on the wafer, a gate electrode structure formed across all of the patterned gate dielectric structures, and STI structures formed within the wafer in areas of the wafer above which the patterned gate dielectric structures are not formed. In one such embodiment, the plasma damage includes integrity of the gate dielectric structures. In another such embodiment, the process includes a polysilicon etch process. In some such embodiments, an area of the test structure defined by an area of the gate electrode structure is used as a test pad for measurement of the one or more electrical properties. In one such embodiment, the test pad has an area of about 50 µm by about 50 µm. In another such embodiment, a width of each of the patterned gate dielectric structures is about 0.05 µm to about 0.2 µm.

In another embodiment, the gate structure includes a gate dielectric structure formed on the wafer, a polysilicon finger pattern formed on the gate dielectric structure, and an STI structure formed within the wafer in an area of the wafer surrounding the gate dielectric structure. In one such embodiment, the one or more electrical properties of the gate structure can be measured on a polysilicon test area of the polysilicon finger pattern. In another such embodiment, the polysilicon finger pattern is configured as a serpentine structure. In an additional such embodiment, the polysilicon finger pattern is configured as a series of lines, and each of the lines is coupled to a polysilicon test area of the polysilicon finger pattern by a line coupled to an end of each of the series of lines. In a further such embodiment, the plasma damage includes plasma damage of the gate dielectric structure caused by a polysilicon etch process. In yet another such embodiment, the one or more electrical properties of the gate structure include leakage of the gate dielectric structure. In still another such embodiment, the one or more electrical properties of the gate structure includes $J_g$ of the gate dielectric structure. In an additional such embodiment, the one or more electrical properties can be measured by depositing a charge on a polysilicon test area of the polysilicon finger pattern, the one or more electric properties include leakage current, and the plasma damage includes edge damage of the gate electrode structure due to a polysilicon etch process.

In a further embodiment, the gate structure includes a gate dielectric structure formed on the wafer. In one such embodiment, the plasma damage includes plasma damage of the gate dielectric structure due to an ion implantation process. In another such embodiment, the plasma damage includes plasma damage of the gate dielectric structure due to one or more etch processes used to form one or more spacers on the gate structure. Each of the embodiments of the test structure described above may be further configured as described herein.

An additional embodiment relates to a system configured to control deposition of a charge on a wafer for measurement of one or more electrical properties of the wafer. The system includes a corona source that is configured to deposit the charge on the wafer. The system also includes a sensor that is configured to measure one or more conditions within the corona source. In addition, the system includes a control subsystem that is configured to alter one or more parameters of the corona source based on the one or more conditions.

In some embodiments, the one or more conditions include one or more properties of one or more chemical species in the corona source. In one such embodiment, the one or more parameters that are altered by the control subsystem include one or more parameters of one or more gas flow devices coupled to the corona source. In one embodiment, the one or more gas flow devices include one or more mixing chambers coupled to an inlet of the corona source. The one or more mixing chambers are configured to mix the one or more chemical species prior to introduction of the one or more chemical species to the corona source.

In one embodiment, the sensor is configured to measure the one or more conditions in the corona source using an optical technique. In another embodiment, the system includes an optical subsystem that is configured to control a reaction in the corona source.

In one embodiment, the corona source includes one or more shielding components disposed within the corona source. The one or more shielding components are configured to prevent interaction between a plasma generated in the corona source and components of the corona source. In some embodiments, the system may include a coating formed on surfaces of one or more components of the corona source. The surfaces are internal to the corona source, and the coating is selected to alter the one or more conditions within the corona source.

In another embodiment, the one or more conditions in the corona source that are measured include one or more properties of a magnetic field in the corona source. In one such embodiment, the one or more parameters of the corona source that are altered may include one or more parameters of a magnetic device coupled to the corona source. In an additional embodiment, the system includes an additional sensor that is configured to measure a position of the corona source with respect to the wafer.

In one embodiment, the system includes a probe that is configured to measure the one or more electrical properties after the charge is deposited on the wafer. In such an embodiment, the control subsystem may be configured to select a geometry of the probe based on one or more characteristics of test structures formed on the wafer. In another embodiment, the system includes multiple probes that are configured to measure the one or more electrical properties of multiple test structures on the wafer substantially simultaneously after the charge is deposited on the wafer.

In some embodiments, the control subsystem is configured to control one or more parameters of a measurement chamber in which the corona source is disposed. In another embodiment, the system includes a sample preparation subsystem that is configured to alter one or more characteristics of the wafer before the charge is deposited on the wafer. In a further embodiment, the system includes a sample preparation subsystem that is configured to alter one or more characteristics of the wafer before the charge is deposited on the wafer such that different locations on the wafer have different values of the one or more characteristics.

In one embodiment, the system includes an additional measurement subsystem that is configured to measure one or more different properties of the wafer. In another embodiment, the one or more electrical properties include a surface photovoltage. In such an embodiment, the system includes an illumination subsystem that is configured to direct light to the wafer during voltage measurements. In some embodiments, the wafer includes a patterned wafer. Each of the embodiments of the system described above may be further configured as described herein.

Another embodiment relates to a method for controlling deposition of a charge on a wafer for measurement of one or more electrical properties of the wafer. This method includes measuring one or more conditions within a corona source. The corona source is configured to deposit the charge on the wafer. The method also includes altering one or more parameters of the corona source based on the one or more conditions. This method may include any other step(s) described herein.

An additional embodiment relates to another system that is configured to control deposition of a charge on a wafer for measurement of one or more electrical properties of the wafer. This system includes a corona source configured to deposit the charge on the wafer. This system also includes a mixture of gases disposed within a discharge chamber of the corona source during the deposition of the charge. The mixture of gases alters one or more parameters of the charge deposited on the wafer.

In one embodiment, the mixture includes carbon dioxide and krypton. In another embodiment, about 65 volume % to about 85 volume % of the mixture includes carbon dioxide, and about 15 volume % to about 35 volume % of the mixture includes krypton. In a further embodiment, about 75 volume % of the mixture includes carbon dioxide, and about 25 volume % of the mixture includes krypton. Each of the embodiments of the system described above may be further configured as described herein.

A further embodiment relates to a method for controlling deposition of a charge on a wafer for measurement of one or more electrical properties of the wafer. This method includes producing a mixture of gases in a discharge chamber of a corona source. The method also includes depositing the charge on the wafer using the corona source while the mixture of gases is in the discharge chamber. The mixture of gases alters one or more parameters of the charge deposited on the wafer.

In one embodiment, the mixture includes carbon dioxide and krypton. In another embodiment, about 65 volume % to about 85 volume % of the mixture includes carbon dioxide, and about 15 volume % to about 35 volume % of the mixture includes krypton. In a further embodiment, about 75 volume % of the mixture includes carbon dioxide, and about 25 volume % of the mixture includes krypton. Each of the embodiments of the method described above may include any other step(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 34 is a schematic diagram illustrating a cross-sectional view of another embodiment of a test structure that can be used to assess plasma damage of a wafer;

FIGS. 35-36 are schematic diagrams illustrating a top view of additional embodiments of a test structure that can be used to assess plasma damage of a wafer;

FIG. 36a is a schematic diagram illustrating a cross-sectional view of another embodiment of a test structure that can be used to assess plasma damage of a wafer;

FIG. 36b is a top view of the test structure of FIG. 36a;

Figure 1:
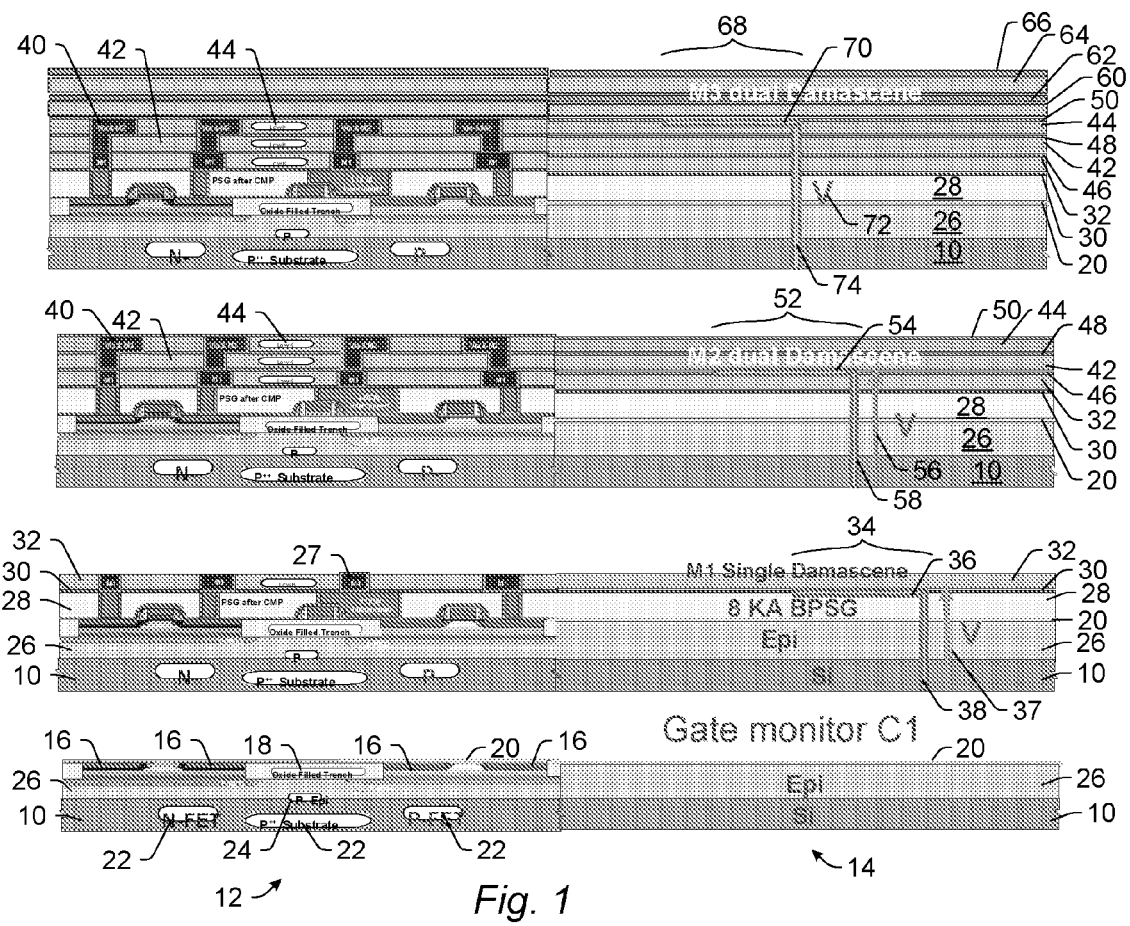
FIG. 1 is a schematic diagram illustrating a cross-sectional view of one example of a wafer after different processes have been performed on the wafer and different embodiments of a test pad that can be formed on the wafer.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

One or more layers may be formed upon a wafer. For example, such layers may include, but are not limited to, a resist, a dielectric material, and a conductive material. Many different types of such layers are known in the art, and the term wafer as used herein is intended to encompass a wafer on which all types of such layers may be formed. One or more layers formed on a wafer may be patterned. For example, a wafer may include a plurality of dies, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit, a thin-film head die, a micro-electro-mechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates one example of a wafer after different processes have been performed on the wafer and different embodiments of a test pad that can be formed on the wafer. Wafer 10, in this example, is formed of a silicon (Si) substrate. Wafer 10 includes device region 12 and test region 14. When semiconductor devices such as integrated circuits are being formed on the wafer, a front end of line (FEOL) process is performed on wafer 10 to form one or more device structures. For instance, as shown in FIG. 1, the FEOL process involves forming junction regions 16, trench 18, and gate dielectric 20 in the device region on the wafer. Prior to the FEOL process, the wafer may be processed to form doped regions 22 in the wafer. In addition, doped region 24 may be formed in epitaxial (Epi) layer 26 in the device region. The junction regions, the trench, the gate dielectric, and the doped regions may be formed using any appropriate processes known in the art.

In this manner, wafer 10 includes a patterned wafer, which may also be a product wafer. As shown in test region 14, not all of the device structures are formed in the test region. For instance, after the FEOL process, the test region includes Epi layer 26 and gate dielectric layer 20. In one embodiment, the test region may be located in a scribe line on the patterned wafer.

Measurements of one or more electrical properties may be performed in test region 14 after the FEOL process. The measurements may be performed as described further herein. In general, the measurements may involve depositing a charge on an upper surface of the wafer and measuring a voltage at the site on which the charge was deposited. The wafer may be grounded during the measurements as described further herein. The voltage measurement, in some embodiments, is an out-of-plane measurement such that one or more out-of-plane electrical properties such as capacitance of the test structure can be measured. In other words, in such measurements, the voltage is measured from the upper surface of gate dielectric layer 20 to wafer 10. In this manner, Epi layer 26 will have an effect on the voltage measurements performed on gate dielectric layer 20. However, the voltage measurements may be easily corrected for such effects using either experimentally determined properties of the Epi layer (e.g., by measuring one or more properties of the Epi layer prior to forming the gate dielectric layer) or known properties of the Epi layer.

Correcting the voltage measurements for later stages of the wafer processing, however, is not nearly so straightforward. For example, as shown in FIG. 1, after a back end of line (BEOL) process for the metal 1 (M1) layer, which in this example is a single damascene process for forming copper interconnect 27 on the wafer, test region 14 includes the structures described above (e.g., the Epi layer and the gate dielectric layer) as well as additional structures formed in the M1 process. In particular, these additional structures include intermetal dielectric (IMD) structure 28, which in this case includes 8000 kÅ of borophosphosilicate glass (BPSG), etch stop layer 30, and IMD structure 32, which in this case includes a low-k dielectric material. The etch stop layer may be formed of any suitable material such as a dielectric material that will not be substantially etched by the etching process used to form vias in IMD structure 32. The M1 BEOL process may include any appropriate processes known in the art.

When the measurements described above are performed in test region 14 after the M1 process, the voltage measurements will be affected by all of the structures formed in the test region. In this manner, as the semiconductor fabrication process proceeds, the voltage measurements may become increasingly inaccurate or the number of corrections that must be made to ensure accuracy may be prohibitive. As such, it would be desirable to perform measurements on a test pad that can be formed on the wafer relatively easily while increasing the accuracy of the voltage measurements.

One such test pad is shown formed on wafer 10 after the first BEOL process. In particular, as shown in FIG. 1, test pad 34 is formed on wafer 10 in test region 14. Test pad 34 includes a test structure that is configured such that one or more electrical properties of the test structure can be measured. The electrical properties may be measured as described herein. In this case, the test structure includes the portion of IMD structure 32 located above conductive layer 36, which also forms part of the test pad. In particular, conductive layer 36 is formed between IMD structure 32 and wafer 10. Conductive layer 36 prevents structures located under the test structure between conductive layer 36 and wafer 10 from affecting the one or more electrical properties of the test structure during measurement. In particular, voltage measurements performed on the test structure will not be affected by voltage 37 across a portion of the test region from wafer 10 to conductive layer 36. Therefore, in one embodiment, the test structure includes an IMD structure. In one such embodiment, the one or more electrical properties of the test structure that can be measured include an in-plane dielectric constant of the IMD structure. In another such embodiment, the one or more electrical properties include an out-of-plane dielectric constant of the IMD structure. The in-plane and out-of-plane dielectric constants of the IMD structure may be measured as described herein.

The conductive layer may be formed relatively easily. For example, before IMD structure 32 is formed, a layer of a conductive material may be formed on the surface of IMD structure 28 and patterned to form an appropriately sized conductive layer for the test pad. The conductive layer may be formed on IMD structure 28 and patterned using any appropriate processes known in the art. The conductive layer of the test pad preferably has an area that is larger than an area of IMD structure 32 that will be measured. In other words, the area of the conductive layer may be larger than an area of the IMD structure that will be measured by a metrology system. For example, systems configured to perform non-contacting electrical measurement techniques include the Quantox systems that are commercially available from KLA-Tencor Corporation, San Jose, Calif. Some such systems may have a resolution of about 5 μm. Therefore, the area of the conductive layer may be at least about 5 μm×about 5 μm. In this manner, the conductive layer may have an area that is larger than an area of the test structure. Conductive layer 36 may include any appropriate conductive or semiconductive material known in the art.

In one embodiment, the conductive layer is electrically connected to the wafer by one or more conductive structures formed between the conductive layer and the wafer. For example, as further shown in FIG. 1, the test pad may include interconnect 38 that electrically connects conductive layer 36 to wafer 10. In this manner, the conductive layer may be maintained at substantially the same voltage as the wafer. In other words, if the wafer is grounded, then the conductive layer will also be grounded. As such, the voltage of the conductive layer during the measurements can be known, and the known voltage of the conductive layer can be used with the measured voltage to determine the one or more electrical properties of the IMD structure.

Interconnect 38 may be formed using any suitable processes known in the art. For example, prior to forming conductive layer 36, a patterned layer of photoresist and possibly other patterned layers may be formed on IMD structure 28.

The patterned layer(s) may be used as a mask for an etching process such that portions of the wafer covered by the patterned layer will not be etched. Therefore, the area in which interconnect 38 is to be formed may be exposed during the etch process such that an opening may be formed through the structures in this area. The patterned layer may be removed after etching, and a layer of a conductive material may be formed on the wafer and in the opening thereby forming interconnect 38. Any conductive material remaining on the surface of IMD structure 28 may be removed, for example, by a chemical-mechanical polishing (CMP) process. Interconnect 38 may be formed of any suitable conductive or semiconductive material known in the art.

Similar test pads can also be formed on the wafer for measurement of electrical properties of additional structures formed in later processes. For example, as shown in FIG. 1, after the metal 2 (M2) process, additional structures will be formed in the device region on the wafer. In particular, the M2 process may involve forming via/interconnect structures 40 in the device region. The via/interconnect structures may be formed in a dual damascene process, and the via/interconnect structures may be formed of a conductive material such as copper. The via/interconnect structures are electrically isolated from one another by IMD structures 42 and 44. IMD structures 42 and 44 may include low-k dielectric materials. IMD structures 42 and 44 may be formed of the same low-k dielectric material. The M2 process may include any suitable processes known in the art.

The structures that are formed in the test region on the wafer during the M2 process may include etch stop layer 46, IMD structure 42, etch stop layer 48, IMD structure 44, and etch stop layer 50. The etch stop layers may include materials such as those described above for etch stop layer 30. Measurements performed after the M2 process may include measuring one or more electrical properties of the structures formed in the M2 process. In this manner, the M2 process may be monitored and controlled based on one or more electrical properties of the structures that were formed in this process. Accordingly, it would be advantageous if one or more electrical properties of IMD structures 42 and 44 could be measured independently of other structures previously formed on the wafer (e.g., structures formed in the FEOL and M1 processes).

Test pad 52 enables such measurements of the IMD structures formed during the M2 process. In particular, test pad 52 may have a configuration similar to that of test pad 34 except that the conductive layer of test pad 52 is located above the structures formed prior to the M2 process. For instance, as shown in FIG. 1, test pad 52 includes conductive layer 54 formed on the surface of IMD structure 32. Conductive layer 54 may be configured as described above. In this instance, the test structure of the test pad includes portions of IMD structure 42, etch stop layer 48, IMD structure 44, and etch stop layer 50 located above conductive layer 54. As described above, the conductive layer prevents structures located under the test structure between conductive layer 54 and wafer 10 from affecting the one or more electrical properties of the test structure during measurement. In particular, voltage 56 will not affect the voltage measurements that are used to determine the one or more electrical properties of the test structure. In addition, test pad 52 may include interconnect 58 that couples conductive layer 54 to wafer 10. In this manner, the reference voltage for the measurements (e.g., the voltage of the conductive layer) will be substantially the same as the voltage applied to the wafer substrate during measurements (e.g., ground). Conductive layer 54 and interconnect 58 may be formed as described above. As shown in FIG. 1, test pad 34 may not be located under test pad 52. For instance, the test pads for different processes may be formed in different areas in the scribe line on the wafer.

As further shown in FIG. 1, after the metal 3 (M3) process, a number of additional structures may be formed in the device and test regions on the wafer. These structures may include, for example, IMD structure 60, etch stop layer 62, IMD structure 64, and etch stop layer 66. These structures and layers may be formed of the materials described above. In addition, the structures and layers may be used for a dual damascene process that may be used to form via/interconnect structures (not shown) in the device region of the wafer. The via/interconnect structures may be configured as described above. The via/interconnect structures will not be formed in the test region on the wafer particularly if the test region is located in a scribe line on the wafer.

After the M3 process, it may be desirable to measure one or more electrical properties of only the structures that were formed in this process. However, as described above, all layers disposed between the structures formed in the M3 process and the wafer will affect the voltage measurements performed on these structures. In this manner, the test pads described herein may be particularly suitable for measurement of one or more electrical properties of structures formed during BEOL processes.

In particular, as shown in FIG. 1, test pad 68 includes conductive layer 70 formed under IMD structure 60. In this manner, the test structure of the test pad includes the portions of IMD structure 60, etch stop layer 62, IMD structure 64, and etch stop layer 66 formed above conductive layer 70. Therefore, the conductive layer is formed between the test structure and wafer 10. As such, the conductive layer prevents structures located under the test structure between the conductive layer and the wafer (e.g., structures formed during the FEOL process, M1 BEOL process, and M2 BEOL process) from affecting the one or more electrical properties of the test structure during measurement. In particular, voltage 72 will not affect the voltage measurements that are used to determine the one or more electrical properties of the test structure. In addition, test pad 68 may include interconnect 74 that couples conductive layer 70 to wafer 10. In this manner, the reference voltage for the measurements (e.g., the voltage of the conductive layer) will be substantially the same as the voltage applied to the wafer during measurements (e.g., ground). Conductive layer 70 and interconnect 74 may be formed as described above. As shown in FIG. 1, test pads 34 and 52 may not be located under test pad 68. For instance, the test pads for different processes may be formed in different areas in the scribe line on the wafer.

Although the above described test pads are configured for measurement of structures formed by BEOL processes, it is to be understood that a similar test pad may be used for a FEOL process. For example, therefore, the test structure is formed by a FEOL process. In this manner, the test structure may include a gate structure such as a portion of a gate dielectric layer located above a conductive layer. The conductive layer of a test pad configured for use in a method for measuring one or more properties of a gate structure may be configured as described above.

In addition, as described above, each of the test pads may be formed in a different area of the test region. In this manner, the test pads will not overlap. However, in other embodiments, the test structure that is measured may be formed above additional test structures. In particular, since the conductive layer of the test pad will prevent structures underlying the conductive layer from affecting the measured properties of the test structure, the test pads for different processes may be arranged in a stack of test pads. Such a configuration may be advantageous when the space available on the wafer for test pads is relatively limited or when it is desirable to include test pads in a device region of the wafer, for example, to increase accuracy of the measurements or to provide measurements at different positions on the wafer. The measurements may be performed at different positions on the wafer to provide measurements of within wafer variation of one or more electrical properties of a test structure.

The test pads described herein are also advantageous in that the test structures of the test pads are formed in the same processes as the corresponding device structures on the wafer. In one example, IMD structure 32 is formed in the device region and the test region on the wafer during the same process. In this manner, the portion of IMD structure 32 above conductive layer 36 that forms the test structure will have substantially the same characteristics such as composition and electrical thickness as IMD structure 32 located in the device region. As such, the test pads described herein provide substantially accurate measurements of the electrical properties of the device structures formed on the wafer. In particular, the test pads described herein provide measurements of the electrical properties of the device structures that will be much more accurate than measurements performed on monitor wafers since the structures formed on monitor wafers are formed during different processes than those used to form the device structures on a patterned or product wafer.

One or more electrical properties of the test structures described herein may be measured using a non-contact measurement technique including any of those described herein. Using a non-contact measurement technique has obvious advantages over those techniques that involve contacting the structure under test with a probe. However, one or more electrical properties of the test structures described herein may also be measured using a contact measurement technique. The contact measurement technique may include MOS cap CV and may use a probe such as a mercury (Hg) probe or any other conductive probe known in the art. In some embodiments, measuring the one or more electrical properties includes measuring an out-of-plane voltage of the test structure. Out-of-plane voltage measurements using the test pads described herein will improve the accuracy of both non-contact and contact measurement techniques since as described further above, the out-of-plane voltage that is measured is only the voltage from the top of the test structure to the conductive layer of the test pads.

Figure 2:
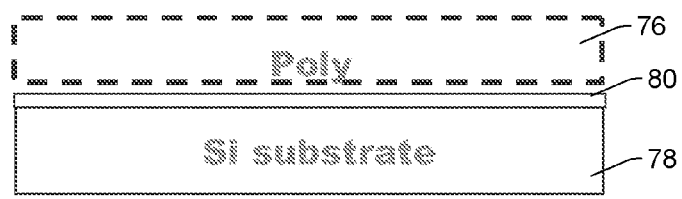
FIGS. 2-10 are schematic diagrams illustrating a cross-sectional view of different embodiments of a test pad that can be formed on a wafer.

Another embodiment relates to a test pad formed on a wafer that includes a gate structure formed on the wafer. One or more electrical properties of the gate structure can be measured for FEOL gate in-line monitoring. One embodiment of such a test pad is shown in FIG. 2. In this embodiment, the gate structure includes polysilicon layer 76 formed on the wafer (e.g., Si substrate 78). In another embodiment, the gate structure includes a polysilicon layer formed on a gate dielectric layer. For example, the test pad may include gate dielectric layer 80 formed between the polysilicon layer and the Si substrate. In one embodiment, the test pad has an area that is about 60 µm×about 60 µm. In addition, the test pad may include the polysilicon layer shown in FIG. 2 or a polysilicon structure (not shown in FIG. 2) formed by a patterning process (e.g., lithography and etch). In this manner, in some embodiments, the gate structure may include an isolated polysilicon structure.

The measurements that can be performed on the test pad shown in FIG. 2 include any of the measurements described further herein. For example, in one embodiment, the one or more electrical properties can be measured by measuring capacitance-voltage (C-V) characteristics of the gate structure. The C-V characteristics of the gate structure may be measured as described further herein. In addition, WAT Semiconductor Data Analysis Software, which is commercially available from Galaxy Semiconductor Solutions, Galway, Ireland, may be used to create a patterned test site for the C-V characteristics that are measured. Alternatively, any other site may be used for measurements of the C-V characteristics. Measurements of the test pad shown in FIG. 2 may also be used as a correlation to C-V characteristics of the test pad. The measurements that are performed on the test pad shown in FIG. 2 may also be used to determine equivalent oxide thickness (EOT) and leakage characteristics of gate dielectric layer 80. In this manner, in one embodiment, the gate structure includes a polysilicon layer formed on a gate dielectric layer, and the one or more electrical properties include an EOT of the gate dielectric layer. In another embodiment, the gate structure includes a polysilicon layer formed on a gate dielectric layer, and the one or more electrical properties include a leakage characteristic of the gate dielectric layer. The test pad shown in FIG. 2 may also be used for applications such as gate in-line device parameter monitoring. The test pad shown in FIG. 2 may be further configured as described herein.

Although the test pads are described above for use in out-of-plane voltage measurements, it is to be understood that the test pads may be configured for any other electrical measurements that may be of interest. For instance, in one embodiment, the one or more electrical properties include one or more in-plane electrical properties of the gate structure. In one such example, the test structures described above may include a portion of a transistor, and the one or more electrical properties that are measured may include in-plane electrical properties of the gate structure of the transistor such as the voltage required to open the gate as well as any other electrical properties of interest. Each of the test pads described above may be further configured as described herein.

Additional embodiments of a test pad that can be used for FEOL gate in-line monitoring are described further herein. In general, the test pad includes a gate structure formed on a conductive layer such as Si. The area of the test pad may be, for example, about 60 µm× about 60 µm. In addition, the test pad may be formed in a scribe line of a wafer. The test pad may also include a gate structure that includes a polysilicon layer and/or polysilicon patterned structures formed on a conductive layer such as Si. The measurements that may be performed on such test pads include, but are not limited to, EOT and leakage.

Figure 3:
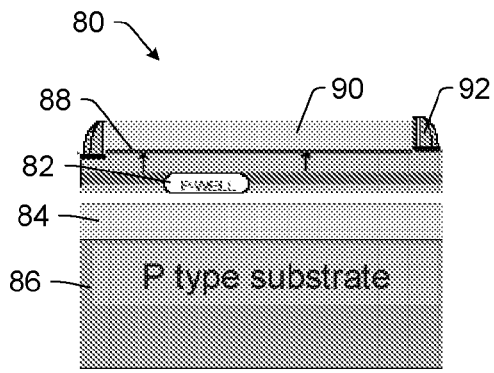

An additional embodiment of a test pad formed on a wafer that includes a gate structure is shown in FIG. 3. One or more electrical properties of the gate structure can be measured for FEOL gate in-line monitoring. In one embodiment, the gate in-line monitoring includes gate quality monitoring. Therefore, FIG. 3 illustrates one embodiment of a test pad that can be formed on a wafer and that can be used for measurements of gate quality for monitoring purposes. As shown in FIG. 3, this test pad includes gate structure 80 configured such that one or more electrical properties of the gate structure can be measured. In one embodiment, gate structure 80 includes P-well 82 formed in conductive layer 84, which is formed on wafer 86 such as a p-type Si substrate, gate dielectric 88 formed on conductive layer 84, polysilicon gate electrode 90 formed on gate dielectric 88, and insulating side walls or "spacers" 82 formed on both lateral sides of polysilicon gate electrode 90. The P-well, conductive layer, gate dielectric, gate electrode, and spacers may be formed using any suitable processes known in the art. In addition, the P-well, conductive layer, gate dielectric, gate electrode, and spacers may be formed of any suitable materials known in the art.

In one embodiment, the gate structure has one or more characteristics that are substantially the same as one or more characteristics of a device structure (not shown) formed on wafer 86. For example, the gate structure of the test pad may be formed in the same processes as the device structures (i.e., on the same wafer). In this manner, the gate structure and the device structures may have substantially the same characteristics such as compositions and lateral dimensions. The wafer may be further configured as described herein.

The test pad shown in FIG. 3 may be further configured as described herein. In one embodiment, more than one of the test pads configured as shown in FIG. 3 are formed on the wafer. Each of the test pads may be formed in a test region of the wafer such as a scribe line on a patterned wafer. In addition, more than one of the test pads configured as shown in FIG. 3 may be formed on the wafer in an arrangement on the wafer such that across wafer variations in the one or more electrical properties of the gate structure can be measured.

The one or more electrical properties of the gate structure can be measured using a non-contact measurement technique as described further herein. In addition, or alternatively, the one or more electrical properties of the gate structure can be measured using a contact measurement technique as described further herein. In one embodiment, the one or more electrical properties of the gate structure shown in FIG. 3 that can be measured include, but are not limited to, EOT, leakage ($J_g$) index, surface voltage ($V_s$), Dit (Interface trap density), and threshold voltage ($V_t$). In some embodiments, the gate in-line monitoring for which the one or more electrical properties can be measured includes, but is not limited to, gate dielectric process control, polysilicon plasma etch damage monitoring, pre-spacer ion implantation damage monitoring, spacer deposition and etch process monitoring, source and drain ion implantation damage monitoring, salicide sinter strip anneal monitoring, and contact dielectric deposition and CMP charging monitoring.

Figure 4:
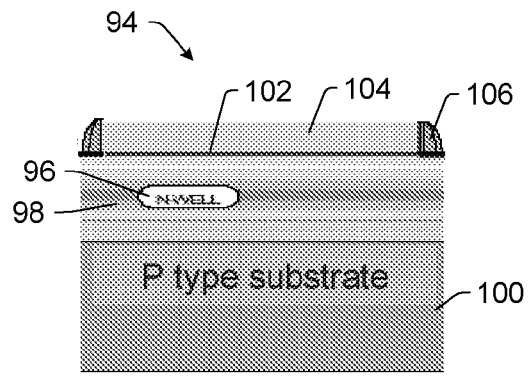

Another embodiment of a test pad that can be formed on a wafer and that can be used for measurements of gate quality for monitoring purposes is shown in FIG. 4. As shown in FIG. 4, this test pad includes gate structure 94 configured such that one or more electrical properties of the gate structure can be measured. In one embodiment, gate structure 94 includes N-well 96 formed in conductive layer 98, which is formed on wafer 100 such as a p-type Si substrate, gate dielectric 102 formed on conductive layer 98, polysilicon gate electrode 104 formed on gate dielectric 102, and spacers 106 formed on both lateral sides of polysilicon gate electrode 104. The N-well, conductive layer, gate dielectric, gate electrode, and spacers may be formed using any suitable processes known in the art. In addition, the N-well, conductive layer, gate dielectric, gate electrode, and spacers may be formed of any suitable materials known in the art.

The gate structure may have one or more characteristics that are substantially the same as one or more characteristics of a device structure (not shown) formed on wafer 100. For example, the gate structure of the test pad may be formed in the same processes as the device structures (i.e., on the same wafer). In this manner, the gate structure and the device structures may have substantially the same characteristics such as compositions and lateral dimensions. The wafer may be further configured as described herein.

The test pad shown in FIG. 4 may be further configured as described herein. In addition, more than one test pad configured as shown in FIG. 4 may be formed on the wafer. Furthermore, the test pads shown in FIGS. 3 and 4 may both be formed on the same wafer. Each of the test pads may be formed in a test region of the wafer such as a scribe line on a patterned wafer. In addition, the arrangement of the test pads on the wafer may be selected such that across wafer variations in the one or more electrical properties of the gate structure can be measured. The measurements that may be performed on the gate structure shown in FIG. 4 include the measurements that can be performed on the gate structure shown in FIG. 3, which are described further above. In addition, the test pad shown in FIG. 4 can be used in the same applications as the test pad shown in FIG. 3, which are described above.

Figure 5:
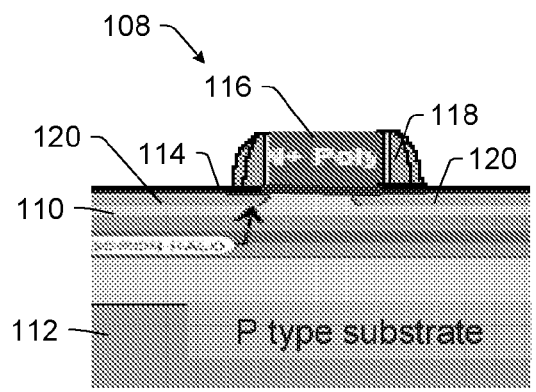

One embodiment of a test pad that can be formed on a wafer and used for measurements of one or more electrical properties (e.g., one or more in-plane electrical properties) is shown in FIG. 5. As shown in FIG. 5, this test pad includes gate structure 108 configured such that one or more electrical properties of the gate structure can be measured. The one or more electrical properties of the gate structure that can be measured include $V_t$. In this manner, the test pad shown in FIG. 5 can be used for $V_t$ monitoring and control. In addition, or alternatively, the one or more electrical properties of the gate structure may include any other electrical property or properties described herein.

In one embodiment, gate structure 108 includes conductive layer 110 formed on wafer 112, which may be a p-type Si substrate. Gate structure 108 also includes gate dielectric 114 formed on conductive layer 110. Gate electrode 116 is formed on gate dielectric 114 and may be formed of a material such as N+ polysilicon. Spacers 118 are formed on both lateral sides of gate electrode 116. In addition, gate structure 108 includes source/drain junctions 120. Source/drain junctions 120 may be formed by implanting ions such as boron ions into the conductive layer after spacers 118 have been formed on the gate electrode. In some embodiments, the gate structure may also include a P-well (not shown in FIG. 5) formed in conductive layer 110. The P-well may be formed in the conductive layer as shown in FIG. 3. Each individual structure of the gate structure may be formed using any suitable process(es) known in the art. In addition, each individual structure of the gate structure may be formed of any suitable material(s) known in the art.

The gate structure shown in FIG. 5 may have one or more characteristics that are substantially the same as one or more characteristics of a device structure (not shown) formed on wafer 112. For example, the gate structure of the test pad may be formed in the same processes as the device structures. In this manner, the gate structure and the device structures may have substantially the same characteristics such as compositions and lateral dimensions. The wafer may be further configured as described herein.

The test pad shown in FIG. 5 may be formed in a scribe line on the wafer. In addition, more than one test pad configured as shown in FIG. 5 may be formed on the wafer (e.g., in the scribe line on the wafer). The size of each test pad may be about 60 μm×about 60 μm. $V_t$ of the gate structure shown in FIG. 5 may be measured as described further herein.

Figure 6:
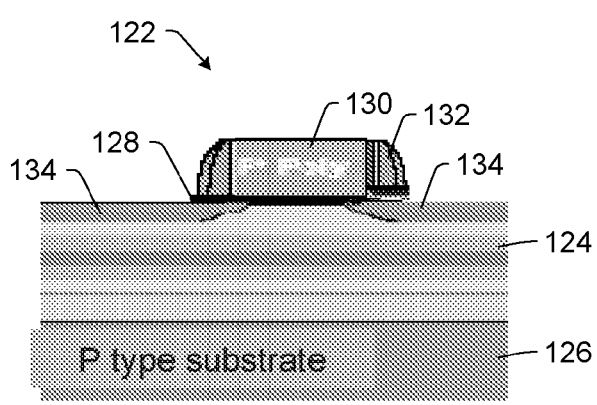

Another embodiment of a test pad that can be formed on a wafer and used for measurements of one or more electrical properties (e.g., one or more in-plane electrical properties) is shown in FIG. 6. As shown in FIG. 6, this test pad includes gate structure 122 configured such that one or more electrical properties of the gate structure can be measured. The one or more electrical properties of the gate structure that can be measured include $V_t$. In this manner, the test pad shown in FIG. 6 can be used for $V_t$ monitoring and control. In addition, or alternatively, the one or more electrical properties of the gate structure may include any other electrical property or properties described herein.

In one embodiment, gate structure 122 includes conductive layer 124 formed on wafer 126, which may be a p-type Si substrate. Gate structure 122 also includes gate dielectric 128 formed on conductive layer 124. Gate electrode 130 is formed on gate dielectric 128 and may be formed of a material such as P+ polysilicon. Spacers 132 are formed on both lateral sides of gate electrode 130. In addition, gate structure 122 includes source/drain junctions 134. Source/drain junctions 134 may be formed as described above. In some embodiments, the gate structure may also include an N-well (not shown in FIG. 6) formed in conductive layer 124. The N-well may be formed in the conductive layer as shown in FIG. 4. Each individual structure of the gate structure may be formed using any suitable process(es) known in the art. In addition, each individual structure of the gate structure may be formed of any suitable material(s) known in the art.

The gate structure shown in FIG. 6 may have one or more characteristics that are substantially the same as one or more characteristics of a device structure (not shown) formed on wafer 126. For example, the gate structure of the test pad may be formed in the same processes as the device structures. In this manner, the gate structure and the device structures may have substantially the same characteristics such as compositions and lateral dimensions. The wafer may be further configured as described herein.

The test pad shown in FIG. 6 may be formed in a scribe line on the wafer. The area of the test pad may be about 60 μm×about 60 μm. In addition, more than one test pad configured as shown in FIG. 6 may be formed on the wafer (e.g., in the scribe line on the wafer). Furthermore, the test pads shown in FIGS. 5 and 6 may both be formed on the same wafer. Each of the test pads may be formed in a test region of the wafer such as a scribe line on a patterned wafer. In addition, the arrangement of the test pads on the wafer may be selected such that across wafer variations in the one or more electrical properties of the gate structure can be measured. $V_t$ of the gate structure shown in FIG. 6 may be measured as described further herein.

Figure 7:
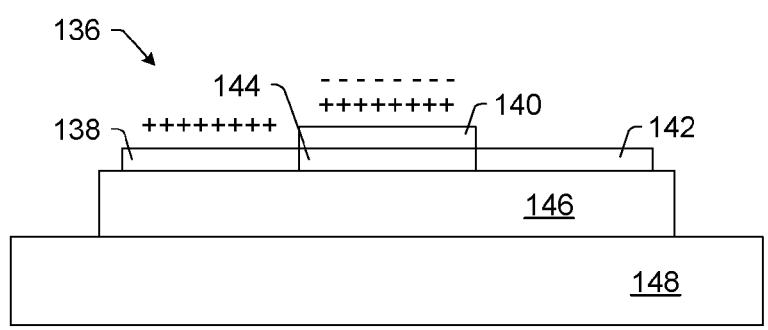

An additional embodiment of a test pad that can be formed on a wafer and that can be used for measurements of one or more electrical properties (e.g., one or more in-plane electrical properties) is shown in FIG. 7. As shown in FIG. 7, this test pad includes gate structure 136 configured such that one or more electrical properties of the gate structure can be measured. In one embodiment, gate structure 136 includes source 138, gate electrode 140, and drain 142. In another embodiment, therefore, the gate structure includes a source, a gate electrode, a drain, and a gate dielectric. For example, the gate structure may include gate dielectric 144 located under the gate electrode. The source, gate electrode, drain, and gate dielectric may be formed using any suitable processes known in the art. In addition, the source, gate electrode, drain, and gate dielectric may be formed of any suitable materials known in the art.

The gate structure may have one or more characteristics that are substantially the same as one or more characteristics of a device structure (not shown) formed on wafer 148. For example, the gate structure of the test pad may be formed in the same processes as the device structures. In this manner, the gate structure and the device structures may have substantially the same characteristics such as compositions and lateral dimensions. The wafer may be further configured as described herein.

The test pad also includes isolated insulator pad 146 formed between the gate structure and wafer 148. The isolated insulator pad may have an area that is larger than an area of the gate structure. In addition, the isolated insulator pad may be formed using any suitable processes known in the art. For example, prior to forming the gate structure and any device structures that are formed on the same layer on the wafer as the gate structure, a layer of insulating material may be formed on the wafer using a process such as chemical vapor deposition (CVD). A patterned layer of material may be formed on the insulating material using a process such as lithography. Portions of the insulating layer not underlying the patterned layer may be removed using a process such as etch to form one or more isolated insulator pads on the wafer. After the removal of the portions of the insulating layer, any patterned layer material remaining on the isolated insulator pads may be removed using a process such as stripping. Of course, many different processes may be used to form one or more of the isolated insulator pads on a wafer, and all such processes are within the scope of the disclosure provided herein. The one or more isolated insulator pads may be formed of any appropriate insulating material known in the art.

Isolated insulator pad 146 prevents structures (not shown in FIG. 7) located under the gate structure between the isolated insulator pad and the wafer from affecting the one or more electrical properties of the gate structure during measurement. In addition, the isolated insulator pad may prevent the wafer itself from affecting the one or more electrical properties of the gate structure during measurement. In one embodiment, neighboring structures are formed on a layer of the wafer on which the gate structure is formed. The neighboring structures may include, for example, device structures and other test structures. For example, the test pad may be formed in a test region of the wafer, and neighboring structures such as device structures may be formed in a device region of the wafer, as shown in FIG. 1. In such an embodiment, the isolated insulator pad also prevents the neighboring structures from affecting the one or more electrical properties of the gate structure during measurement.

The test pad shown in FIG. 7 may be further configured as described herein. For example, in one embodiment, the wafer includes a patterned wafer. In one such embodiment, the gate structure and the isolated insulator pad are formed in a scribe line of the patterned wafer. In addition, more than one test pad configured as shown in FIG. 7 may be formed on the wafer. Each of the test pads may be formed in a test region of the wafer such as a scribe line on a patterned wafer. In another embodiment, more than one of the tests pads are formed on the wafer in an arrangement such that across wafer variations in the one or more electrical properties of the gate structure can be measured. For example, the arrangement of the test pads on the wafer may be selected such that across wafer variations in the one or more electrical properties of the gate structure can be measured.

One or more electrical properties of the gate structure can be measured using a non-contact measurement technique as described further herein. In an additional embodiment, the one or more electrical properties of the gate structure can be measured using a contact measurement technique, which may be performed as described further herein. In one embodiment in which the one or more electrical properties are measured using a non-contact measurement technique, a charge is deposited on only a portion of the gate structure. The one or more electrical properties of the gate structure that can be measured may include an in-plane electrical property of the gate structure. In another embodiment, the one or more electrical properties of the gate structure that can be measured include an out-of-plane electrical property of the gate structure. In addition, the one or more electrical properties of the gate structure that can be measured may include $V_t$ of the gate structure. The one or more electrical properties of the gate structure described above may be measured as described further herein.

Measurement of an in-plane electrical property of the gate structure may include depositing a charge on either the source or drain side of the gate structure. For example, as shown in FIG. 7, this charge deposition may include a positive charge deposited on source 138 and gate electrode 140. The charge deposition may alternatively include a negative charge. The amount of charge that is deposited on the source or drain side of the gate structure may be relatively low such that a measurable voltage change is not caused on the other side of the gate structure by the charge deposition.

After deposition of the charge, another charge is deposited on the gate electrode for opening the channel. This charge may be opposite to the charge previously deposited on the gate structure. For example, as shown in FIG. 7, this charge deposition may include a negative charge deposited on gate electrode 140. The $V_s$ on the other, non-charged side of the gate structure may be monitored during deposition of this charge on the gate electrode. A voltage change on the non-charged side of the gate structure is indicative of the opening of the channel. In other words, if the charge/voltage on the gate electrode is sufficient to switch on the gate ($V_t$), the system will measure a voltage increase on the non-charged side of the gate structure. The voltage applied to the gate structure can be directly correlated to the $V_t$.

The measurements described above may be performed with a system as described further herein, which may be configured to include a probe having a relatively small size (e.g., a "Quantox nano-probe") such that the different voltages can be measured at different locations on the gate structure.

Figure 8:
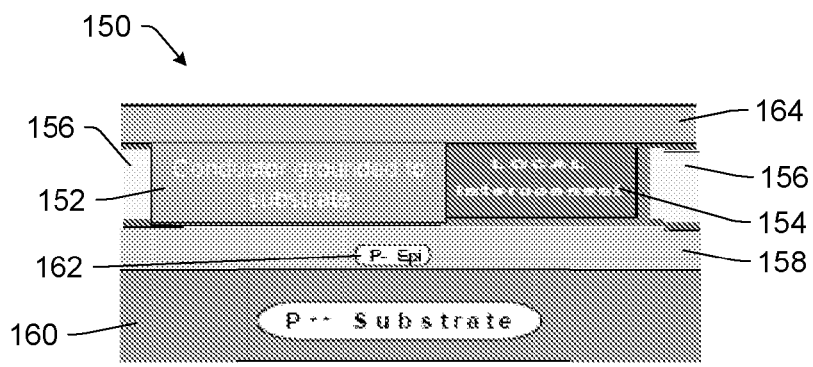
Figure 9:
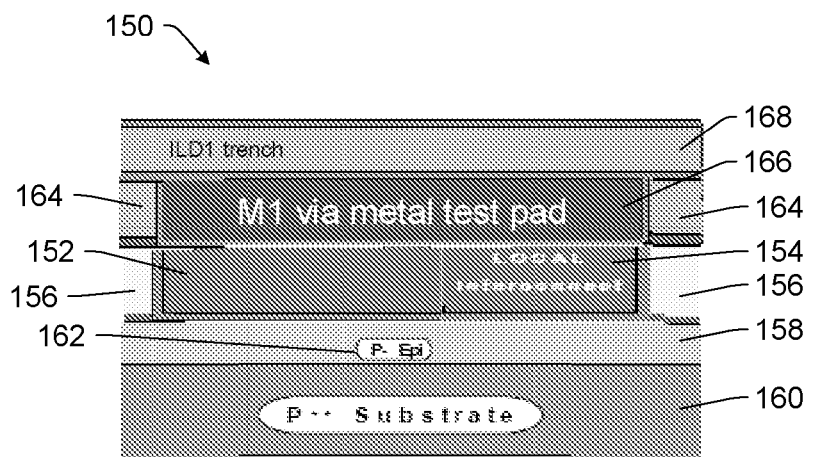
Figure 10:
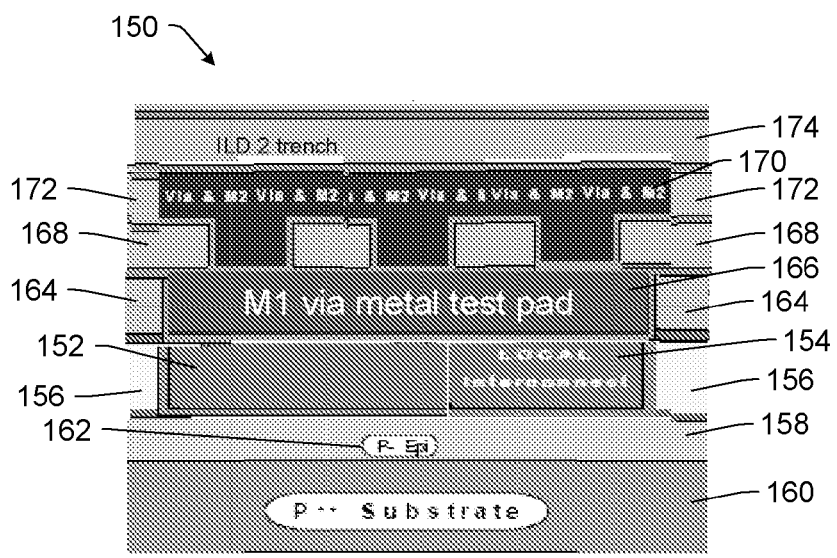

Embodiments of a test pad that can be formed on a wafer and used to monitor an interlevel dielectric (ILD) process are shown in FIGS. 8-10. The terms ILD and IMD are used interchangeably herein. As shown in FIG. 8, test pad 150 includes conductive structure 152 and local interconnect 154 formed within insulating layer 156. Conductive structure 152 and local interconnect 154 are formed on Epi layer 158, which is formed on wafer 160. Wafer 160 may be, for example, a p++ Si substrate. In addition, P-well 162 may be formed in Epi layer 158. ILD layer 164 is formed on insulating layer 156, conductive structure 152, and local interconnect 154. ILD layer 164 may be used to electrically isolate vias that will be formed in the ILD layer. The conductive structure, local interconnect, insulating layer, Epi layer, P-well, and ILD layer may be formed using any processes known in the art. In addition, the structures of the test pad may be formed of any suitable materials known in the art.

Conductive structure 152 prevents structures located under ILD layer 164 between conductive layer 152 and wafer 160 from affecting the one or more electrical properties of ILD layer 164 during measurement. In particular, voltage measurements performed on ILD layer 164 will not be affected by the voltage across a portion of the test pad from wafer 160 to conductive layer 152.

Conductive layer 152 preferably has an area that is larger than an area of ILD layer 164 that will be measured. In other words, the area of the conductive layer may be larger than an area of the ILD layer that will be measured by a metrology system as described further herein. Conductive layer 152 may also be electrically connected to wafer 160 as described herein. In this manner, the conductive layer may be maintained at substantially the same voltage as the wafer. In other words, if the wafer is grounded, then the conductive layer will also be grounded. As such, the voltage of the conductive layer during the measurements can be known, and the known voltage of the conductive layer can be used with the measured voltage to determine the one or more electrical properties of the ILD layer.

As shown in FIG. 9, M1 via metal test pad structure 166 may be formed on conductive layer 152 and local interconnect 154. In addition, M1 via metal test pad structure 166 may be formed within ILD layer 164. As further shown in FIG. 9, ILD layer 168 may be formed on M1 via metal test pad structure 166 and ILD layer 164. ILD layer 168 may be used to electrically isolate vias that will be formed in the ILD layer. The M1 via metal test pad structure and ILD layer 168 may be formed using any processes known in the art. In addition, these structures of the test pad may be formed of any suitable materials known in the art.

M1 via metal test pad structure 166 prevents structures located under ILD layer 168 between structure 166 and wafer 160 from affecting the one or more electrical properties of ILD layer 168 during measurement. In particular, voltage measurements performed on ILD layer 168 will not be affected by the voltage across a portion of the test pad from wafer 160 to structure 166. In this manner, structure 166 may be configured as a conductive layer of the test pad.

Test pad structure 166 preferably has an area that is larger than an area of ILD layer 168 that will be measured. In other words, the area of the test pad structure may be larger than an area of the ILD layer that will be measured by a metrology system as described further herein. Test pad structure 166 may also be electrically connected to wafer 160 as described herein. In this manner, the test pad structure may be maintained at substantially the same voltage as the wafer. In other words, if the wafer is grounded, then the test pad structure will also be grounded. As such, the voltage of the test pad structure during the measurements can be known, and the known voltage of the test pad structure can be used with the measured voltage to determine the one or more electrical properties of the ILD layer.

As shown in FIG. 10, after measurements of ILD layer 168, M2 via and test pad structure 170 may be formed on M1 via metal test pad 166. M2 via and test pad structure 170 is formed within ILD layer 168 and ILD layer 172, which is formed on ILD layer 168. ILD layer 174 is formed on ILD layer 172 and M2 via and test pad structure 170. ILD layer 174 may be used to electrically isolate vias that will be formed in the ILD layer. The M2 via and test pad structure and ILD layer 174 may be formed using any processes known in the art. In addition, these structures of the test pad may be formed of any appropriate materials known in the art.

M2 via and test pad structure 170 prevents structures located under ILD layer 174 between structure 170 and wafer 160 from affecting the one or more electrical properties of ILD layer 174 during measurement. In particular, voltage measurements performed on ILD layer 174 will not be affected by the voltage across a portion of the test pad from wafer 160 to test pad structure 170. In this manner, test pad structure 170 may be configured as a conductive layer of the test pad.

Test pad structure 170 preferably has an area that is larger than an area of ILD layer 174 that will be measured. In other words, the area of the test pad structure may be larger than an area of the ILD layer that will be measured by a metrology system as described further herein. Test pad structure 170 may also be electrically connected to wafer 160 as described herein. In this manner, the test pad structure may be maintained at substantially the same voltage as the wafer. In other words, if the wafer is grounded, then the test pad structure will also be grounded. As such, the voltage of the test pad structure during the measurements can be known, and the known voltage of the test pad structure can be used with the measured voltage to determine the one or more electrical properties of the ILD layer.

The test pads shown in FIGS. 8-10 may be formed in a scribe line on a wafer. In addition, as described above, the conductive layers/test pad structures that are included in the test pads can be electrically connected to the wafer. In this manner, the conductive layers/test pad structures are constructed such that each structure can be contacted to ground through a via before each ILD layer measurement is performed. The one or more electrical properties that may be measured for the ILD layers include, but are not limited to, out-of-plane dielectric constant k, leakage J, and a $V_s$ map. In one embodiment, therefore, the test structure includes an IMD structure, and the one or more electrical properties of the test structure that can be measured include leakage of the IMD structure. In another embodiment, the test structure includes an IMD structure, and the one or more electrical properties include a $V_s$ map of the IMD structure. These measurements may be performed as described further herein. The test pads shown in FIGS. 8-10 may be used for monitor and control of processes such as ILD deposition, ash/etch processes, ILD CMP, and scrub charging. The test pads shown in FIGS. 8-10 may be further configured as described herein.

Figure 11:
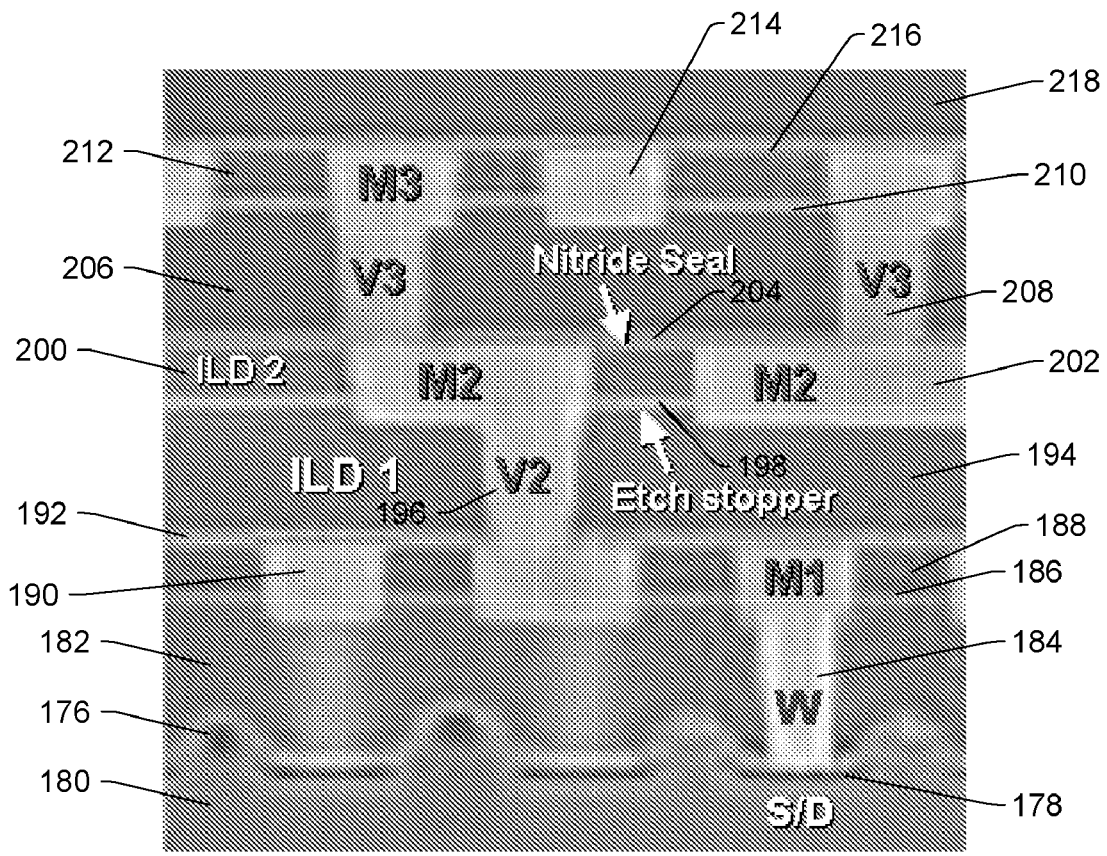
FIG. 11 is a schematic diagram illustrating one example of a device structure formed on a wafer after a number of inter-level (ILD) processes have been performed on the wafer.

FIG. 11 illustrates one example of a device structure formed on a wafer after a number of ILD processes have been performed on the wafer. In particular, FIG. 11 illustrates a cross-sectional scanning electron microscope (SEM) image of the wafer after the ILD processes have been performed. As shown in FIG. 11, the device structure includes gate structures 176 formed on wafer 180. Gate structures 176 may be formed on the wafer as described further above. In addition, source/drain (S/D) regions 178 of the gate structures may be formed in wafer 180. Insulating layer 182 is formed on gate structures 176 and wafer 180. Via 184 is formed in insulating layer 182. Via 184 may be formed of a material such as tungsten (W) or any other suitable material known in the art.

Etch stop layer 186 is formed on insulating layer 182. Insulating layer 188 is formed on etch stop layer 186. Conductive structures 190 are formed in insulating layer 188. Etch stop layer 192 is formed on insulating layer 188 and some of conductive structures 190, and ILD layer 194 is formed on etch stop layer 192. Via 196 is formed in ILD layer 194. Via 196 may be formed of any suitable material known in the art such as copper. Etch stop layer 198 is formed on ILD layer 194. ILD layer 200 is formed on etch stop layer 198. Conductive structures 202 are formed in ILD layer 200. Nitride seal layer 204 is formed on ILD layer 200. ILD layer 206 is formed on nitride seal layer 204, and vias 208 are formed within ILD layer 206. Vias 208 may be formed of any suitable material known in the art such as copper. Etch stop layer 210 is formed on ILD layer 206. ILD layer 212 is formed on etch stop layer 210. Conductive structures 214 are formed within ILD layer 212. Nitride seal layer 216 is formed on ILD layer 212 and conductive structures 214. Dielectric layer 218 is formed on nitride seal layer 216. Each of the ILD layers shown in FIG. 11 may include a dielectric material such as a low-k dielectric material or any other suitable dielectric material known in the art. In addition, each of the structures of the device structure shown in FIG. 11 may be formed of any material known in the art and using any process known in the art.

Figure 12:
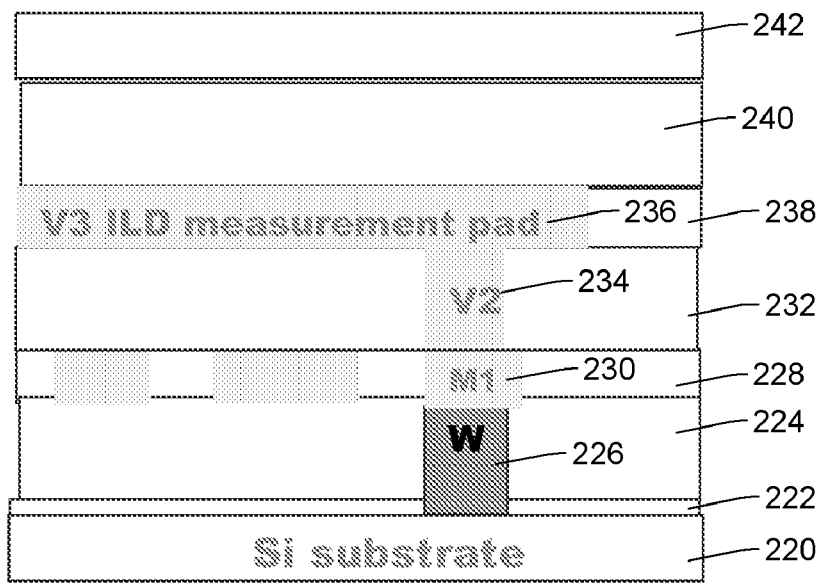
FIGS. 12-13 are schematic diagrams illustrating a cross-sectional view of different embodiments of a test pad that can be formed on a wafer.

FIG. 12 illustrates one embodiment of a test pad that can be used to monitor an ILD process. This test pad may be formed on the same wafer as the device structure shown in FIG. 11. In addition, the test pad may be formed in a test region such as a scribe line on a product wafer, and the device structure may be formed in a device region of the wafer. As shown in FIG. 12, the test pad includes Si substrate 220. Gate dielectric layer 222 may be formed on Si substrate 220. In addition, dielectric layer 224 may be formed on gate dielectric layer 222. Via 226 is formed in dielectric layer 224. Via 226 may be formed of a material such as W or any other suitable material known in the art.

Dielectric layer 228 is formed on dielectric layer 224. Conductive structures 230 are formed within dielectric layer 228. ILD layer 232 is formed on dielectric layer 228 and some of conductive structures 230. Via 234 is formed in ILD layer 232. As shown in FIG. 12, via 234 is electrically connected to one of conductive structures 230. In addition, the conductive structure to which via 234 is electrically connected is also electrically connected to via 226. Furthermore, via 226 is electrically connected to Si substrate 220.

As further shown in FIG. 12, measurement pad 236 is formed on ILD layer 232 and via 234. In addition, measurement pad 236 is formed within ILD layer 238. Measurement pad 236 is formed of a conductive material. In this manner, measurement pad 236 is electrically connected to via 234 and therefore is also electrically connected to Si substrate 220. Therefore, during measurement of one or more properties of ILD layer 240, which is formed on measurement pad 236 and ILD layer 238, measurement pad 236 can be maintained at substantially the same voltage that is applied to the wafer (e.g., ground).

In this manner, measurement pad 236 provides a reference voltage for measurements like those of the test pad structures described further above. Therefore, the portion of ILD layer 240 formed on measurement pad 236 constitutes the test structure of the test pad shown in FIG. 12 and measurement pad 236 constitutes the conductive layer of the test pad. Measurement pad 236 may be further configured as described above with respect to the test pad structures shown in FIGS. 8-10 and the conductive layer shown in FIG. 1. After measurement of one or more electrical properties of ILD layer 240, dielectric layer 242 may be formed on ILD layer 240. Alternatively, dielectric layer 242 may be formed on ILD layer 240 prior to measurements of ILD layer 240. In this manner, one or more electrical properties of both ILD layers 240 and 242 may be measured simultaneously. Such measurements may be performed as described herein.

The test pad shown in FIG. 12 may be further configured as described herein. For instance, the test pad may include more than one measurement pad (not shown in FIG. 12), and each measurement pad may be used to provide a reference voltage for measurements of different ILD layers on the wafer. In addition, the measurements that are performed on the test pad shown in FIG. 12 may include any of the measurements described herein. For example, the one or more electrical properties of the test structure that are measured may include an out-of-plane dielectric constant k, leakage J, and a $V_s$ map. The applications in which the test pad shown in FIG. 12 may be used include, but are not limited to, ILD deposition monitoring, ash/etch process monitoring, ILD CMP and scrub charging monitoring.

Figure 13:
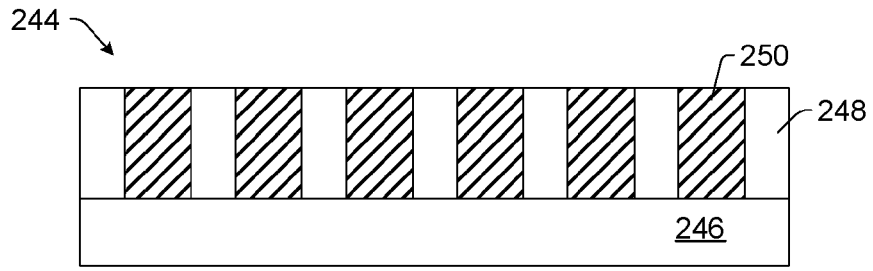

Another embodiment of a test pad that can be used to measure one or more electrical properties (e.g., one or more in-plane and/or out-of-plane electrical properties) of a test structure is shown in FIG. 13. As shown in FIG. 13, the test pad includes test structure 244 that is configured such that one or more electrical properties of the test structure can be measured. The test pad also includes conductive layer 246 formed between test structure 244 and a wafer (not shown in FIG. 13). The wafer may be further configured as described above. The conductive layer prevents structures (not shown in FIG. 13) located under the test structure between the conductive layer and the wafer from affecting the one or more electrical properties of the test structure during measurement.

Conductive layer 246 may be further configured as described above and shown in FIG. 1. For example, conductive layer 246 may include any appropriate conductive or semiconductive material known in the art such as, but not limited to, Si or a metal. In this manner, the conductive layer may be electrically connected to the wafer during measurements. As such, the reference voltage for the measurements (e.g., the voltage of the conductive layer) will be substantially the same as the voltage applied to the wafer during measurements (e.g., ground). Therefore, the conductive layer may act as a grounding pad. In addition, structures located under the test structure between the conductive layer and the wafer may be further configured as described herein. Alternatively, conductive layer 246 shown in FIG. 13 may be a Si substrate.

Test structure 244 includes insulating structures 248. Insulating structures 248 may be formed of any suitable insulating material known in the art such as a low-k dielectric material. In some embodiments, the test structure includes insulating structures 248 and conductive structures 250 formed between the insulating structures. Conductive structures 250 may be formed of any suitable material known in the art such as copper. In one embodiment, the test structure includes insulating structures and trenches formed between the insulating structures. For example, test structure 244 may not include conductive structures 250. Instead, the test structure may include insulating structures 248 with open space in the trenches formed between the insulating structures. In one embodiment, therefore, the test structure includes insulating structures and trenches formed between the insulating structures, and a series of conductive structures may or may not be formed in the trenches. In some embodiments, the one or more electrical properties of the test structure that can be measured include an in-plane electrical property of the insulating structures. In another embodiment, the one or more electrical properties of the test structure that can be measured include an out-of-plane electrical property of the insulating structures.

The trenches may be formed using any suitable processes known in the art. For example, a layer of insulating material such as a low k dielectric can be deposited on top of conductive layer 246. Trenches may then be etched in the layer of insulating material to form an array of trenches. After formation of the trenches, side walls (not shown in FIG. 13) may be formed on the opposing side surfaces of insulating structures 248. The side walls may be formed of a material such as a low k dielectric. The side walls and the insulating structures may be formed of the same low k dielectric material or different low k dielectric materials. The side walls may be formed in any manner known in the art.

The test structure shown in FIG. 13 may include additional materials (not shown) such as an etch stop layer formed between insulating structures 248 and conductive layer 246 and/or an anti-reflective coating (ARC) layer formed on top of insulating structures 248. The etch stop layer and the ARC layer may include any appropriate materials known in the art. The etch stop layer and the ARC layer may also have any appropriate characteristics such as thickness known in the art. In addition, the etch stop layer and the ARC layer may be formed using any suitable process or processes (e.g., deposition) known in the art.

The trenches may have any suitable characteristics such as dimensions and pitch. A suitable width for each of the insulating structures and the trenches may be from about 1 nm to about 10 μm. For example, a suitable line width for insulating structures 248 may be about 0.1 μm to about 0.3 μm, and a suitable width for the trenches may be about 0.1 μm to about 0.4 μm. A suitable pitch for the test structure may be from about 1 nm to about 10 μm (e.g., about 0.2 μm, about 0.3 μm, about 0.4 μm, etc.). A total length of the test structure may be from about 1 nm to about 100 μm. In addition, the characteristics of the test structure such as dimensions and pitch may vary depending on the characteristics of the device structures being formed on the wafer. In this manner, in some embodiments, the characteristics of the insulating structures, and the conductive structures if included in the test structure, may be substantially the same as characteristics of corresponding device structures (not shown) formed on the wafer. The test pad shown in FIG. 13 may be further configured as described herein. For example, the test pad may be formed in a scribe line of a patterned wafer. In addition, the area of the test pad may be about 60 μm×about 60 μm. In another example, the area of the test pad may be about 50 μm× about 50 μm.

In some embodiments, more than one of the test pads are formed on the wafer. Each test pad may include a test structure configured as shown in FIG. 13. For example, the test structures of the more than one test pad may include insulating structures and trenches formed between the insulating structures. The test structures of the test pads may have one or more different characteristics. In one such embodiment, the test structures of at least some of the more than one test pad have different pitches and different trench widths. For example, one test structure may have a pitch of about 0.2 μm, an insulating structure line width of about 0.1 μm, and a trench width of about 0.1 μm. Another test structure may have a pitch of about 0.3 μm, an insulating structure line width of about 0.2 μm, and a trench width of about 0.1 μm. A third of the test structures may have a pitch of about 0.4 μm, an insulating structure line width of about 0.3 μm, and a trench width of about 0.1 μm. A fourth of the test structures may have a pitch of about 0.3 μm, an insulating structure line width of about 0.1 μm, and a trench width of about 0.2 μm. Such test pads may be particularly suitable for monitoring line-to-line k. In particular, the one or more electrical properties of the test structures that can be measured include a line-to-line k of the insulating structures. The one or more electrical properties of the test structures that can be measured for monitoring line-to-line k may include EOT, k, capacitance, and leakage. The one or more measurements may be performed as described herein. In addition, the one or more measurements that are performed on the test pads may include any other measurement(s) described herein.

As described above, more than one of the tests pads may be formed on the wafer, and the test structures of the more than one test pad may include insulating structures and trenches formed between the insulating structures. In one such embodiment, the test structures of at least some of the more than one test pad have substantially the same trench width and different insulating structure line widths. For example, four test pads may be formed on a wafer. The test structures of the test pads may have substantially the same trench widths, which may be approximately equal to the trench widths of the device structures formed on the wafer. At least some of the test pads may have different insulating structure line widths.

For example, the different insulating structure line widths may include an insulating structure line width of the device structures formed on the wafer or a line width of less than about 0.1 μm, the insulating structure line width of the device structures–0.02 μm, the insulating structure line width of the device structures–0.04 μm, and the insulating structure line width of the device structures–0.06 μm. Such test pads may be particularly suitable for measuring side wall damage layer thickness, and such measurements may be performed as described further herein.

Figure 14:
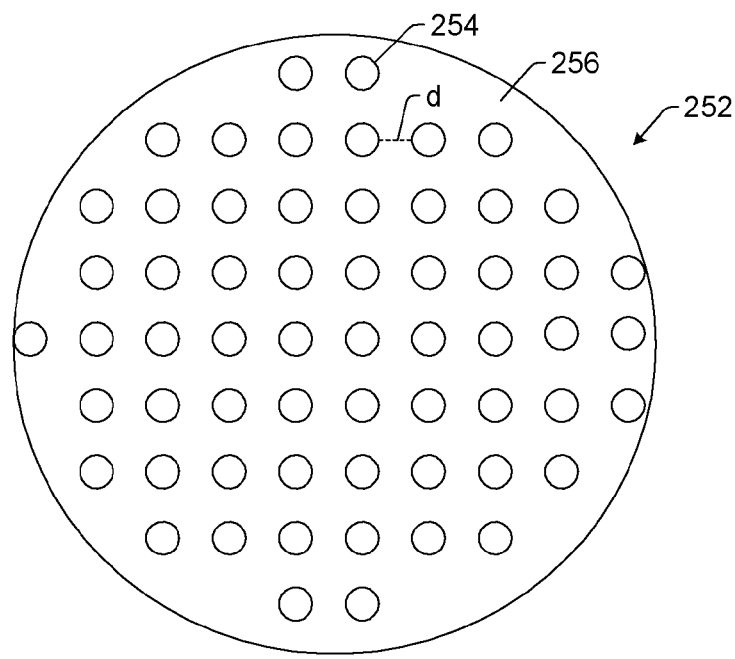
FIG. 14 is a schematic diagram illustrating a top view of one embodiment of a test pad formed on a wafer.

In another embodiment, the test structure includes vias formed in an insulating structure. In one such embodiment, the one or more electrical properties include an in-plane electrical property of the insulating structure. In another such embodiment, the one or more electrical properties include an out-of-plane electrical property of the insulating structure. One embodiment of a test pad that includes such a test structure is shown in FIG. 14. As shown in FIG. 14, test structure 252 includes vias 254 formed in insulating structure 256. The insulating structure may be formed using any suitable processes known in the art. In addition, the insulating structure may formed of any suitable material known in the art. In some embodiments, the test structure also includes conductive structures (not shown in FIG. 14) formed in the vias. In this manner, conductive structures may or may not be formed in vias 254. The test structure also includes a conductive layer (not shown in FIG. 14) formed between test structure 252 and a wafer (not shown in FIG. 14). The conductive layer and the wafer may be further configured as described above and illustrated in the figures. As shown in FIG. 14, the vias may be arranged in a two-dimensional array or grid pattern within the test structure.

The vias, and the conductive structures if formed in the vias, may have any suitable characteristics such as dimensions and pitch. A suitable diameter for the vias may be about 1 nm to about 1 μm. A suitable spacing, d shown in FIG. 14, between the vias may be about 1 nm to about 10 μm. A total length of the test structure shown in FIG. 14 may be about 1 nm to about 100 μm. In some embodiments, the characteristics of the vias, and the conductive structures if included in the test structure, may be substantially the same as characteristics of corresponding device structures (not shown) formed on the wafer. The test pad shown in FIG. 14 may be further configured as described herein. For example, the test pad may be formed in a scribe line of a patterned wafer.

One or more out-of-plane electrical properties of the test structures shown in FIGS. 13 and 14 such as EOT, dielectric constant, capacitance, and leakage may be measured as described further herein using a non-contact measurement technique or a contact measurement technique. In addition, one or more in-plane electrical properties of the test structures shown in FIGS. 13 and 14 may be measured using a non-contact measurement technique. For example, a charge may be deposited on the surface of the test structure. After the charge deposition, an effective capacitance of the test structure in the area of the test structure defined by the probe area may be measured. If the dielectric surface area is measured (e.g., measured by a system described herein, measured using another measurement technique, or estimated), the effective value of the in-plane (line-to-line or via-to-via) dielectric constant, k, ("effective line-to-line k" or "line-to-line $K_{eff}$") can be measured.

The effective value of k may be a relatively strong function of the impact that the processes used to form the test structure (e.g., etch and patterning) have on the test structure characteristics. For example, as the pitch and spacing of the test structures shown in FIGS. 13 and 14 decrease, the effect of the processes on the effective dielectric constant increases, which can be determined from the in-plane k value correlation. In addition, an etch process used to form side walls on the insulating structures and/or an etch process performed after formation of the side walls may damage the side walls. In this manner, the damage to the side walls may affect the effective value of the in-plane dielectric constant and leakage. As such, the extent of the damage to the side walls may be evaluated using the in-plane k value and leakage measurements. Such measurements may be performed before conductive structures 250 are formed. In one such example, by varying the pitch of the test structures and measuring film thickness, line width (i.e., the line width of insulating structures 248 plus the width of the side walls), and spacing (e.g., the trench width) of the test structures, a change in the line-to-line k value and leakage measurements due to plasma process effects on the side walls can be measured and determined.

The measured $EOT_M$ and leakage ($Jg_M$) of the etched test structure can be expressed using the following equations:

$$EOT_M = \frac{L-2x}{L+W}E_L + \frac{2x}{L+W}E_p + \frac{W}{L+W}E_s \quad (1)$$

$$EOT_M = \frac{L-2x}{L+W}E_L + \frac{2x}{L+W}E_p \text{ since } E_s \ll E_p \text{ and } E_L \quad (2)$$

$$Jg_M = \frac{L-2x}{L+W}Jg_L + \frac{2x}{L+W}Jg_p + \frac{W}{L+W}Jg_s \quad (3)$$

where L is the line width of insulating structures 248 plus the width of the side walls, W is the trench width, $E_L$ is the EOT of the stack of materials including the etch stop layer, the insulating structures, and the ARC layer, $E_p$ is the EOT of the stack of materials including the etch stop layer, the side walls, and the ARC layer, $E_s$ is the EOT of the etch stop layer, x is the width of the side walls, $Jg_L$ is the leakage of the stack of materials including the etch stop layer, the insulating structures, and the ARC layer, $Jg_p$ is the leakage of the stack of materials including the etch stop layer, the side walls, and the ARC layer, and $Jg_s$ is the leakage of the etch stop layer.

To measure the line-to-line effective k value, additional measurements of the test structure such as optical thickness and the ratio of the solid/etched area of the test structure may also be performed. For example, measuring the optical thickness of the test structure may be performed using a tool such as one of the SpectraFx series of tools, which are commercially available from KLA-Tencor, and L and W of the test structure may be measured using an optical critical dimension (OCD) measurement tool. The plasma damage factor (G) can then be determined from the following equation:

$$G = 2x(E_L - E_p) = LE_L - (L+W)EOT_M \quad (4)$$

To determine the side wall damage layer thickness, multiple test pads having different insulating structure line widths and the same trench widths, such as those described further above, may be formed on a wafer and measured. Based on Equation 2, when L decreases, until L is less than or equal to 2x, $EOT_M$ is at a minimum, as shown in the following equation:

$$EOT_M = \frac{L}{L+W}E_p \to E_p = \frac{L+W}{L}EOT_M \quad (5)$$

A plot of $(L+W)/L*EOT_M$ versus $1/(L+W)$ may then be generated, and from the curve in the plot, the value of $E_p$ may be found at the minimum $(L+W)/L*EOT_M$. $E_p$ and the optical thickness, $T_{op}$, can then be used to determine $K_p$ according to the following equation:

$$K_p = 3.9 * T_{op}/E_p \quad (6)$$

In addition, using Equation 4, the side wall damage layer thickness, x, can be determined using the following equation:

$$x = \frac{LE_L}{2(L+W)(E_L - E_p)} - \frac{EOT_M}{2(E_L - E_p)} \quad (7)$$

In another embodiment, the test structure shown in FIG. 13 may be configured for M1–M(n–1) intra layer line-to-line k and leakage measurements after CMP. In this manner, the test structure may be used for applications such as line-to-line k monitoring. In one such embodiment, conductive layer 246 may be replaced with an insulating layer (not shown) such as a low k dielectric layer. In addition, conductive structures 250 may be formed of a material such as copper. In one embodiment, a width of insulating structures 248 may be about 0.1 µm. In another embodiment, a SiC layer (not shown in FIG. 13) may be formed on the insulating layer below insulating structures 248 and conductive structures 250.

In some embodiments, the test structure is configured such that the insulating structures are configured as a serpentine structure (when viewed from the top of the test structure). In one such embodiment, the serpentine structure electrically isolates two different sets of conductive structures (not shown). The dimension of the serpentine structure in a direction substantially parallel to the length of the conductive structures may be about 100 µm. The dimension of the serpentine structure in a direction substantially perpendicular to the length of the conductive structures may be about 50 µm. In some embodiments, each of the different sets of conductive structures is coupled to a test area (not shown in FIG. 13). Each of the test areas may be formed of copper and may have an area of about 15 µm×about 50 µm. For example, each of the test areas may have an area of about 15 µm×about 15 µm. In addition, the test areas may have different areas. For example, one of the test areas may have an area of about 30 µm×about 50 µm, and the other test area may have an area of about 50 µm×about 50 µm. In addition, an overall dimension of the test structure from the outer lateral edge of one of the test areas to the outer lateral edge of the other test area may be about 140 µm.

In one such embodiment, measuring the line-to-line k of the test structure may include depositing a charge ($Q_1$) on one of the test areas. A voltage of this test area is measured after the charge deposition. A different charge ($Q_2$) may then be deposited on the test area. In addition, the voltage of the test area is measured after the charge deposition. The capacitance of the serpentine structure is approximately equal to dV/dQ. The line-to-line k value can be determined from this capacitance. In addition, a leakage measurement, which may be performed as described herein, may be performed on the test structure to detect any dielectric film leakage due to a plasma etch process performed on the wafer.

In another embodiment, the test pad includes an additional test structure (not shown) configured such that one or more electrical properties of the additional test structure can be measured. The test structure and the additional test structure include insulating structures configured as serpentine structures. The serpentine structures electrically isolate two different sets of conductive structures, and at least one characteristic of the serpentine structures or the two different sets of conductive structures of the test structure and the additional test structure is different. In this manner, two of the test structures described above may be formed on the wafer. One of the test structures may be formed such that the sets of conductive structures are not in contact with the SiC layer. For example, the sets of conductive structures may be formed in trenches that do not extend through the entire thickness of insulating layer 248 described above. In such an embodiment, the other test structure may be formed such that the sets of conductive structures are formed on the SiC layer, which is formed on the insulating layer used in place of conductive layer 246. In one such embodiment, the leakage of both test structures may be measured. If both of the test structures have substantially the same leakage, then the leakage is determined as being caused by the low k film (e.g., the insulating layer used in place of conductive layer 246) formed under the sets of conductive structures. However, if the test structure that includes the set of conductive structures formed on the SiC layer is more leaky than the other test structure, then the leakage can be determined to be caused by the SiC layer or the interface between the SiC layer and the insulating layer (e.g., the insulating layer used in place of conductive layer 246).

In an additional embodiment, two of the test structures may be formed on the wafer (e.g., in the same or different test pad). One of the test structures may be formed such that the sets of conductive structures are not in contact with the SiC layer. In such an embodiment, the other test structure may be formed such that the sets of conductive structures are formed through the SiC layer and contact an upper surface of an insulating layer such as a low k dielectric, which may replace conductive layer 246. In one such embodiment, the leakage of both test structures may be measured as described herein. If both of the test structures have substantially the same leakage, then the leakage is determined as being caused by the top low k film formed under the sets of conductive structures and on top of the SiC layer. However, if the test structure that includes the set of conductive structures formed through the SiC layer is more leaky than the other test structure, then the leakage can be determined to be caused by the SiC layer.

Figure 15:
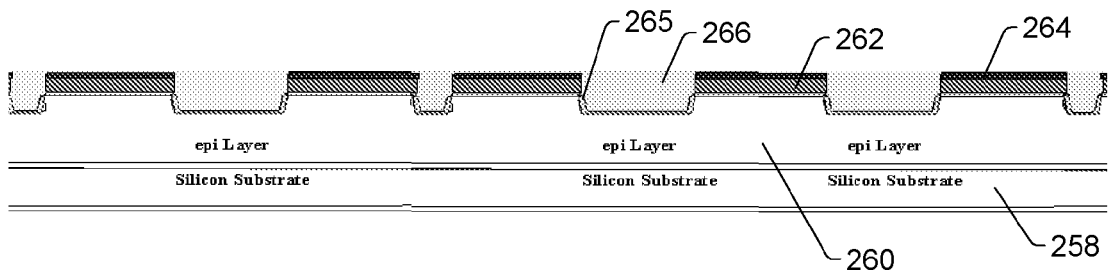
FIGS. 15-18 and 18*a* are schematic diagrams illustrating a cross-sectional view of different embodiments of a test pad that can be formed on a wafer.

Another embodiment relates to a test pad formed on a wafer that includes an array of shallow trench isolation (STI) structures formed on the wafer. One or more electrical properties of the STI structures can be measured for monitoring quality of the STI structures. FIG. 15 illustrates one embodiment of an array of STI structures that can be used for monitoring STI quality. In one embodiment, the array of STI structures is formed in a scribe line on wafer 258. In another embodiment, the test pad has an area of about 75 µm×about 75 µm.

For example, as shown in FIG. 15, Epi layer 260 is formed on wafer 258. Wafer 258 may be a Si substrate. Dielectric layer 262 may be formed on Epi layer 260, and dielectric layer 264 may be formed on dielectric layer 262. Trenches may be formed through dielectric layers 264 and 262 and into Epi layer 260. Insulating material 265 may be formed in the trenches using a process such as a thermal growth process. Insulating material 266 may be formed within the trenches to form the STI structures. Epi layer 260, dielectric layers 262 and 264, and the STI structures may be formed using any appropriate processes known in the art. In addition, the Epi layer, dielectric layers, and STI structures may be formed of any suitable materials known in the art.

In some embodiments, one or more characteristics such as size and composition of the STI structures shown in FIG. 15 are substantially the same as one or more characteristics of STI structures of device structures (not shown in FIG. 15) that are also formed on wafer 258. For example, STI structures of the test pad and device structures may be formed in the same processes. Measurements of the STI structures shown in FIG. 15 may be performed as described herein. In addition, the one or more electrical properties of the STI structures that can be measured include, but are not limited to, effective capacitance and a $V_s$ map (e.g., a $V_s$ map within the test pad). The test structure of FIG. 15 may be used in applications such as STI etch defect inspection, STI dielectric growth process control, STI dielectric etch and CMP processes monitor and control, and N well and P well ion implantation damage monitoring.

Figure 16:
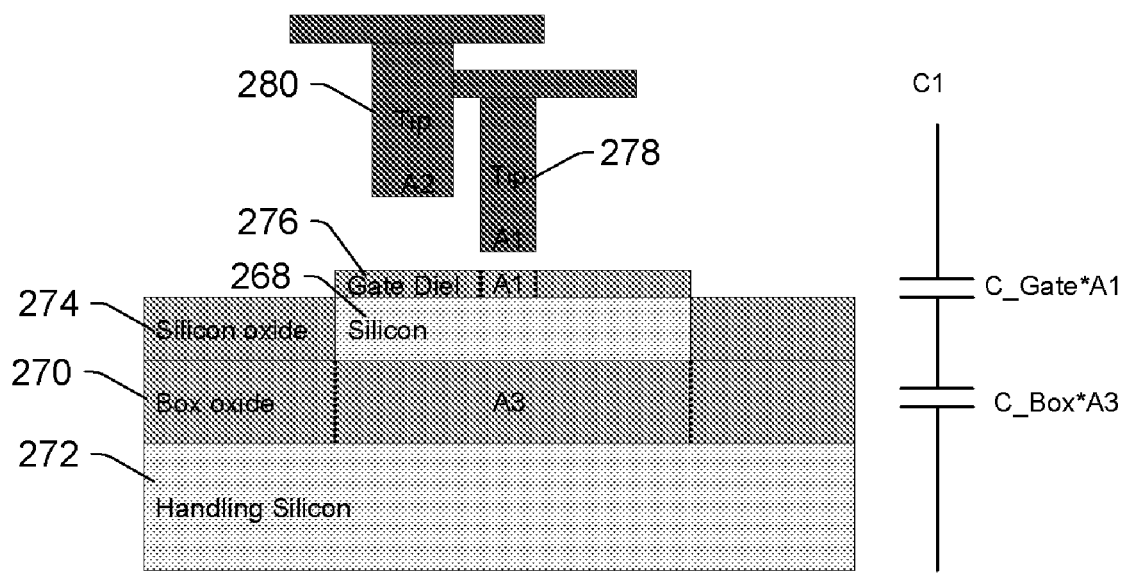
Figure 17:
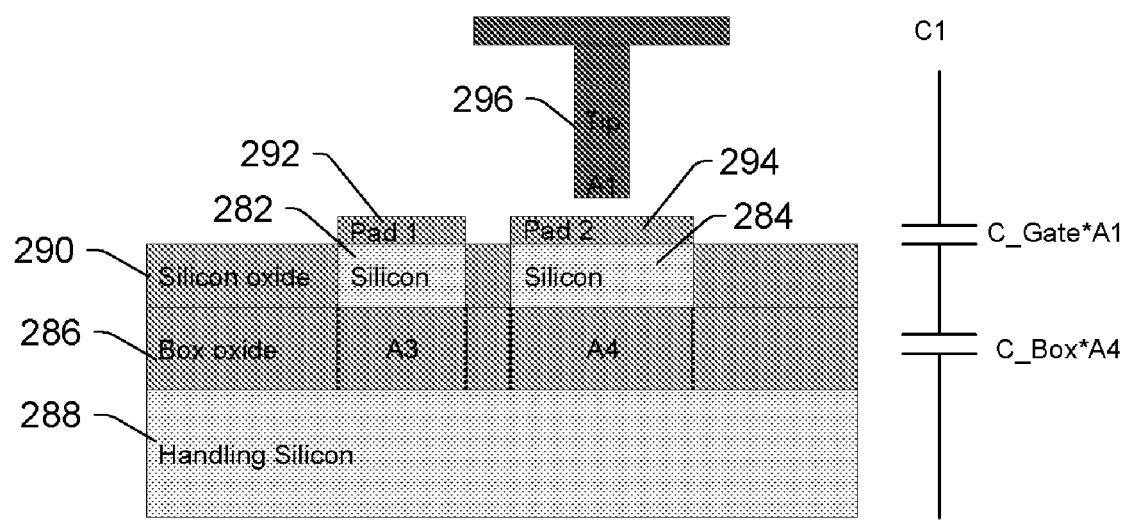
Figure 18:
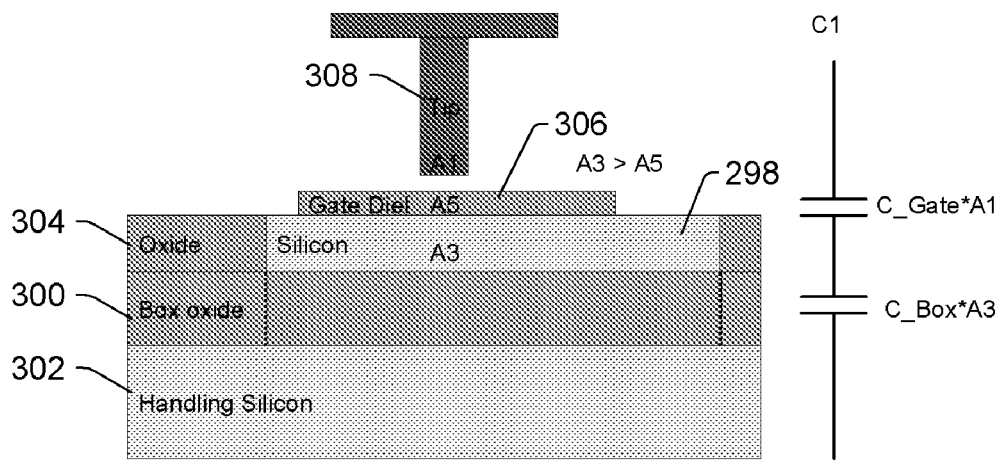

FIGS. 16-18 illustrate additional embodiments of a test pad that can be formed on a wafer. The test pad embodiments may be used for capacitance measurements of Si-on-oxide (SOI) type wafers. The test pad includes a box oxide layer formed on the wafer. For example, as shown in FIG. 16, the test pad includes box oxide layer 270 formed on wafer 272, which may be a Si substrate. The box oxide layer may include any suitable oxide layer known in the art. The test pad also includes one or more Si structures formed on the box oxide layer. For example, as shown in FIG. 16, the test pad includes Si structure 268 formed on box oxide layer 270. Si structure 268 is formed within silicon oxide layer 274, which is also formed on box oxide layer 270. In addition, the test pad includes one or more gate dielectric structures formed on the one or more Si structures. For example, as shown in FIG. 16, gate dielectric structure 276 is formed on Si structure 268. In one embodiment, as shown in FIG. 16, the one or more gate dielectric structures and the one or more Si structures have substantially the same area. The test pad shown in FIG. 16 may be formed using any suitable processes and materials known in the art. The test pad may be further configured as described above. In one embodiment, the test pad is formed in a scribe line of the wafer. In addition, more than one test pad configured as shown in FIG. 16 may be formed on the wafer (e.g., in the scribe line of the wafer).

One or more electrical properties of the box oxide layer and the one or more gate dielectric structures can be measured. In one embodiment, the one or more electrical properties include capacitance of the box oxide layer and capacitance of the one or more gate dielectric structures. Gate capacitance may be measured by performing two measurements on a single test pad such as that shown in FIG. 16. In one embodiment, the one or more electrical properties can be measured using a non-contact measurement technique.

One method for determining one or more electrical properties of a test pad formed on a wafer such as that shown in FIG. 16 includes depositing a first corona charge on a first corona deposition spot (not shown) on a gate dielectric structure of the test pad. As described above, the gate dielectric structure is formed on a Si structure, which is formed on a box oxide layer formed on the wafer. The test pad may be further configured as described herein. For example, in one embodiment as shown in FIG. 16, the gate dielectric structure and the Si structure have substantially the same area.

One example of such a charge deposition is shown in FIG. 16. In this example, a corona charge is deposited on the test pad using a relatively small corona deposition source 278 that produces a relatively small corona deposition spot (not shown) having area $A_1$ on gate dielectric structure 276. Corona source 278 may be configured as described herein. The method also includes measuring a first voltage of the test pad after depositing the first corona charge. For example, after the charge deposition, a voltage measurement is performed on this test pad using a voltage measurement probe (not shown in FIG. 16) that can be a non-contact voltage probe or a contact electrode. The voltage measurement probe may be configured as described herein.

The method further includes depositing a second corona charge in a second corona deposition spot (not shown) on the gate dielectric structure. The second corona deposition spot has an area that is different than an area of the first corona deposition spot. In one embodiment, the area of the second corona deposition spot is larger than the area of the first corona deposition spot. One example of such a charge deposition is also shown in FIG. 16. For example, after the first voltage measurement, a second corona charge is deposited on the same test pad using relatively large corona deposition source 280 that produces a relatively large corona deposition spot having area $A_2$ on gate dielectric structure 276. Corona deposition source 280 may be configured as described herein. In addition, the method includes measuring a second voltage of the test pad after depositing the second corona charge. The same voltage measurement probe or different voltage measurement probes may be used to measure the first and second voltages. The voltage measurement probe used to measure the second voltage may be configured as described herein. In one embodiment, the first and second voltages are measured using a non-contact measurement technique. In another embodiment, the first and second voltages are measured using a contact measurement technique.

In one embodiment, depositing the first corona charge is performed using a first corona gun (e.g., corona deposition source 278), and depositing the second corona charge is performed using a second corona gun (e.g., corona deposition source 280). In an alternative embodiment, depositing the first and second corona charges are performed using a single corona gun (not shown in FIG. 16) and different voltage settings of one or more electrodes of the single corona gun. Such a single corona gun may be configured as described herein. In this manner, the difference in the areas $A_1$ and $A_2$ of the first and second corona deposition spots can be achieved either using two corona guns or using a single corona gun with different voltage settings of one or more electrodes of the gun.

The method also includes determining one or more electrical properties of one or more structures of the test pad using the first voltage and the second voltage. In one embodiment, the one or more electrical properties include capacitance of the gate dielectric structure and capacitance of the box oxide layer. For example, the capacitance of the gate dielectric structure, $C_{gate}$, and the capacitance of the box oxide layer, $C_{box}$, can be determined from the results of the capacitance measurements, $C_1$, performed with the relatively small corona deposition spot and the capacitance measurements, $C_2$, performed with the relatively large corona deposition spot using the following equations:

$$1/(C_1 * A_1) = 1/(C_{gate} * A_1) + 1/(C_{box} * A_3) \quad (8)$$

$$1/(C_2 * A_2) = 1/(C_{gate} * A_2) + 1/(C_{box} * A_3) \quad (9)$$

or $$C_{gate} = [(h-1)/(h*C_2 - C_1)] * C_1 * C_2 \quad (10)$$

$$C_{box} = (A_1/A_3)/(1/C_1 - 1/C_{gate}) \quad (11)$$

where $C_1$ (F/cm$^2$) is the unit capacitance measured using the relatively small corona deposition spot, $A_1$ (cm$^2$) is the area of the relatively small corona deposition spot, $C_2$ (F/cm$^2$) is the unit capacitance measured using the relatively large corona deposition spot, $A_2$ (cm$^2$) is the area of the relatively large corona deposition spot, $h=A_2/A_1$, $T_{gate}$ (cm) is the physical thickness of the gate dielectric structure, $T_{box}$ (cm) is the physical thickness of the box oxide layer, $C_{gate}$ (F/cm$^2$) is the unit capacitance of the gate dielectric structure, $C_{box}$ (F/cm$^2$) is the unit capacitance of the box oxide layer, and $A_3$ (cm$^2$) is the area of Si structure 268 electrically connected to the bottom of the gate dielectric structure.

One advantage of the above described method over measurements that are typically performed after a single corona deposition is that the error due to the variation of the box oxide layer thickness is eliminated in Equation 10. More complex mathematical calculations involving correction for the edge effect of the Si structure under the gate dielectric structure can also be employed to calculate $C_{gate}$. In another embodiment, the one or more electrical properties can be measured using a contact measurement technique. Each of the steps of the method described above may be further performed as described herein. In addition, each of the embodiments of the method described above may be performed by any of the system embodiments described herein. Each of the embodiments of the method described above may include any other step(s) of any other method(s) described herein.

As described above, measurements may be performed twice on a single test pad after different corona charge depositions. Alternatively, the measurements may be performed one or more times on different test pads (e.g., two neighboring test pads, one measurement per test pad). For example, one embodiment of a method for determining one or more electrical properties of one or more structures formed on a wafer includes depositing a first corona charge on a first of two test pads formed on the wafer in a first corona deposition spot. Each of the two test pads may be configured as shown in FIG. 16. For example, each of the two test pads includes a gate dielectric structure formed on a Si structure. The gate dielectric structures and the Si structures of the two test pads have substantially the same area. The Si structures of the two test pads are formed on a box oxide layer formed on the wafer. The method also includes measuring a first voltage of the first of the two test pads after depositing the first corona charge. Depositing the first corona charge and measuring the first voltage may be performed as described above.

The method further includes depositing a second corona charge on a second of the two test pads in a second corona deposition spot. The second corona deposition spot has an area that is different than an area of the first corona deposition spot. In one embodiment, the area of the second corona deposition spot is larger than the area of the first deposition spot. In some embodiments, depositing the first corona charge is performed using a first corona gun, and depositing the second corona charge is performed using a second corona gun. In a different embodiment, depositing the first and second corona charges are performed using a single corona gun and different voltage settings of one or more electrodes of the single corona gun. In addition, the method includes measuring a second voltage of the second of the two test pads after depositing the second corona charge. Depositing the second corona charge and measuring the second voltage may be further performed as described above. In some embodiments, the first and second voltages are measured using a non-contact measurement technique. In other embodiments, the first and second voltages are measured using a contact measurement technique.

Furthermore, the method includes determining one or more electrical properties of one or more structures of the two test pads using the first voltage and the second voltage. In some embodiments, the one or more electrical properties include capacitance of the gate dielectric structures and capacitance of the box oxide layer. Each of the steps of the above described method may be performed as described further herein. Each of the embodiments of the method described above may be performed by any of the system embodiments described herein. In addition, each of the embodiments of the method described above may include any other step(s) of any other method(s) described herein.

In another embodiment, the one or more Si structures have different areas. For example, as shown in FIG. 17, the test pad includes Si structures 282 and 284, which have different sizes (e.g., different areas, but the same thickness). Si structures 282 and 284 are formed on box oxide layer 286. Box oxide layer 286 is formed on wafer 288, which may be a Si substrate. Si structures 282 and 284 are formed within silicon oxide layer 290, which is also formed on box oxide layer 286. Gate dielectric structures 292 and 294 are formed on Si structures 282 and 284, respectively. In one embodiment, as shown in FIG. 17, each of the one or more gate dielectric structures has substantially the same area as the one or more Si structures on which each of the one or more gate dielectric structures is formed. In one embodiment, therefore, the one or more Si structures have different areas, and each of the one or more gate dielectric structures has substantially the same area as the one or more Si structures on which each of the one or more gate dielectric structures is formed. The test pad shown in FIG. 17 may be formed using any suitable processes and materials known in the art. The test pad may be further configured as described above. For instance, the test pad may be formed in a scribe line of the wafer. In addition, more than one test pad configured as shown in FIG. 17 may be formed on the wafer (e.g., in the scribe line of the wafer).

Another embodiment relates to a method for determining one or more electrical properties of two test structures of a test pad formed on a wafer. The method includes depositing a first corona charge on a first of the two test structures. The two test structures may be configured as described above and shown in FIG. 17. For example, each of the two test structures includes a gate dielectric structure formed on a Si structure. The gate dielectric structures of the two test structures have different areas, and the Si structures of the two test structures have different areas. The Si structures of the two test structures are formed on a box oxide layer formed on the wafer. In one embodiment, as shown in FIG. 17, the gate dielectric structure and the Si structure of the first of the two test structures have substantially the same area, and the gate dielectric structure and the Si structure of the second of the two test structures have the substantially the same area. The test pad may be further configured as described herein. For example, in one embodiment, the test pad is formed in a scribe line of the wafer. The method also includes measuring a first voltage of the first of the two test structures after depositing the first corona charge. Depositing the first corona charge and measuring the first voltage may be performed as described herein.

The method further includes depositing a second corona charge on a second of the two test structures. In one embodiment, depositing the first and second corona charges are performed using a single corona gun. For example, single corona gun 296 may be used to deposit charges on two test structures such as two neighboring test structures (e.g., gate dielectric structures 292 and 294) having different sizes in a test pad, as shown in FIG. 17. Single corona gun 296 may be configured as described herein. In addition, the method includes measuring a second voltage of the second of the two test structures after depositing the second corona charge. Depositing the second corona charge and measuring the second voltage may be further performed as described herein. In addition, one or more characteristics of the first and second corona charges such as total charge deposition, area of the charge deposition spots, charge deposition rate, polarity, etc., or some combination thereof may be substantially the same. In one embodiment, the first and second voltages are measured using a non-contact measurement technique. In a different embodiment, the first and second voltages are measured using a contact measurement technique.

The method also includes determining one or more electrical properties of the two test structures using the first voltage and the second voltage. In one embodiment, the one or more electrical properties include capacitance of the gate dielectric structures and capacitance of the box oxide layer. For example, the capacitance of the gate dielectric structures and the box oxide layer can be determined using the following equations:

$$1/(C_1 * A_1) = 1/(C_{gate} * A_1) + 1/(C_{box} * A_3) \quad (12)$$

$$1/(C_2 * A_1) = 1/(C_{gate} * A_1) + 1/(C_{box} * A_4) \quad (13)$$

or $$C_{gate} = (g-1)/(g/C_2 - 1/C_1) \quad (14)$$

$$C_{box} = 1/[(A_3/A_1) * (1/C_1 - 1/C_{gate})] \quad (15)$$

where $C_1$ (F/cm²) is the unit capacitance measured on gate dielectric structure 292, $C_2$ (F/cm²) is the unit capacitance measured on gate dielectric structure 294, $A_1$ (cm²) is the area of the corona deposition spot in which the first and second corona charges are deposited, $C_{gate}$ (F/cm²) is the unit capacitance determined for the gate dielectric structures, $C_{box}$ (F/cm²) is the unit capacitance of the box oxide layer, $A_3$ (cm²) is the area of Si structure 282 electrically connected to the bottom of gate dielectric structure 292, $A_4$ (cm²) is the area of Si structure 284 electrically connected to the bottom of gate dielectric structure 294, and $g = A_4/A_3$. Each of the steps of the method embodiments described above may be further performed as described herein. In addition, each of the embodiments of the method described above may be performed by any of the system embodiments described herein. Furthermore, each of the embodiments of the method described above may include any other step(s) of any other method(s) described herein.

In another embodiment, at least one of the one or more gate dielectric structures has an area that is different than an area of the one or more Si structures on which the at least one of the one or more gate dielectric structures is formed. In an additional embodiment, at least one of the one or more gate dielectric structures has an area that is less than an area of the one or more Si structures on which the at least one of the one or more gate dielectric structures is formed. As such, a test structure in which the area of Si electrically connected to the test structure is greater than the area of the test structure itself may be employed in the embodiments described herein. For example, as shown in FIG. 18, one embodiment of such a test pad includes Si structure 298 formed on box oxide layer 300. Box oxide layer 300 is formed on wafer 302, which may be a Si substrate. Si structure 298 is formed in oxide layer 304, which is also formed on box oxide layer 300. In addition, gate dielectric structure 306 is formed on Si structure 298. Gate dielectric structure 306 has an area that is less than an area of Si structure 298.

In one such embodiment, the at least one of the one or more gate dielectric structures is located entirely within the area of the one or more Si structures on which the at least one of the one or more gate dielectric structures is formed. For example, as shown in FIG. 18, gate dielectric structure 306 is located entirely within the area of Si structure 298. The test pad shown in FIG. 18 may be formed using any suitable processes and materials known in the art. The test pad may be further configured as described above. For instance, the test pad may be formed in a scribe line of the wafer. In addition, more than one test pad configured as shown in FIG. 18 may be formed on the wafer (e.g., in the scribe line of the wafer).

An additional embodiment relates to a method for determining one or more electrical properties of a test pad formed on a wafer. The method includes depositing a corona charge on the test pad. Deposition of the corona charge can be performed using a single corona gun (e.g., gun 308 shown in FIG. 18). The single corona gun may be configured as described herein. Depositing the corona charge may be further performed as described herein. The test pad may be formed as described above and shown in FIG. 18. For example, the test pad includes a gate dielectric structure formed on a Si structure. The gate dielectric structure has an area that is less than an area of the Si structure. In one embodiment, the gate dielectric structure is located entirely within the area of the Si structure. The Si structure is formed on a box oxide layer formed on the wafer. The test pad may be further configured as described herein. For example, in one embodiment, the test pad is formed in a scribe line of the wafer.

The method also includes measuring a voltage of the test pad after depositing the corona charge. Measuring the voltage may be performed as described herein. In one embodiment, the voltage is measured using a non-contact measurement technique. In a different embodiment, the voltage is measured using a contact measurement technique.

The method further includes determining one or more electrical properties of one or more structures of the test pad using the voltage. In one embodiment, the one or more electrical properties include capacitance of the gate dielectric structure and capacitance of the box oxide layer. For example, as $C_{box} * A_3$ increases, the impact of $C_{box}$ variation on the $C_{gate}$ result decreases. When $C_1/(f * C_{box}) < 0.9$, the contribution of the box oxide layer can be treated as fixed via a calibration constant. In this manner, the capacitance of the gate dielectric structure and the box oxide layer can be determined from the following equations:

$$1/(C_1 * A_1) = 1/(C_{gate} * A_1) + 1/(C_{box} * A_3) \quad (16)$$

$$C_{gate} = 1/(1/C_1 - \text{calibration constant}) \quad (17)$$

where $C_1$ (F/cm²) is the unit capacitance measured, $A_1$ (cm²) is the area of the corona deposition spot in which the corona charge is deposited, $C_{gate}$ (F/cm²) is the unit capacitance of the gate dielectric structure, $C_{box}$ (F/cm²) is the unit capacitance of the box oxide layer, $A_3$ (cm²) is the area of the Si structure connected to the bottom of the gate dielectric structure, $A_5$ is the area of the gate dielectric structure, and $f = A_3/A_1$. Equation 17 is valid only when $C_1/(f * C_{box})$ is less than 0.9. Each of the steps of the method embodiments described above may be further performed as described herein. In addition, each of the embodiments of the method described above may be performed by any of the system embodiments described herein. Furthermore, each of the embodiments of the method described above may include any other step(s) of any other method(s) described herein.

Another embodiment relates to a test pad formed on a wafer that includes an oxide layer formed on the wafer and a Si structure formed on the oxide layer. One or more electrical properties of the oxide layer can be measured to monitor quality of the oxide layer. In one embodiment, the one or more electrical properties of the oxide layer can be measured to monitor quality of an interface between the oxide layer and the Si structure.

Figure 18A:
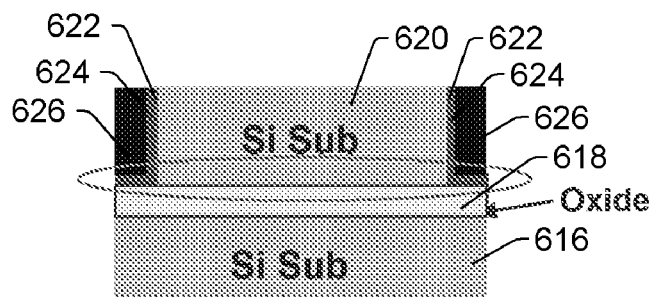

FIG. 18a illustrates one embodiment of such a test pad that can be used to monitor quality of the interface of Si/oxide for a wafer on which an SOI structure is formed. In particular, the test pad includes Si substrate 616. Oxide layer 618 is formed on Si substrate 616. Oxide layer 618 may have any suitable configuration known in the art. In addition, oxide layer 618 may be formed using any suitable process or processes known in the art. Si layer 620 is formed on oxide layer 618. Si layer 620 may have any suitable configuration known in the art. In addition, Si layer 620 may be formed using any suitable process or processes known in the art. Si layer 620 may have been etched to expose side surfaces 622 of Si layer 620 and a portion of the upper surface of oxide layer 618. Si layer 620 may be etched using any suitable process(es) known in the art. Dielectric layer 624 is formed on side surfaces 622 of Si layer 620 and the portion of the upper surface of oxide layer 618 exposed by the etch process. Dielectric layer 624 may have any suitable composition and dimensions and may be formed using any suitable process(es) known in the art. Dielectric layer 626 is formed on dielectric layer 624. Dielectric layer 626 may have any suitable composition and dimensions and may be formed using any suitable process(es) known in the art.

Figure 18B:
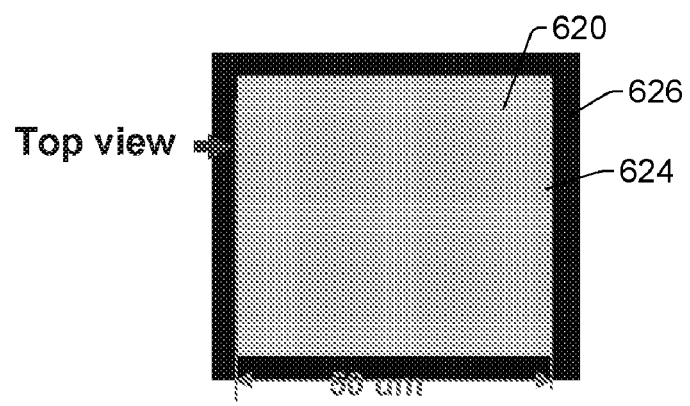
FIG. 18*b* is a schematic diagram illustrating a top view of the test pad of FIG. 18*a;*

FIG. 18*b* illustrates a top view of the upper surface of the test pad of FIG. 18*a*. In particular, as shown in FIG. 18*b*, the upper surface of the test pad includes upper surfaces of Si layer 620, dielectric layer 624, and dielectric layer 626. In one embodiment, the test pad is formed in an active area (AA) of the wafer. In another embodiment, the test pad shown in FIGS. 18*a* and 18*b* may have an area of about 50 μm by about 50 μm. In another embodiment, the one or more electrical properties of the oxide layer can be measured by measuring a $V_s$ map across an upper surface of the test pad. For example, the one or more electrical properties that are measured for the test pad shown in FIGS. 18*a* and 18*b* to monitor the oxide quality of the SOI wafer may include a $V_s$ map across the upper surface of the test pad. The test pad shown in FIGS. 18*a* and 18*b* may be further configured as described herein. In addition, the measurements that are performed on the test pad shown in FIGS. 18*a* and 18*b* may include any of the measurements described herein and may be performed as described herein. For example, in one embodiment, the one or more electrical properties can be measured using a non-contact measurement technique. In another embodiment, the one or more electrical properties can be measured using a contact measurement technique.

An additional embodiment relates to a method for assessing plasma damage of a wafer. The method includes measuring one or more electrical properties of a test structure formed on the wafer. The test structure may be configured as described above. For example, in one embodiment, the test structure includes trenches formed in an insulating structure. Such a test structure may be configured as described above and shown in FIG. 13. In one such embodiment, the one or more electrical properties include an in-plane electrical property of the insulating structure. The in-plane electrical property and any other electrical properties of such a structure may be measured as described herein. In another embodiment, the test structure includes vias formed in an insulating structure. Such a test structure may be configured as described above and shown in FIG. 14. In one such embodiment, the one or more electrical properties include an out-of-plane electrical property of the insulating structure. The out-of-plane electrical property and any other electrical properties of such a test structure may be measured as described herein. In an additional embodiment, the wafer may include a patterned wafer, and the test structure may be formed in a scribe line on the patterned wafer. In addition, the test structure may include an IMD structure. The IMD structure may be configured as described herein. Alternatively, the test structure may include a gate structure. The gate structure may be configured as described herein. The test structure may form part of the test pads described above. In another embodiment, one or more characteristics of the test structure are substantially the same as one or more characteristics of device structures formed on the wafer.

The method for assessing plasma damage of a wafer also includes determining an index characterizing the plasma damage of the test structure using the one or more electrical properties. The plasma damage is caused by a process performed on the wafer. Examples of such processes include, but are not limited to, etch such as gate polysilicon etch, metal etch, and dielectric etch, ash, scrub, CVD, and any other processes described above. The plasma damage may include surface charge non-uniformity, bulk film damage, and interface damage. In this manner, all of the different types of plasma damage may be considered together to assess the overall plasma damage to the test structure on the wafer. The plasma damage may also be measured to determine properties such as uniformity of plasma damage and etch loading. In addition, any electrical properties of a test structure that can be measured using a non-contact or contact measurement technique may be correlated to plasma damage.

In one particular example, different etch processes may have different effects on the properties of the test structure that can be measured by the Quantox systems due to the different amounts of plasma damage caused by each of the processes. Accordingly, the properties that are measured are indicative of the plasma damage caused by a particular etch process. In addition, the properties that can be measured may be used to evaluate different parameters of a single etch process based on how much plasma damage the different parameters cause to a test structure. As such, the properties that can be measured may be used to evaluate the suitability of different etch processes (and perhaps different etch processes performed by different etch tools) to determine which etch process should be performed for a particular wafer configuration.

The amount of plasma damage caused to a wafer by a process can be expressed in terms of the electrical properties using a function such as a summation of the electrical properties, each of which is multiplied by an appropriate factor. The appropriate factors may be determined experimentally or empirically. In addition, the electrical properties included in the summation may be manipulated in any other way prior to being summed. For instance, the values that are summed may include an integral of each of the electrical properties, a square root of each of the electrical properties, an exponential function of each of the electrical properties, etc. Any other appropriate function may be used to determine the index characterizing the plasma damage of the test structure. In some embodiments, the index may be a weighted index. For example, the electrical properties of the test structure that are more sensitive to (or more affected by) plasma damage may be assigned a greater weight than that assigned to electrical properties of the test structure that are less sensitive to the plasma damage. The sensitivity of different electrical properties to plasma damage may be determined experimentally and/or empirically using any suitable method(s) and/or system(s) known in the art. In addition, the electrical properties of the test structure that are used to determine the index may include any measurable electrical properties of the test structure that may be at least somewhat affected by plasma damage.

In another embodiment, the method includes measuring one or more additional properties of the test structure using one or more optical techniques and determining an in-plane electrical property of the test structure using the one or more electrical properties and the one or more additional properties. For example, as described further above with respect to FIG. 13, to measure the line-to-line effective k value, additional measurements of the test structure such as optical thickness and the ratio of the solid/etched area of the test structure may also be performed. As described above, the optical thickness of the test structure may be performed using a tool such as one of the SpectraFx tools, and L and W of the test structure may be measured using an OCD measurement tool. The in-plane electrical property may be determined from the one or more electrical properties and the one or more additional properties using the equations set forth above. In a further embodiment, the method includes measuring one or more additional properties of the test structure using one or more optical techniques, and determining the index characterizing the plasma damage includes determining the index using the one or more electrical properties and the one or more additional properties. The plasma damage factor (G) can be determined in this manner using Equation 4 set forth above.

Figure 19:
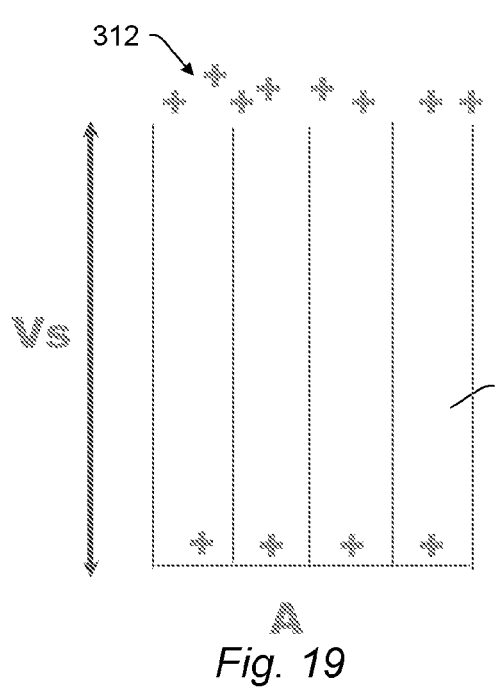
FIGS. 19-20 are schematic diagrams illustrating a cross-sectional view of charge distribution in different test structures.
Figure 20:
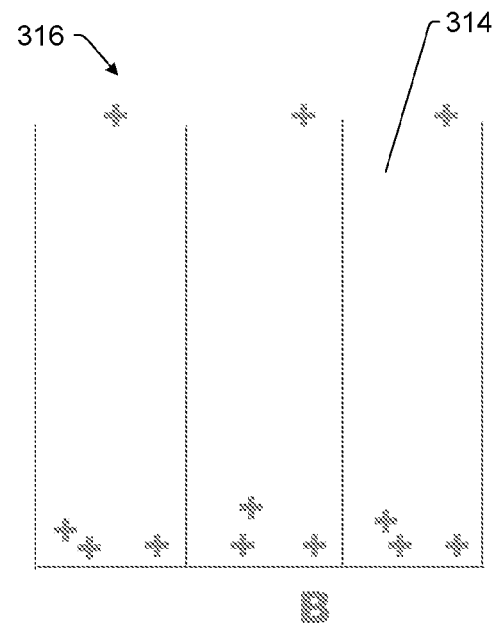

Embodiments of a suitable test structure for assessing plasma damage of a wafer are illustrated in FIGS. 19 and 20. As shown in FIG. 19, one test structure includes via 310. Deposition of charge 312 on the upper surface of via 310 results in the charge distribution shown in FIG. 19. $V_s$ can be measured after charge 312 is deposited on the upper surface of the via. Deposition of the charge and measurement of $V_s$ may be performed as described herein and using the systems described further herein.

As shown in FIG. 20, another test structure includes via 314 that has the same general geometry or shape as via 310. However, via 314 has a greater lateral dimension or width than via 310. Therefore, upon deposition of charge 316 on the upper surface of via 314, the charge distribution in via 314 may be different than that in via 310, as shown in FIG. 20. In this manner, $V_s$ measured for via 314 after deposition of charge 316 on the upper surface of via 314 will be different than the $V_s$ measured for via 310. As such, different test structures having different sizes or other characteristics may have different voltage measurements due to differences in the charge distribution in the test structures, which may be caused by effects such as electrical shadowing.

Figure 21:
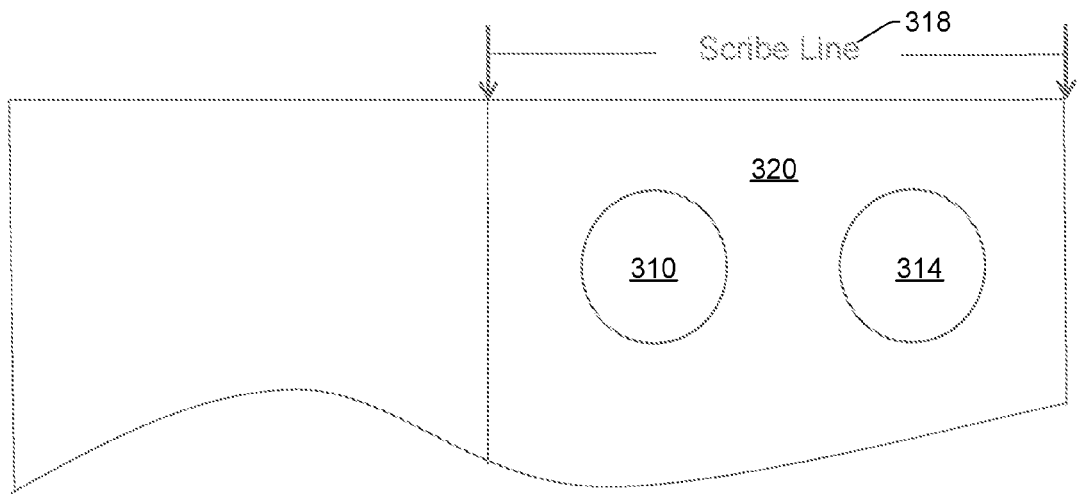
FIG. 21 is a schematic diagram illustrating a top view of one embodiment of a test pad that can be used to assess plasma damage of a wafer.

Accordingly, in a preferred embodiment, the test structures have substantially the same characteristics as device structures such that measurements of the one or more electrical properties of the test structures accurately reflect the properties of the device structures. Since device structures having different characteristics such as size and shape may be formed on a single wafer and sometimes in a single process, it may be advantageous to form multiple test structures on the wafer such that one or more electrical properties of the different device structures can be accurately assessed using the test structures. In one example, as shown in FIG. 21, via 310 and via 314 may both be included in scribe line area 318 of patterned wafer 320. Measurements of the one or more electrical properties of each of the test structures may be performed. In addition, more than two test structures may be formed in the scribe line of a patterned wafer. At least some of the different test structures may have one or more characteristics that are different such as size and shape. The characteristics of the test structures preferably vary depending on the characteristics of the device structures that are formed on the wafer.

In one embodiment, therefore, the wafer may include a patterned wafer, and the test pad may include different test structures formed in a scribe line on the wafer. In one such embodiment, the different structures have substantially the same characteristics as different device structures on the wafer such that the index determined as described further herein accurately reflects the plasma damage of the different device structures. In addition, the test structure may include any other test structure described herein. For example, in one embodiment, the test structure includes a portion of the wafer surrounded by one or more trenches, a pad oxide layer formed on an upper surface of the portion of the wafer, and a lining oxide formed on side surfaces of the portion of the wafer, side surfaces of the pad oxide layer, and an upper surface of the wafer in the one or more trenches. Such a test structure may be further configured as described herein. In another embodiment, the test structure includes one or more layers of wiring formed on the wafer above a gate structure, and the plasma damage includes damage to the gate structure caused by one or more processes used to form the one or more layers of wiring. Such a test structure may be further configured as described herein.

Measuring the one or more electrical properties of the test structures may be performed using a non-contact measurement technique. The non-contact measurement technique may be performed as described further herein. Alternatively, measuring the one or more electrical properties of the test structures may be performed using a contact measurement technique. The contact measurement technique may be performed as described above and may include any other contact measurement technique known in the art.

Another embodiment relates to a different method for assessing plasma damage of a wafer. The method includes measuring one or more electrical properties of a device structure formed on the wafer. The method also includes determining an index characterizing the plasma damage of the device structure using the one or more electrical properties. The plasma damage is caused by a process performed on the wafer.

Figure 22:
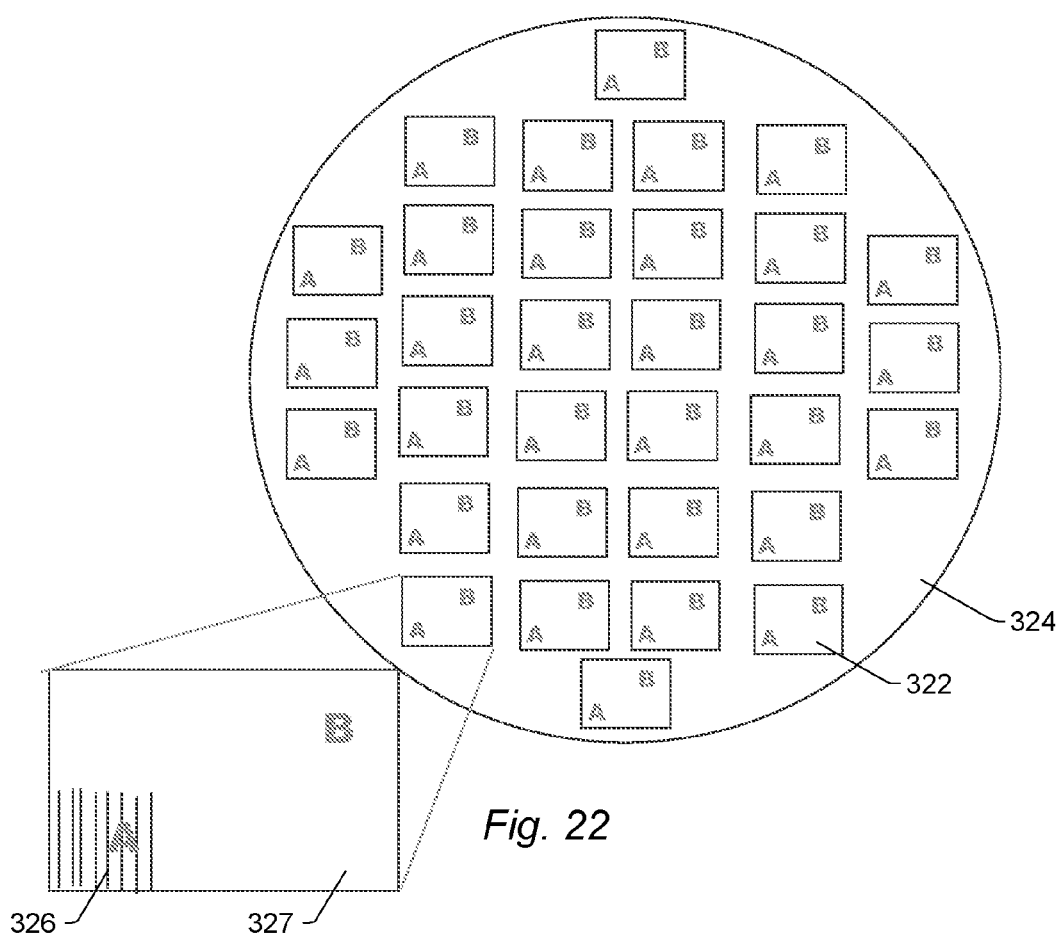
FIG. 22 is a schematic diagram illustrating a top view of one embodiment of an arrangement of in-die surface voltage measurements that may be performed for charge damage monitoring and yield improvement.

In this manner, instead of using a test structure as described above, the method may be performed using a device structure formed on a wafer. In some embodiments, the measurements include a surface charge profile within a die. In an additional embodiment, in-die $V_s$ measurements may be performed for charge damage and yield improvement. In another embodiment, the measurements include $V_s$ measurements at substantially the same within die location for each die on the wafer or two or more dies formed on the wafer. The different $V_s$ measurements may be compared across the wafer to provide a measure of uniformity across the wafer. For example, FIG. 22 illustrates one embodiment of an arrangement of locations at which in-die $V_s$ measurements may be performed for charge damage monitoring and yield improvement. As shown in FIG. 22, dies 322 are formed on wafer 324. Device structures (not shown in FIG. 22) are formed in dies 322.

In one embodiment, measuring the one or more electrical properties includes measuring $V_s$ at more than one location within a die formed on the wafer. In another embodiment, the plasma damage includes a surface charge profile within a die formed on the wafer. In addition, the surface charge profile may be measured within one or more of the dies on the wafer. For example, as shown in FIG. 22, $V_s$ measurements may be performed at locations A and B within one or more of the dies. In some embodiments, the more than one location are within different types of areas of the die. For example, locations A and B may be within different types of areas of the dies. In one such example, as shown in FIG. 22, location A may be within array of patterned features 326 formed within the dies, and location B may be within non-patterned portion 327 of the dies. Measurements may be performed at these locations with a system that may be configured as described herein and may have a resolution of about 5 μm. In this manner, multiple measurements may be performed within a die at different locations such that a surface charge profile can be measured within the die.

In an additional embodiment, measuring the one or more electrical properties includes measuring a $V_s$ at substantially the same within die location for more than one die on the wafer. In one such embodiment, the method includes comparing the $V_s$ at substantially the same within die location for more than one die on the wafer to determine surface voltage uniformity across the wafer. In a further embodiment, the plasma damage includes surface charge uniformity across the wafer. In this manner, the different $V_s$ measurements may be compared and used to determine within wafer uniformity of the $V_s$ measurements and thereby the within wafer uniformity of the charge damage. The measurement layout shown in FIG. 22 may be used in applications such as, but not limited to, monitoring plasma processes such as etch, ash, and scrub to measure characteristics of the processes such as uniformity and etch loading.

Each of the steps of the method embodiments described above may be further performed as described herein. In addition, each of the embodiments of the method described above may be performed by any of the system embodiments described herein. Furthermore, each of the embodiments of the method described above may include any other step(s) of any other method(s) described herein.

Another embodiment of a test pad formed on a wafer includes one or more layers of wiring formed on the wafer above a gate structure. The test pad also includes one or more test structures electrically coupled to the gate structure. One or more electrical properties of the gate structure can be measured by performing measurements on the one or more test structures. Damage to the gate structure caused by one or more processes used to form the one or more layers of wiring can be determined using the one or more electrical properties.

Figure 23:
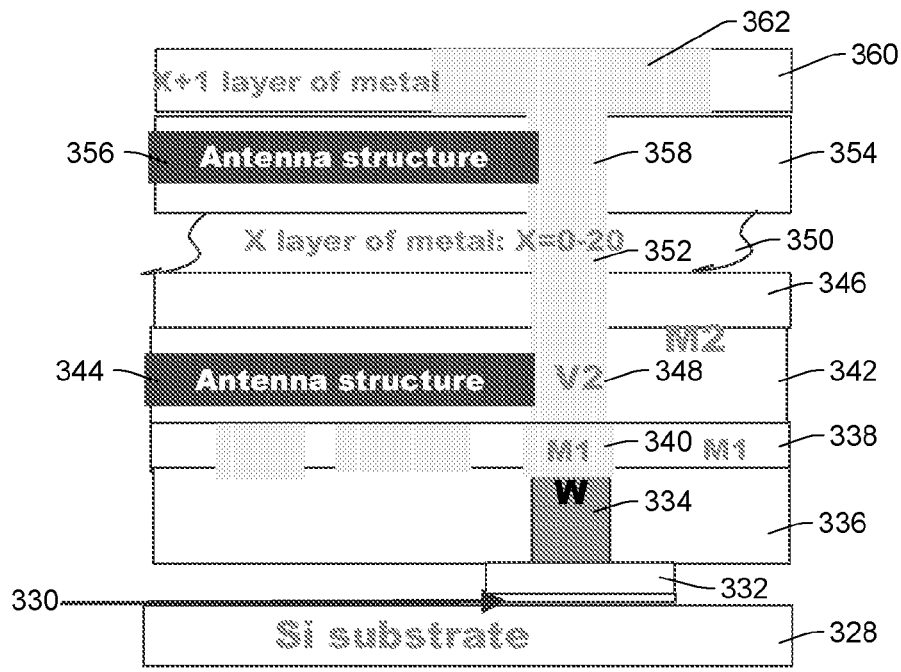
FIGS. 23-24 are schematic diagrams illustrating a cross-sectional view of additional embodiments of a test structure that can be used to assess plasma damage of a wafer.

One embodiment of such a test pad is shown in FIG. 23. The test pad can be formed on a wafer and used to determine gate damage after one or more layers of wiring have been formed on the wafer as described further herein. As shown in FIG. 23, the wafer includes Si substrate 328. Gate dielectric 330 is formed on Si substrate 328. Patterned or isolated polysilicon structure 332 is formed on gate dielectric 330. Via 334 is formed within dielectric layer 336 such that via 334 is electrically connected to polysilicon structure 332. Dielectric layer 338 is formed on dielectric layer 336, and conductive structures 340 are formed within dielectric layer 338.

ILD layer 342 is formed on dielectric layer 338 and some of conductive structures 340. Antenna structure 344 is formed within ILD layer 342. ILD layer 346 is formed on ILD layer 342. Via 348 is formed within ILD layers 342 and 346. Via 348 is electrically connected to antenna structure 344 and conductive structure 340, which is also electrically connected to via 334. Dielectric layer 350 is formed on ILD layer 346, and conductive structure 352 is formed in dielectric layer 350. Conductive structure 352 is electrically connected to via 348. However, the test pad may not include dielectric layer 350 and conductive structure 352. In addition, the test pad may include one or more layers (e.g., one layer to twenty layers) that include a dielectric layer such as dielectric layer 350 and one or more conductive structures such as conductive structures 352 formed in each dielectric layer.

ILD layer 354 is formed on dielectric layer 350. Antenna structure 356 and via 358 are formed within ILD layer 354. Antenna structure 356 is electrically coupled to via 358, and via 358 is electrically connected to conductive structure 352. However, if dielectric layer 350 and conductive structure 352 are not included in the test pad, dielectric layer 354 can be formed on dielectric layer 346 and conductive structure 358 can be electrically connected to via 348. Dielectric layer 360 is formed on ILD layer 354. Test structure 362 is formed in dielectric layer 360. Test structure 362 is electrically connected to via 358. In this manner, test structure 362 is electrically connected to Si substrate 328 as shown in FIG. 23. The test structure may be formed of a conductive material. Alternatively, the test structure may be formed of a dielectric material.

In this manner, the test pad shown in FIG. 23 includes a substrate and a number of levels formed on the substrate. These levels include gate, isolated or patterned polysilicon, W connector, M1 via, Mx via, and Mx+1 via and top test structure formed of metal or dielectric. In some embodiments, the one or more test structures include at least one antenna structure electrically connected to the gate structure by a via. In one such embodiment, the damage includes plasma damage. In this manner, the at least one antenna structure can be used for monitoring plasma damage of the gate structure. In another such embodiment, the at least one antenna structure includes a serpentine structure (not shown).

The measurements that can be performed on the test pad shown in FIG. 23 include any of the measurements described herein. In addition, after each BEOL wiring layer is formed, one or more electrical properties of the gate structure may be measured. For example, in one embodiment, the one or more test structures include a conductive structure formed on a top layer of the one or more layers of wiring. In one such embodiment, the conductive structure is electrically connected to the gate structure. In another embodiment, the one or more test structures include a dielectric structure formed on a top layer of one or more layers of wiring. In some embodiments, the one or more electrical properties include EOT, leakage, Dit, $Q_{tot}$, or flatband voltage ($V_{fb}$). In this manner, these and other electrical properties of the gate structure may be measured on the top metal or dielectric test structure (e.g., test structure 362) to determine if the BEOL wiring process for each layer causes damage to the gate structure. The test pad shown in FIG. 23 may be used in applications such as ILD deposition monitoring, ash/etch process monitoring, ILD CMP monitoring, and scrub charging monitoring.

Figure 24:
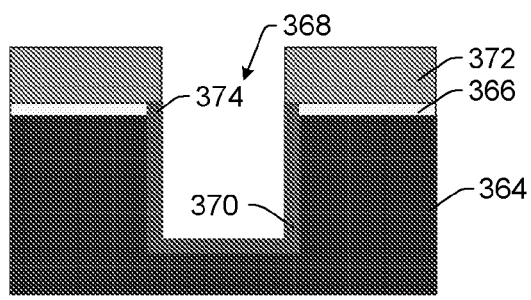

FIG. 24 illustrates another embodiment of a test structure that can be formed on a wafer and used to assess plasma damage of the wafer. In one embodiment, the test structure includes an STI structure. For instance, the test structure includes Si substrate 364. Dielectric layer 366 is formed on upper surfaces of Si substrate 364. Dielectric layer 366 may be a pad oxide layer. A thickness of the pad oxide layer may be about 50 Å to about 200 Å (e.g., about 100 Å). Trench 368 is formed through dielectric layer 366 and into Si substrate 364. Trench 368 may be configured as an STI structure. Dielectric layer 370 is formed on surfaces of trench 368 including surfaces of dielectric layer 366 and Si substrate 364 exposed by the trench formation. Dielectric layer 370 may be a silicon oxide layer. In this manner, dielectric layer 370 may be a lining oxide. Dielectric layer 372 is formed on upper surfaces of dielectric layer 366. Dielectric layer 372 may be a silicon nitride layer. A thickness of the silicon nitride layer may be about 1000 Å to about 2000 Å (e.g., about 1625 Å). Dielectric layer 366, trench 368, and dielectric layers 370 and 372 may be formed using any processes known in the art.

In some embodiments, leakage may be detected at corner 374 of dielectric layers 370 and 366. In this manner, the test structure may be used for STI lining oxide corner leakage detection. Leakage at corner 374 may be caused by plasma damage of dielectric layer 370 and/or dielectric layer 366 during processing of the wafer. For example, damage to dielectric layer 366 may be caused by etching of Si substrate 364 during formation of trench 368. In one embodiment, therefore, the plasma damage includes leakage at a corner of a lining oxide of the STI structure. Such leakage may adversely affect the performance of a device that includes a structure such as that shown in FIG. 24. Therefore, the plasma damage of the test structure may be measured as described herein and used to monitor and control one or more processes used to fabricate the device in order to increase the yield of the process(es). The test structure shown in FIG. 24 may have one or more characteristics that are substantially the same as one or more characteristics of device structures (not shown) formed on the wafer. The test structure shown in FIG. 24 may be further configured as described herein.

Figure 25:
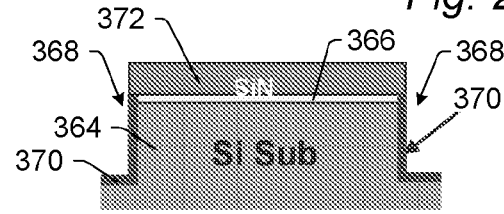
FIGS. 25-26 are schematic diagrams, each illustrating cross-sectional and top views of an embodiment of a test structure that can be used to assess plasma damage of a wafer.
Figure 25:
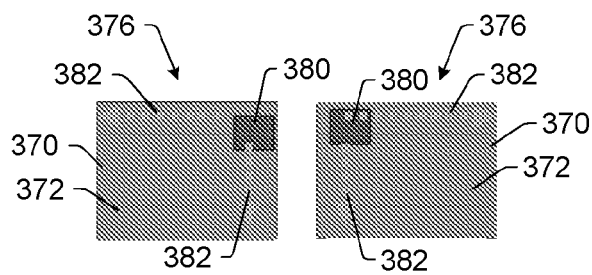

Another embodiment of a test structure that can be used to assess plasma damage of a wafer, on which device structures configured as shown in FIG. 24 are formed, is shown in FIG. 25. The test structure shown in FIG. 25 includes a portion of the wafer (e.g., Si substrate 364) surrounded by one or more trenches 368. In one embodiment, the one or more trenches include one or more STI structures. The test structure also includes pad oxide layer 366 formed on an upper surface of the portion of the wafer. In addition, the test structure includes lining oxide 370 formed on side surfaces of the portion of the wafer, side surfaces of the pad oxide layer, and an upper surface of the wafer in the one or more trenches. One or more electrical properties of the test structure can be measured and used to determine an index characterizing plasma damage of the test structure caused by a process performed on the wafer. In one embodiment, the one or more electrical properties include leakage of lining oxide 370 proximate an upper corner of the portion of the wafer. In some embodiments, the test structure includes silicon nitride layer 372 formed on pad oxide layer 366.

A top view of two such test structures is also shown in FIG. 25 in which the two test structures are configured as AA bulk patterns 376 formed on the wafer (not shown in the top view of FIG. 25). In one embodiment, the test structure is configured as an AA bulk pattern having an area of about 50 µm by about 50 µm. In addition, each of the bulk patterns shown in FIG. 25 may have dimensions of about 50 µm by about 50 µm. In the embodiment shown in FIG. 25, AA bulk patterns 376 include silicon nitride layer 372 and lining oxide 370. In some embodiments, the one or more electrical properties of the test structure can be measured by scanning one or more lines along an edge of the bulk pattern with a probe. For example, probe 380, which may be configured as described herein, may scan one or more lines 382 along the edge of bulk patterns 376. Measurements acquired by the probe during the scanning may be used to assess plasma damage of the lining oxide as described further herein. For example, measurements acquired by the probe during scanning may be used to assess STI lining oxide corner leakage.

Figure 26:
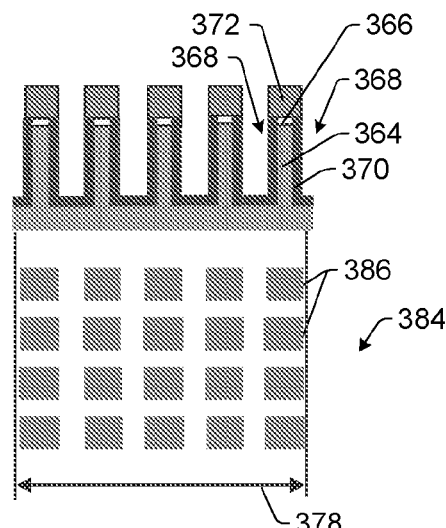

In another embodiment, as shown in the top view of FIG. 26, the test structure is included in AA island pattern 384 formed on the wafer (e.g., Si substrate 364). In one such embodiment, each island in the AA island pattern includes the test structure described above. For example, each of islands 386 may include one of the test structures shown in FIG. 25. In particular, as shown in the cross-sectional view of FIG. 26, each of the islands may include Si substrate 364 and dielectric layers 366, 370, and 372 formed between trenches 368. However, dimensions of the test structures that form islands 386 may be different than dimensions of the test structure that forms AA bulk pattern 376 (e.g., such that the overall dimensions of AA island pattern are approximately equal to the overall dimensions of bulk pattern 376). For instance, the size of AA bulk pattern 376 and the size of AA island pattern 384 may be about 50 µm by about 50 µm. In particular, dimension 378 of AA island pattern 384 may be about 50 µm, and the dimension of the AA island pattern in the opposite direction may be about 50 µm. In one embodiment, therefore, the AA island pattern has overall dimensions of about 50 µm by about 50 µm. A pitch of islands 386 may be about 0.05 µm to about 0.2 µm. For example, the pitch of islands 386 may be about 0.2 µm. In one embodiment, each island in the AA island pattern has a cell size or width (i.e., a width of dielectric layer 372 formed on each island) of about 0.05 µm to about 0.2 µm. For example, a cell size of each of islands 386 may be about 0.1 µm. Alternatively, islands 386 included in pattern 384 may have dimensions of about 1 µm by about 1 µm.

In one embodiment, the one or more electrical properties of the test structure can be measured by performing one or more measurements on one or more islands in the AA island pattern using a probe (not shown in FIG. 26). In another embodiment, the one or more electrical properties of the test structure can be measured by performing one or more measurements on areas between islands in the AA island pattern using a probe. For example, a probe, which may be configured as described herein, may perform one or more measurements on one or more of islands 386 or on one or more areas between the islands. The measurements may be used to assess plasma damage as described further herein. In particular, the measurements may be used to assess STI lining oxide corner leakage.

In some embodiments, the test structure includes a dielectric formed in the one or more trenches. In one such embodiment, an upper surface of the dielectric is not in the same plane as an upper surface of the pad oxide layer. One example of such a dielectric that may be included in the embodiment of the test structure described above is dielectric 394 shown in FIG. 27 described further below. In one embodiment, the plasma damage includes damage of the pad oxide layer (e.g., pad oxide layer 366) due to removal of a silicon nitride layer (e.g., silicon nitride layer 372) from the pad oxide layer. Plasma damage of the pad oxide layer may be assess as described further herein.

In another embodiment, the test structure includes a dielectric formed in the one or more trenches. In one such embodiment, an upper surface of the dielectric is substantially planar with an upper surface of the pad oxide layer. One example of such a dielectric that may be included in the embodiment of the test structure described above is dielectric 606 shown in FIGS. 30a, 30b, and 30c described further below. In some such embodiments, the plasma damage includes damage of the pad oxide layer (e.g., pad oxide layer 366) due to removal of a silicon nitride layer (e.g., silicon nitride 372) from the pad oxide layer. In further such embodiments, the plasma damage includes damage of the pad oxide layer (e.g., pad oxide layer 366) and the dielectric (e.g., dielectric 606 shown in FIGS. 30a, 30b, and 30c) due to CMP of the dielectric. Such plasma damage of the pad oxide layer and the dielectric may be assessed as described further herein.

Figure 27:
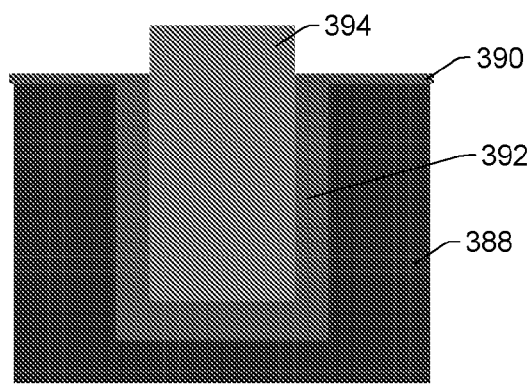
FIG. 27 is a schematic diagram illustrating a cross-sectional view of another embodiment of a test structure that can be used to assess plasma damage of a wafer.

FIG. 27 illustrates another embodiment of a test structure that may be formed on a wafer and used to assess plasma damage of the wafer. This test structure may be configured as described above with respect to FIG. 24. For example, the test structure includes Si substrate 388. Dielectric layer 390 is formed on upper surfaces of Si substrate 388. Dielectric layer 390 may include, for example, a pad oxide layer. The pad oxide layer may have a thickness of about 50 Å to about 200

Å (e.g., about 100 Å). Dielectric layer 392 is formed on surfaces of dielectric layer 390 and Si substrate 388 exposed during formation of a trench through dielectric layer 390 and into Si substrate 388. Dielectric layer 392 may include a lining oxide. Dielectric 394 is formed on surfaces of dielectric layer 392 such that dielectric 394 substantially fills the trench. Dielectric 394 may be, for example, an oxide layer formed by a high density plasma (HDP) process. The test structure shown in FIG. 27 may be configured as an STI structure. As shown in FIG. 27, an upper surface of dielectric 394 is not in the same plane as an upper surface of dielectric layer 390, which may be a pad oxide layer.

A dielectric layer (not shown) may have been formed on upper surfaces of dielectric layer 390 prior to and during deposition of dielectric layer 394. Such a dielectric layer is shown in FIG. 24 as dielectric layer 372. This dielectric layer may be formed of, for example, silicon nitride. The dielectric layer may have been removed after formation of dielectric layer 394. The dielectric layer may have been removed using a process such as etch. Therefore, during removal of the dielectric layer, dielectric layer 390 may be damaged due to exposure of dielectric layer 390 to the plasma used during the etch process.

Figures 28, 29, 30:
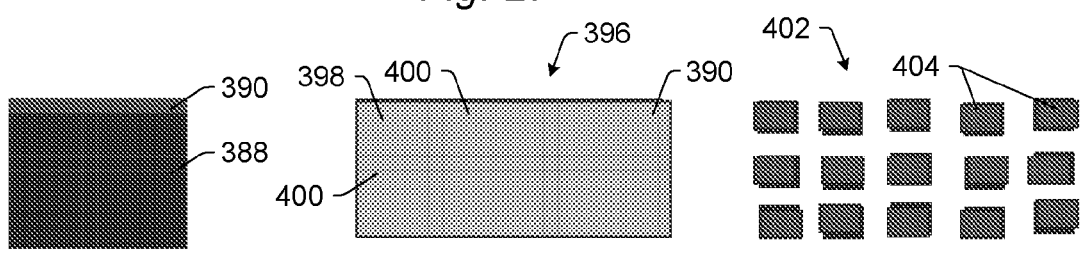
FIGS. 28-30 are schematic diagrams illustrating a top view of various embodiments of a test structure that can be used to assess plasma damage of a wafer.

The plasma damage of the test structure may be measured as described herein. For example, as shown in FIG. 28, the test structure may include dielectric layer 390 formed on Si substrate 388. As shown in FIG. 29, such a test structure may be configured as AA bulk pattern 396 formed on a wafer (not shown in FIG. 29). Therefore, the surface of AA bulk pattern 396 may include an upper surface of dielectric layer 390. Probe 398, which may be configured as described herein, may scan one or more lines 400 along the edge of bulk pattern 396. Measurements acquired by the probe during the scanning may be used to assess plasma damage of dielectric layer 390 as described further herein.

In another example, as shown in FIG. 30, AA island pattern 402 may be formed on a wafer (not shown in FIG. 30). Islands 404 included in pattern 402 may have dimensions as described above. Each of the islands may include a test structure as shown in FIG. 28. A probe (not shown in FIG. 30), which may be configured as described herein, may perform one or more measurements on one or more of islands 404 and/or one or more areas between islands 404. The measurements may be used to assess plasma damage as described further herein.

Figure 30A:
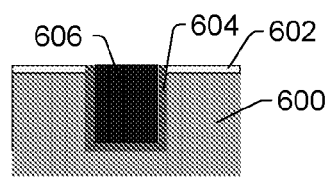
FIG. 30a is a schematic diagram illustrating a cross-sectional view of another embodiment of a test structure that can be used to assess plasma damage of a wafer.

FIG. 30a illustrates another embodiment of a test structure that may be formed on a wafer and used to assess plasma damage of the wafer. This test structure includes Si substrate 600. Dielectric layer 602 is formed on upper surfaces of Si substrate 600. Dielectric layer 602 may include, for example, a pad oxide layer. The pad oxide layer may have a thickness of about 50 Å to about 200 Å (e.g., about 100 Å). Dielectric layer 604 is formed on surfaces of dielectric layer 602 and Si substrate 600 exposed during formation of a trench through dielectric layer 602 and into Si substrate 600. Dielectric layer 604 may include a lining oxide. Dielectric 606 is formed on surfaces of dielectric layer 604 such that dielectric 606 substantially fills the trench. Dielectric 606 may be, for example, an oxide layer formed by a HDP process. As shown in FIG. 30a, an upper surface of dielectric 606 is substantially planar with an upper surface of dielectric 602, which may be a pad oxide layer. The test structure shown in FIG. 30a may be configured as an STI structure.

A dielectric layer (not shown) may have been formed on upper surfaces of dielectric layer 602 prior to and during deposition of dielectric layer 606. Such a dielectric layer is shown in FIG. 24 as dielectric layer 372. This dielectric layer may be formed of, for example, silicon nitride. The dielectric layer may have been removed after formation of dielectric layer 606. The dielectric layer may have been removed using a process such as etch or strip. Therefore, during removal of the dielectric layer, dielectric layer 602 may be damaged due to exposure of dielectric layer 602 to the plasma used during the etch or strip process. In addition, unlike the test structure shown in FIG. 27, in the test structure of FIG. 30a, the upper surface of dielectric layer 606 is substantially planar with upper surfaces of dielectric layer 602. For example, the test structure shown in FIG. 27 may be processed using a CMP process such as an STI oxide CMP process to produce the test structure shown in FIG. 30a. Therefore, during the CMP process, dielectric layers 602 and 606 may be damaged. As such, the plasma damage caused by the silicon nitride strip process and CMP process may be assessed using the test structure shown in FIG. 30a. One or more electrical properties of the test structure may be measured as described herein.

Figures 30B, 30C:
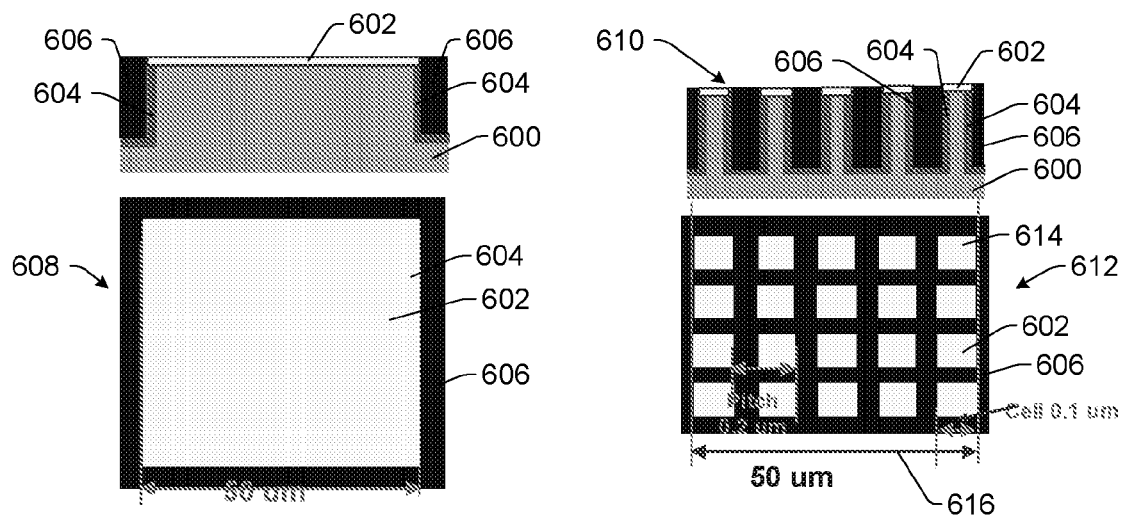
FIGS. 30b-30c are schematic diagrams, each illustrating cross-sectional and top views of an embodiment of a test structure that can be used to assess plasma damage of a wafer.

For example, as shown in FIG. 30b, the test structure may include dielectric layer 602 formed on Si substrate 600, dielectric layer 604 lining trenches formed through dielectric layer 602 and into Si substrate 600, and dielectric layer 606 formed on dielectric layer 604 in the trenches. A top view of this structure is also shown in FIG. 30b in which the test structure is configured as AA bulk pattern 608 formed on a wafer. Therefore, the upper surface of AA bulk pattern 608 may include the upper surface of dielectric layer 602, under which dielectric layer 604 is formed, surrounded by the upper surface of dielectric layer 606. A probe (not shown in FIG. 30b), which may be configured as described herein, may scan one or more lines along the edge of bulk pattern 608. Measurements acquired by the probe during the scanning may be used to assess plasma damage of dielectric layers 602 and 606 as described further herein. The plasma damage may include plasma damage caused by the strip process used to remove a silicon nitride dielectric layer such as dielectric layer 372 shown in FIG. 24 and a CMP process used to planarize dielectric 606.

In another example, more than one of the test structures shown in FIG. 30b may be included in test pad 610 as shown in FIG. 30c. Each of the test structures shown in test pad 610 may be configured as described above. A top view of this test pad is also shown in FIG. 30c in which the test pad is configured as AA island pattern 612 formed on a wafer. Each of islands 614 may include one of the test structures shown in FIG. 30b. In particular, as shown in test pad 610 of FIG. 30c, each of the islands may include dielectric layer 602 formed on Si substrate 600, dielectric layer 604 lining trenches formed through dielectric layer 602 and into Si substrate 600, and dielectric layer 606 formed on dielectric layer 604 in the trenches.

Dimensions of the test structures that form islands 614 may be different than dimensions of the test structure that forms AA bulk pattern 608 (e.g., such that the overall dimensions of AA island pattern 612 are approximately equal to the overall dimensions of bulk pattern 608). For instance, the size of AA bulk pattern 608 and the size of AA island pattern 612 may be about 50 µm by about 50 µm. In particular, dimension 616 of AA island pattern 612 may be about 50 µm, and the dimension of the AA island pattern in the opposite direction may be about 50 µm. A pitch of islands 614 may be about 0.05 µm to about 0.2 µm. For example, in one embodiment, a pitch of islands 614 may be about 0.2 µm. In addition, a cell size or width of each of islands 614 (i.e., a width of dielectric 602 included in each of islands 614) may be about 0.05 µm to about 0.2 µm. For example, a cell size of each of islands 614 may be about 0.1 µm.

A probe (not shown in FIG. 30c), which may be configured as described herein, may perform one or more measurements on one or more of islands 614 and/or on one or more areas between the islands. The measurements may be used to assess plasma damage as described further herein. The plasma damage may include plasma damage caused by a strip process used to remove a silicon nitride dielectric layer such as dielectric layer 372 shown in FIG. 24 and a CMP process used to planarize dielectric layer 606.

Another embodiment of a test structure formed on a wafer includes an Epi layer formed on the wafer. The test structure also includes one or more P wells, one or more N wells, or a combination thereof formed through the Epi layer and into the wafer. One or more electrical properties of the test structure can be measured and used to determine an index characterizing plasma damage of the test structure caused by a process performed on the wafer.

Figure 31:
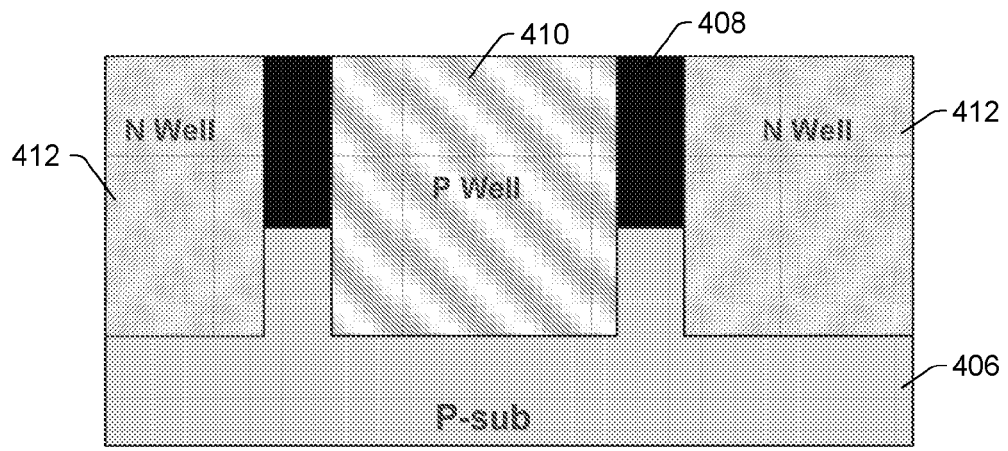
FIG. 31 is a schematic diagram illustrating a cross-sectional view of another embodiment of a test structure that can be used to assess plasma damage of a wafer.

FIG. 31 illustrates one embodiment of such a test structure that may be formed on a wafer and used to assess plasma damage of the wafer. The test structure includes one or more P wells, one or more N wells, or a combination thereof. In one such embodiment, the plasma damage includes plasma charging due to one or more ion implantation processes used to form the one or more P wells, the one or more N wells, or the combination thereof. For example, as shown in FIG. 31, the test structure includes Si substrate 406. Si substrate 406 may be a p-type Si substrate. Epi layer 408 is formed on Si substrate 406. P well 410 is formed in Epi layer 408 and Si substrate 406. In addition, N wells 412 are formed in Epi layer 408 and Si substrate 406. P well 410 and N wells 412 may be used to monitor plasma charging that takes place during the ion implantation process(es) used to form the P well and the N wells. In some embodiments, the test structure of FIG. 31 may be configured as a P Well and N Well WAT monitoring test pad. For example, WAT Semiconductor Data Analysis Software may be used to create a patterned test site for the C-V characteristics that are measured. One or more measurements may be performed on the test structure of FIG. 31 as described herein, and such measurements may be used to assess plasma damage of the wafer as described further herein.

In some embodiments, the test structure includes a dielectric layer (not shown) formed on the test structure shown in FIG. 31. In particular, the test structure may include a dielectric layer formed on the upper surface of the test structure shown in FIG. 31. In another embodiment, the test structure includes a dielectric layer formed on upper surfaces of the one or more P wells, the one or more N wells, or the combination thereof. In one such embodiment, the dielectric layer is not formed on an upper surface of the Epi layer. The dielectric layer may have any suitable composition and dimensions. The dielectric layer may be formed using any suitable process (es) known in the art.

In some embodiments, the test structure shown in FIG. 31 is configured as an AA bulk pattern (not shown). The AA bulk pattern may be configured as described herein. For example, in one embodiment, the AA bulk pattern has an area of about 50 μm by about 50 μm. In another embodiment, the one or more electrical properties include a $V_s$ map of the AA bulk pattern.

Figure 31A:
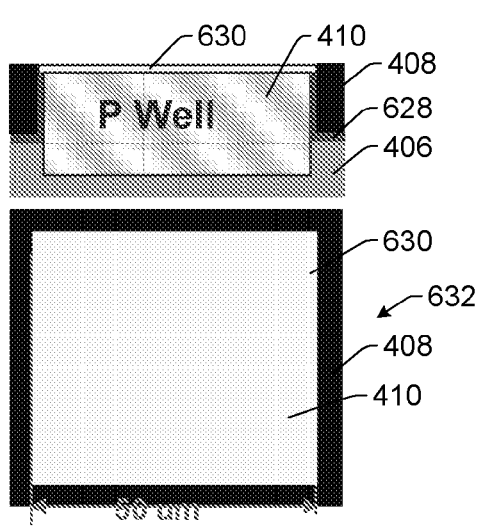
FIGS. 31a-31b are schematic diagrams, each illustrating cross-sectional and top views of an embodiment of a test structure that can be used to assess plasma damage of a wafer.
Figure 31B:
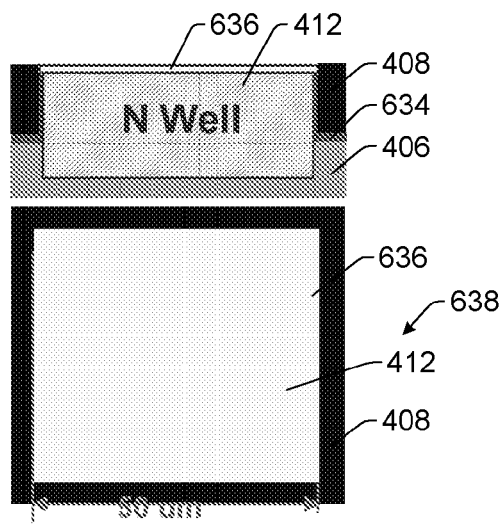

The test structure shown in FIG. 31 may also include only a P well or only an N well. For example, as shown in FIG. 31a, the test structure may include Si substrate 406, P well 410, and Epi layer 408, which may be configured as described above. In addition, the test structure may include dielectric layer 628 formed between the Epi layer and Si substrate 406 and between the Epi layer and P well 410. Dielectric layer 628 may have any suitable composition and dimensions known in the art. In addition, dielectric layer 628 may be formed using any suitable process(es) known in the art. The test structure also includes dielectric layer 630 formed on the upper surface of P well 410. In one embodiment, dielectric layer 630 is a pad oxide layer. Dielectric layer 630 may have any suitable composition and dimensions known in the art. In addition, dielectric layer 630 may be formed using any suitable process(es) known in the art. As shown in FIG. 31a, dielectric layer 630 may not be formed on Epi layer 408.

The test structure may be configured as AA bulk pattern 632 as shown in the top view of FIG. 31a. AA bulk pattern 632 includes upper surfaces of dielectric layer 630 and Epi layer 408. P well is formed in AA bulk pattern 632 under dielectric layer 630. AA bulk pattern 632 may form the test pad for the test structure, and the test pad may have dimensions of about 50 μm by about 50 μm. The test structure shown in FIG. 31a may be used to monitor well implant plasma charging. In particular, the test structure shown in FIG. 31a may be used to detect P well implant plasma charging. In one such embodiment, the measurements used to assess plasma damage of the wafer include a $V_s$ map of the test pad. In addition, one or more measurements that may be performed on the test structure of FIG. 31a may include any measurement(s) described herein.

In another example, as shown in FIG. 3b, the test structure may include Si substrate 406, N well 412, and Epi layer 408, which may be configured as described above. In addition, the test structure may include dielectric layer 634 formed between the Epi layer and Si substrate 406 and between the Epi layer and N well 412. Dielectric layer 634 may have any suitable composition and dimensions known in the art. In addition, dielectric layer 634 may be formed using any suitable process(es) known in the art. Furthermore, dielectric layer 634 may be the same as or different than dielectric layer 628 shown in FIG. 31a (e.g., dielectric layers 634 and 628 may have the same or different compositions and/or the same or different dimensions). As further shown in FIG. 3b, the test structure also includes dielectric layer 636 formed on the upper surface of N well 412. In one embodiment, dielectric layer 636 is a pad oxide layer. Dielectric layer 636 may have any suitable composition and dimensions known in the art. In addition, dielectric layer 636 may be formed using any suitable process(es) known in the art. Furthermore, dielectric layer 636 may be the same as or different than dielectric layer 630 shown in FIG. 3a (e.g., dielectric layers 636 and 630 may have the same or different compositions and/or the same or different dimensions). As shown in FIG. 3b, dielectric layer 630 may not be formed on Epi layer 408.

As further shown in the top view of FIG. 3b, the test structure may be configured as AA bulk pattern 638. AA bulk pattern 638 includes upper surfaces of dielectric layer 636 and epitaxial layer 408. N well 412 is formed in AA bulk pattern 636 under dielectric layer 636. AA bulk pattern 638 may form the test pad for the test structure, and the test pad may have dimensions of about 50 μm by about 50 μm. The test structure shown in FIG. 3b may be used to monitor well implant plasma charging. In particular, the test structure shown in FIG. 3b may be used to detect N well implant plasma charging. In one such embodiment, the measurements used to assess plasma damage of the wafer include a $V_s$ map of the test pad. In addition, one or more measurements that may be performed on the test structure of FIG. 3b may include any measurement (s) described herein.

An additional embodiment relates to a test structure formed on a wafer. The test structure includes a gate structure formed on the wafer. One or more electrical properties of the gate structure can be measured and used to determine an index characterizing plasma damage of the gate structure caused by a process performed on the wafer.

Figure 32:
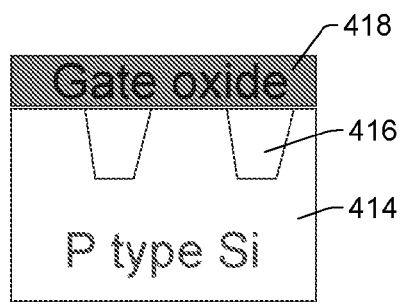
FIG. 32 is a schematic diagram illustrating a cross-sectional view of a further embodiment of a test structure that can be used to assess plasma damage of a wafer.

FIG. 32 illustrates one embodiment of such a test structure in which the gate structure includes insulating structures formed in the wafer and a dielectric formed on upper surfaces of the wafer and the insulating structures. In particular, the test structure includes Si substrate 414, which may be a p-type Si substrate. Insulating structures 416 are formed in Si substrate 414. Insulating structures 416 may be formed of any suitable insulating material known in the art. In addition, insulating structures 416 may have any suitable characteristics known in the art. Dielectric layer 418 is formed on upper surfaces of Si substrate 414 and insulating structures 416. In one embodiment, dielectric layer 418 may include a gate dielectric layer. In addition, dielectric layer 418 may be formed of any suitable insulating material known in the art such as silicon oxide. Dielectric layer 418 may be formed using any suitable process known in the art such as deposition. One or more measurements may be performed on dielectric layer 418 as described herein.

Figure 33:
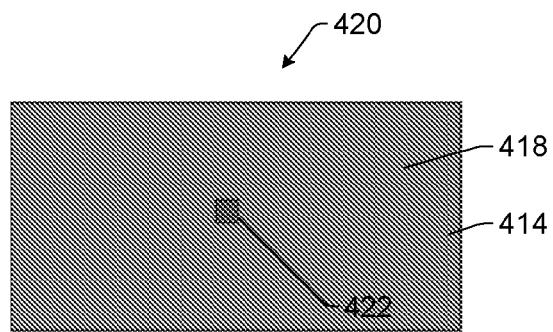
FIG. 33 is a schematic diagram illustrating a top view of an additional embodiment of a test structure that can be used to assess plasma damage of a wafer.

In another such embodiment, the gate structure is configured as an AA bulk pattern on the wafer, and the one or more electrical properties of the gate structure are measured at approximately the center of the AA bulk pattern. For example, as shown in FIG. 33, AA bulk pattern 420 of the test structure shown in FIG. 32 may be formed on a wafer (not shown in FIG. 33). The upper surface of AA bulk pattern 420 includes the upper surface of dielectric layer 418 surrounded by the upper surface of Si substrate 414. Probe 422, which may be configured as described herein, may perform one or more measurements on dielectric layer 418. The one or more measurements may be performed as described further herein. In addition, the measurement(s) may be performed at one location at approximately the center of the AA bulk pattern. In some embodiments, the plasma damage includes plasma damage of the dielectric layer formed on upper surfaces of the wafer and the insulating structures. For example, the one or more measurements may be used as described further herein to assess plasma damage of dielectric layer 418.

In another embodiment of such a test structure, the gate structure includes a gate dielectric structure formed on the wafer and a gate electrode structure formed on the gate dielectric structure. In one such embodiment, the plasma damage includes plasma damage of the gate electrode structure. FIG. 34 illustrates one embodiment of such a test structure. In this embodiment, the test structure includes Si substrate 426. Si substrate 426 may be, for example, a p-type Si substrate. Gate dielectric structure 428 is formed on Si substrate 426. Gate dielectric structure 428 may be formed of any suitable material known in the art such as silicon dioxide. In addition, gate electrode structure 430 is formed on gate dielectric structure 428. Gate electrode structure 430 may be formed of any suitable material known in the art such as polysilicon. Gate dielectric structure 428 and gate electrode structure 430 may be formed in any processes known in the art such as deposition followed by lithography and etch. One or more measurements may be performed on the test structure shown in FIG. 34, and the measurement(s) may be used to assess plasma damage of the wafer.

The gate structure shown in FIG. 34 may be configured as an AA bulk pattern on the wafer. For example, as shown in FIG. 35, an upper surface of AA bulk pattern 432 includes an upper surface of gate electrode structure 430 formed on Si substrate. Probe 436, which may be configured as described herein, may be used to perform one or more measurements on the gate electrode structure in AA bulk pattern 432. In addition, probe 436 may be used to perform one or more measurements at one location in the AA bulk pattern. The location at which measurement(s) are performed may be located at approximately the center of the AA bulk pattern. The one or more measurements may be used as described further herein to assess plasma damage of gate electrode structure 430.

In some embodiments, the test structure is included in an array of test structures arranged in an AA island pattern on the wafer. For example, as shown in FIG. 36, AA island pattern 438 includes islands 440, each of which may include the test structure shown in FIG. 34 formed on substrate 426. Probe 442, which may be configured as described herein, may be used to perform one or more measurements of Si substrate 426 between islands 440. Probe 442 may also or alternatively be used to perform one or more measurements on one or more of the islands. In addition, probe 442 may be used to perform one or more measurements at one location in AA island pattern 438. The location may be the location of the probe shown in FIG. 36 or another location of the probe between islands 440. The one or more measurements may be used as described further herein to assess plasma damage of gate electrode structure 430.

In some embodiments, the test structure shown in FIG. 34 may be substantially similar to a device structure (not shown) that is also formed on the wafer. For example, in one embodiment, the gate structure has one or more characteristics that are substantially the same as one or more characteristics of a device structure formed on the wafer. However, for a device structure configured similarly to the test structure shown in FIG. 34, a different test structure may be used to measure one or more properties of the device structure.

In one embodiment of the test structure, the gate structure includes a gate dielectric structure formed on the wafer, a gate electrode structure formed on the gate dielectric structure, and STI structures formed in the wafer and partially underlying the gate electrode structure. One embodiment of such a test structure is shown in FIG. 36a. As shown in FIG. 36a, the test structure includes Si substrate 426, gate dielectric structure 428, and gate electrode structure 430, which may be configured as described above. In addition, the test structure includes STI oxide structures 640 formed in Si substrate 426 and partially underlying gate electrode structure 430. The STI oxide structures may have any suitable composition and dimensions known in the art. In addition, the STI oxide structures may be formed using any suitable process(es) known in the art. The STI oxide structures may be further configured as described herein.

In one such embodiment, an area of the test structure shown in FIG. 36a defined by an area of the gate dielectric structure is used as a test pad for measurement of the one or more electrical properties. In one such embodiment, the test pad has an area of about 50 µm by about 50 µm. A top view of the test structure of FIG. 36a is shown in FIG. 36b. In particular, the test structure includes gate dielectric structure 428 formed under gate electrode structure 430 surrounded by STI oxide structure 640. The test structure shown in FIGS. 36a and 36b may be used for thin gate in-line electrical monitoring under polysilicon. In one embodiment, the process performed on the wafer that caused the plasma damage characterized by the index includes a polysilicon etch process. In particular, the test structure shown in FIGS. 36a and 36b may be used for applications such as thin gate electrical property post polysilicon etch. In an additional such embodiment, the one or more electrical properties include EOT of the gate dielectric structure. In another such embodiment, the one or more electrical properties include $J_g$ index of the gate dielectric structure. The measurements may be performed as described further herein. In addition, the test structure shown in FIGS. 36a and 36b may be further configured as described herein.

Figure 36C:
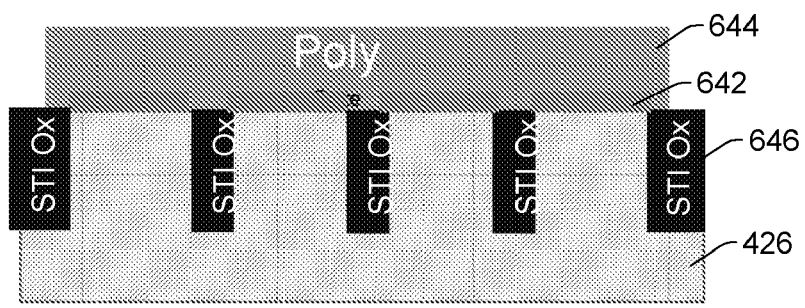
FIG. 36c is a schematic diagram illustrating a cross-sectional view of an additional embodiment of a test structure that can be used to assess plasma damage of a wafer.

In another embodiment of the test structure, the gate structure includes patterned gate dielectric structures formed on the wafer, a gate electrode structure formed across all of the patterned gate dielectric structures, and STI structures formed within the wafer in areas of the wafer above which the patterned gate dielectric structures are not formed. One embodiment of such a test structure is shown in FIG. 36c. In this embodiment, the test structure includes Si substrate 426 and patterned gate dielectric structures 642 formed on Si substrate 426. Patterned gate dielectric structures 642 may have any composition and dimensions known in the art. Patterned gate dielectric structures 642 may be formed using any suitable process(es) known in the art. Gate electrode structure 644 is formed across all of the patterned gate dielectric structures. Gate electrode structure 644 may be further configured as described above with respect to gate electrode structure 430. In addition, the test structure shown in FIG. 36c includes STI oxide structures 646 formed in Si substrate 426. At least some of the STI oxide structures are formed in areas of the substrate between areas of the substrate on which two neighboring patterned gate dielectric structures are formed. STI oxide structures 646 may have any composition and dimensions known in the art. In addition, STI oxide structures 646 may be formed using any suitable process(es) known in the art. STI oxide structures 646 may be further configured as described herein.

Figure 36D:
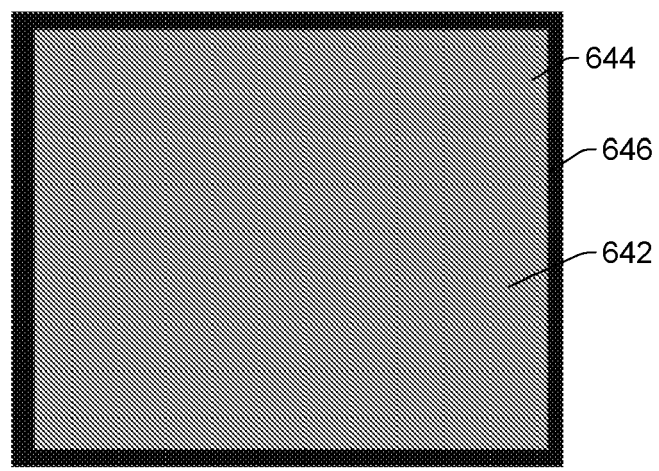
FIG. 36d is a top view of the test structure of FIG. 36c.

In one such embodiment, an area of the test structure shown in FIG. 36c defined by an area of the gate electrode structure is used as a test pad for measurement of the one or more electrical properties. In some such embodiments, the test pad has an area of about 50 µm by about 50 µm. A top view of the test structure of FIG. 36c is shown in FIG. 36d. In particular, the test structure includes patterned gate dielectric structures 642 formed under gate electrode structure 644 surrounded by STI oxide structures 646. A pitch of the test structure shown in FIGS. 36c and 36d (e.g., the distance between the center of one of the patterned gate dielectric structures and the center of a neighboring patterned gate dielectric structure) may be about 0.05 µm to about 0.2 µm. For example, the pitch of the test structure may be about 0.2 µm. In another embodiment, a width of each of the patterned gate dielectric structures shown in FIGS. 36c and 36d is about 0.05 µm to about 0.2 µm. For example, the lateral dimensions of the patterned gate dielectric structures shown in FIGS. 36c and 36d may be about 0.1 µm by about 0.1 µm.

In some embodiments, the plasma damage includes integrity of the patterned gate dielectric structures. In an additional embodiment, the process includes a polysilicon etch process. For example, the test structure shown in FIGS. 36c and 36d may be used for gate oxide integrity (GOI) impact by gate etch after polysilicon patterning. In particular, the test structure shown in FIGS. 36c and 36d may be used for applications such as gate leakage due to gate etch after polysilicon patterning. The measurements may be performed to measure one or more electrical properties of the gate dielectric structure such as $J_g$ index and gate leakage. The measurements may be performed as described further herein. In addition, the test structure shown in FIGS. 36c and 36d may be further configured as described herein.

Figure 37:
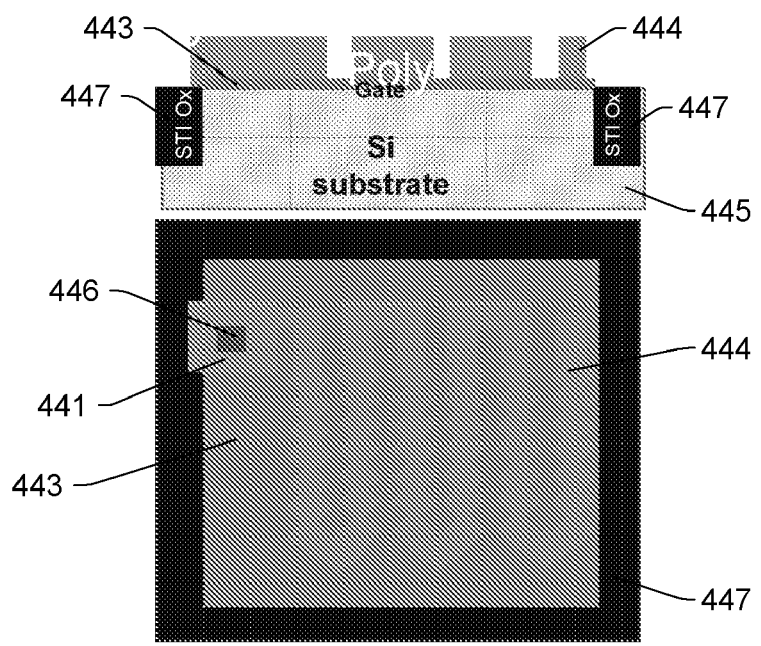
FIG. 37 is a schematic diagram illustrating cross-sectional and top views of a different embodiment of a test structure that can be used to assess plasma damage of a wafer.

In a further embodiment of the test structure, the gate structure includes a gate dielectric structure formed on the wafer, a polysilicon finger pattern formed on the gate dielectric structure, and an STI structure formed within the wafer in an area of the wafer surrounding the gate dielectric structure. In one such embodiment, as shown in FIG. 37, the test structure includes polysilicon finger pattern 444 formed on gate dielectric structure 443. In some embodiments, the polysilicon finger pattern is configured as a serpentine structure. Polysilicon finger pattern 444 may have any suitable characteristics known in the art such as pitch, width, spacing, thickness, etc. In one example, polysilicon finger pattern 444 may have a pitch of about 0.2 µm. Gate dielectric structure 443 is formed on Si substrate 445 and may be surrounded by STI oxide structure 447. Gate dielectric structure 443 may be formed of any suitable material known in the art such as silicon oxide. In addition, Si substrate 445 may be replaced with a conductive layer that serves as a grounding pad. Such a conductive layer may be further configured as described herein (e.g., as described with respect to conductive layer 36 shown in FIG. 1).

In some embodiments, the one or more electrical properties of the gate structure can be measured on a polysilicon test area of the polysilicon finger pattern. For example, probe 446, which may be configured as described herein, may be used to perform one or more measurements on polysilicon finger pattern 444. The measurement(s) may be performed at one location in the polysilicon finger pattern (e.g., on polysilicon test area 441 coupled to polysilicon finger pattern 444). This location may be the location of the probe shown in FIG. 37. Alternatively, the measurement(s) may be performed at any other suitable location in the polysilicon finger pattern and/or the polysilicon test area.

Although polysilicon test area 441 is shown in FIG. 37 formed above gate dielectric structure 443, in other embodiments (not shown), polysilicon test area 441 may be formed above STI oxide structure 447. In other words, STI oxide structure 447 shown in FIG. 37 may be altered such that it extends under polysilicon test area 441. In addition, although polysilicon finger pattern 444 is shown in FIG. 37 as a serpentine structure, in other embodiments, the polysilicon finger pattern is configured as a series of lines (not shown). Each of the lines is coupled to polysilicon test area 441 of the polysilicon finger pattern by a line coupled to an end of each of the series of lines. In one such embodiment, a dimension of the test pad across the series of lines and the polysilicon test area may be about 80 µm. In addition, the polysilicon finger pattern may have an area of about 50 µm by about 50 µm. A pitch of the polysilicon finger pattern may be about 0.05 µm to about 0.2 µm. In addition, a line width of each polysilicon finger may be about 0.05 µm to about 0.2 µm. The polysilicon test area may have dimensions of about 20 µm by about 20 µm to about 30 µm by about 30 µm. Furthermore, a test structure that includes a polysilicon finger pattern that includes a series of lines may not include STI oxide structures 447.

The one or more measurements may be used as described further herein to assess plasma damage of polysilicon finger pattern 444. In one embodiment, the plasma damage includes plasma damage of the gate dielectric structure caused by a polysilicon etch process. For example, the one or more measurements may be used to assess plasma damage of the gate dielectric structure that is caused by a polysilicon etch process. In particular, the measurements may be used to assess the GOI impact due to a polysilicon etch process. In some embodiments, the one or more electrical properties of the gate structure include leakage of the gate dielectric structure. In one such example, the measurements may be used to monitor leakage of the gate dielectric structure caused by the plasma damage. In another embodiment, the one or more electrical properties of the gate structure include leakage index of the gate dielectric structure. In one such example, the measurements may include measuring the $J_g$ index. In a further embodiment, the one or more electrical properties can be measured by depositing a charge on a polysilicon test area of the polysilicon finger pattern. In one such embodiment, the one or more electrical properties include leakage current, and the plasma damage includes edge damage of the gate electrode structure due to a polysilicon etch process. For example, after a polysilicon etch process, a charge may be deposited on the polysilicon test area to measure leakage current. The leakage current can be used to monitor polysilicon etch gate edge damage. The test structure shown in FIG. 37 may be used to monitor many plasma etch processes after the polysilicon has been etched such as polysilicon etch, spacer etch, RPO etch, metal etch, etc.

In another embodiment, the gate structure includes a gate dielectric structure formed on the wafer. The gate dielectric structure may be configured as described herein. In one such embodiment, the plasma damage includes plasma damage of the gate dielectric structure due to an ion implantation process. For example, further processing of a device structure configured similarly to the test structure shown in FIG. 34 may include an ion implantation process such as a n-type lightly doped drain (NLDD) implantation process that may involve implanting ions into gate electrode structure 430 and a portion of Si substrate 426 on both sides of the gate electrode/gate dielectric stack structure. The NLDD implantation process may include any suitable NLDD implantation process known in the art. In one such embodiment, the test structure shown in FIG. 37 can be used to assess GOI impact due to the NLDD implantation process. For instance, the $J_g$ index or gate leakage of the test structure shown in FIG. 37 may be measured and used to assess the impact on GOI by the NLDD implantation process.

In a further embodiment, the gate structure includes a gate dielectric structure formed on the wafer. The gate dielectric structure may be configured as described herein. In one such embodiment, the plasma damage includes plasma damage of the gate dielectric structure due to one or more etch processes used to form one or more spacers on the gate structure. For example, after an NLDD implantation process described above is performed on the device structure configured similarly to the test structure shown in FIG. 34, one or more spacers (not shown) may be formed on side walls of the gate electrode/gate dielectric stack structure. For example, a first spacer may be formed on and in contact with the side walls of the gate electrode/gate dielectric stack structure. The first spacers may be formed of any suitable dielectric material known in the art such as a tetraethylorthosilicate (TEOS). A second spacer may be formed on and in contact with the outer side walls of the first spacers. The second spacers may be formed of any suitable dielectric material known in the art such as silicon nitride. The first and second spacers may have any suitable dimensions known in the art. In addition, the first and second spacers may have substantially the same dimensions or different dimensions. The first and second spacers may be formed using any suitable processes known in the art. For example, forming the first spacers may include depositing a dielectric material over a device structure configured similarly to the test structure shown in FIG. 34 and etching the dielectric material such that after the etch process the dielectric material remaining on the device structure is substantially limited to the dielectric material formed on the side walls of the gate electrode/gate dielectric stack structure.

In one such embodiment, such one or more spacers (not shown) may be formed on the side walls of the polysilicon finger pattern and polysilicon test area of the test structure shown in FIG. 37. The test structure shown in FIG. 37 may be further configured as described herein. In this manner, one or more electrical properties of the test structure shown in FIG. 37 such as $J_g$ index or gate leakage may be measured and used to assess the GOI impact due to the etch processes used to form the one or more spacers. The one or more measurements may be performed as described further herein.

After one or more spacers are formed on a device structure configured similarly to the test structure shown in FIG. 34, one or more ion implantation processes may be performed on the device structure. For example, the one or more ion implantation processes may include implanting N ions (not shown) into the gate electrode structure and implanting ions (not shown) into areas of the Si substrate proximate to the outer side walls of the one or more spacers to form the source and drain of the gate.

In one such embodiment, a test structure configured as shown in FIG. 37 on which the one or more spacers described above are formed may also be subject to the one or more ion implantation processes described above. In this manner, one or more electrical properties of the test structure shown in FIG. 37 such as $J_g$ index or gate leakage may be measured and used to assess the GOI impact due to the one or more ion implantation processes. The one or more measurements may be performed as described further herein.

Measuring the plasma damage of a test structure caused by a process provides important information in semiconductor device manufacturing. For example, existing methods for measuring dielectric film electrical properties are performed on blanket monitor wafers that are processed under the same conditions as the product wafers. In contrast, in the embodiments of the methods described herein, since the plasma damage can be measured in-die or on test structures formed on a patterned or product wafer, the plasma damage information may provide a much more meaningful and accurate measure of the plasma damage. The methods described herein may also include monitoring one or more parameters of the process using the index. Therefore, the index can be used to determine how much plasma damage has been caused by the process and to determine if the performance of the process is changing over time.

The method may also include altering one or more parameters of a process tool based on the index. The process tool is preferably the process tool that performed the process on the wafer. For example, the process tool may be an etch tool. The index may indicate that one or more parameters of the process tool should be altered and possibly how the one or more parameters of the process tool should be altered in order to correct the process. One or more parameters of the process tool may be altered in any manner known in the art. The one or more parameters of the process tool that are altered may include any parameters of the process tool and preferably any parameter(s) that affect plasma damage of the wafer. As such, the methods described herein provide a solution for in-line plasma process monitoring and plasma tool optimization. In addition, the methods described herein have an excellent time to results and are relatively inexpensive, particularly in comparison to other methods for assessing plasma damage of a wafer.

As described further above, the test structures that are used to assess plasma damage may be located at different positions on a wafer. In this manner, the plasma damage across the wafer may be assessed, which may also provide important information about the performance of the process. For example, if one portion of a layer is more damaged by a plasma process, the results of the methods described herein may indicate important non-uniformities in the process performance across the wafer. In addition, the test structures that are used to assess the plasma damage may include structures that are differently configured as described above. In this manner, different test structures may be used to assess different amounts of plasma damage that may be occurring on a single wafer in a single process.

The methods described above may also be used to assess damage of structures on a wafer caused by other processes. Examples of processes that can be evaluated, monitored, and altered as described above include processes that involve heating the wafer at relatively low temperatures. Any other processes that may cause damage to structures on a wafer may be evaluated, monitored, and altered as described above.

Figure 38:
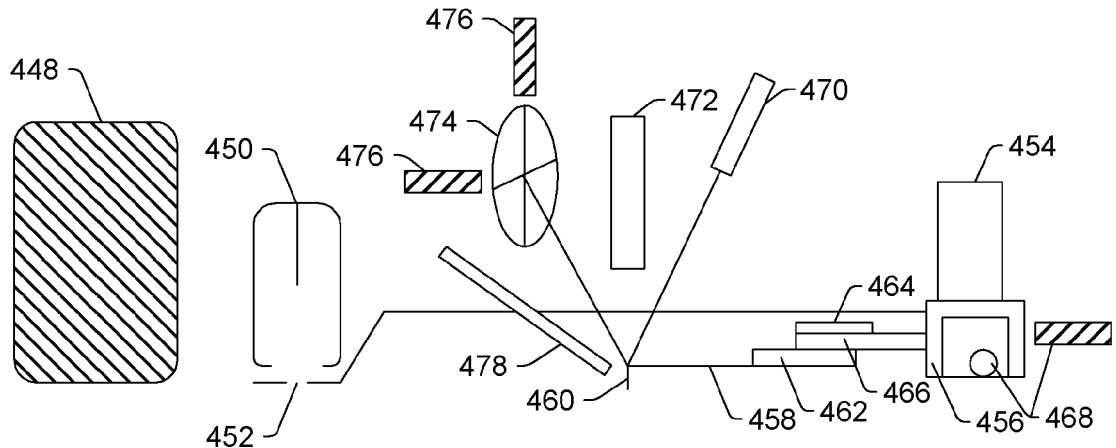
FIG. 38 is a schematic diagram illustrating a side view of one embodiment of a system that is configured to measure one or more electrical properties of a wafer.

FIG. 38 illustrates one embodiment of a system that is configured to determine a property of a wafer. The system may be used to measure one or more electrical properties of the test structures described herein. The system may also be used to measure one or more electrical properties of the test structures formed on a patterned or product wafer. In addition, the system shown in FIG. 38 may be used to measure the one or more electrical properties of a test structure for assessing plasma damage of a wafer as described above. The system is configured to measure the properties of the test structures or other structures on a wafer using a non-contact measurement technique.

The system may optionally include view optics 448. View optics 448 may be configured as dual magnification optics with magnifications of 5× and 15×. The magnification may be changed, however, within a range of 1× to 20×. The view optics may also include a relatively fast auto focus system that may be used for coarse approach. Actuation time may be less than about 0.5 seconds for auto focusing. The dual magnification may be used to perform deskew, as well as pattern recognition. For example, the view optics may include pattern recognition capability to locate structures on a wafer (not shown in FIG. 38). In this manner, view optics 448 may be configured to locate a predetermined measurement site on a wafer such that a focused spot and a measurement spot may be positioned proximate the predetermined measurement site. The predetermined measurement site may include one or more of the test pads and/or one or more of the test structures described herein.

As shown in FIG. 38, the system also includes corona source 450. Corona source 450 may be a high voltage corona source located in relatively close vicinity to a probe of the system. Aperture 452 may be held (and may be biased) in front of the corona source to reduce the spot size of the corona source. In this manner, corona source 450 may be a focused corona source such that the charge generated by the corona source is directed onto a focused spot. The focused spot may have lateral dimensions as described herein. Capacitive coupling of the aperture to the wafer may set the gap. The distance setting may be controlled by lift actuator 454. Fine position actuator 456 may be configured to control the relative position between the wafer and aperture 452. The corona source may be configured as a wire source, a blanket source, or a needle source. The corona source may be further configured as described herein.

In an alternative embodiment, the system may include a non-corona source (not shown) that is configured to deposit a charge on the specimen. Examples of appropriate non-corona sources include, but are not limited to, an electron beam source and an ion beam source. In addition, the system shown in FIG. 38 may include more than one source (not shown) that is configured to deposit a charge on the wafer. The charge deposition sources may include multiple sources of the same type (e.g., multiple corona sources), differently configured sources of the same type (e.g., differently configured corona sources), or different types of sources (e.g., a corona source and an electron beam source).

The system may also include a sensor such as a work function sensor, which may include a Kelvin Force Probe, an Electrostatic Force Probe, a Kelvin Force Probe based on an Electrostatic Force Detector or any other appropriate sensor such as a Monroe Probe and an atomic force microscopy (AFM) type probe. A Kelvin Force Probe is generally known in the art. Basically, the probe is sensitive to surface potential variations. In one example, the probe includes oscillating cantilever 458. Relatively dull tip 460 is coupled to cantilever 458 at a far end of the cantilever. Tip 460 may have a diameter of about 5 µm to about 50 µm. Such a probe may provide advantages over normal Electrostatic Force microscope detectors, which are based on AFM technology. For example, the tip of an AFM is required to be extremely sharp. Therefore, a radius of such a tip may not be controlled reproducibly. Alternatively, because a tip of the probe described above is relatively dull, a radius of the tip may be controlled reproducibly. In addition, due to the larger radius of the tip, a better signal to noise ratio may be expected for electrostatic force measurements than measurements of a probe of an AFM. In an alternative embodiment, the probe may have an elastically deformable conductive tip. An example of such a probe is illustrated is PCT Application No. WO 01/29568 A1 to Mazur et al., which is incorporated by reference as if fully set forth herein. The work function sensor may be used for non-contact voltage measurements as described herein. In addition, the work function sensor may be used for contact voltage measurements.

The other end of the cantilever is coupled to carrier base 462. The carrier base may be removable and may reside on a kinematical mounted base. The cantilever may also be coupled to bimorph piezoelectric actuator (PZT) 464, which may drive the cantilever at a resonance of, for example, about 100 kHz to about 500 kHz, or about 300 kHz. In addition, PZT 464 may drive the cantilever such that the voltage measurements can be performed at a frequency of about 0 MHz to about 1 MHz. Therefore, the voltage measurements may be performed across a substantially broad range of frequencies. Different frequencies may be used for voltage measurements of different structures. For instance, voltage measurements performed at relatively high frequencies may be particularly suitable for test structures having relatively small dimensions (e.g., a critical dimension (CD) of device structures formed on the wafer). The probe tip may be arranged proximate to a surface of the wafer. For example, the probe tip may be arranged about 1 µm away from the surface of the wafer. The system may include stacked PZT 466, which is configured to move the probe away from or towards the wafer.

The system may also include coarse positioning actuators 468 coupled to the cantilever. Coarse actuators 468 may be configured to alter a location of laser 470 on the back surface of the cantilever. An example of appropriate coarse actuators may include, but are not limited to, v-focus motors that may be turned off while retaining their location. The system may also include optical viewing system 472, which may provide output signals to actuators 468. For example, optical viewing system 472 may be used to detect a position of the probe relative to the laser and provide an output signal responsive to the relative positions to the actuators. An example of an appropriate optical viewing system may include an infrared charge-coupled device (CCD) camera, which may be configured to detect light having wavelengths from about 400 nm to about 2 µm. Filters may also be coupled to the camera to select the wavelengths of light that may be detected by the camera. In this manner, optical viewing system 472 and actuators 468 may be used to automatically position the probe under laser 470. Furthermore, by positioning laser 470 on the backside of the cantilever, light from the laser may impinge upon the cantilever but not upon the wafer. In addition, the cantilever may have a substantially reflective surface such that light from the laser does not pass through the cantilever. For example, the surface of the cantilever may be coated with aluminum.

Upon capacitive coupling of the tip with the surface of the wafer, the oscillation frequency and phase of movement of the probe may vary. The shift in the oscillation frequency and phase may be proportional to a surface potential of a test structure formed on a wafer. The system also includes detector 474. Detector 474 may be configured to detect light from laser 470 reflected from the back surface of the cantilever. In this manner, the detector may detect changes in the reflected light due to changes in the oscillation frequency and phase of the probe. An appropriate detector may include, but is not limited to, a Quad detector and a piezoresistive element. Coarse positioning actuators 476 may be coupled to detector 474. Coarse positioning actuators 476 may be configured to alter a location of detector 474 to increase the detector signal. An example of appropriate coarse positioning actuators may include, for example, v-focus motors which can be turned off while retaining their location. Alternatively, laser 470 and detector 474 may be replaced with a tuning fork. A tuning fork may be configured to measure a shift in the position of the cantilever relative to free space.

The system shown in FIG. 38 may also include focused light source 478. Focused light source 478 may include a laser having a predetermined spot size. Alternatively, focused light source 478 may include any light source known in the art coupled to one or more other optical elements such as lenses. The other optical elements may be configured to alter and/or reduce a spot size of the light source. In this manner, the focused light source may be configured to generate a photovoltage within a focused spot on a wafer. Focused light source 478 may over illuminate the specimen/probe junction. The light source may be configured to provide a pulsed or substantially continuous beam of light. Broadband, multi-wavelength, or multiple light sources may be used to deliver multiple frequencies of light to the junction.

The Kelvin Force Probe sensor may be substantially transparent to light wavelengths used for inducing photovoltage effects in the wafer. For example, wavelengths of about 1.3 µm may be selected to induce a photovoltage in the wafer. Therefore, instead of side illumination shown in FIG. 38, the light source may be configured to direct light through Kelvin Force Probe tip 460. In case of either side or top illumination, the probe material or its physical arrangement may be selected such that the probe itself is not affected by light from light source 478. In this manner, light source 478 may not cause a photovoltage in the probe thereby reducing unwanted biasing of the probe. A timing of the measurement may be selected such that any possible probe self-induced photovoltage effects may be neglected. In addition, selecting a probe material with appropriate doping levels, for example, may control the probe self-induced photovoltage timing. The effects of a probe photovoltage may be modeled, and the effect of this photovoltage on the measurements may be determined. In this manner, the measurement may be corrected for such a photovoltage. The voltage measurements performed by the system may be collected in a point format or a map format. In other words, the voltage measurements may be performed at specific sites on a wafer, or the system may scan across the wafer during voltage measurements.

Systems and methods described further herein may be used to enhance the performance of a contactless charge-based measurement system for patterned wafers. The systems and methods described herein may be used in combination with systems and methods described in commonly assigned U.S. patent application Ser. No. 10/701,112 filed Nov. 4, 2003, by Samsavar et al., issued as U.S. Pat. No. 7,248,062 on Jul. 24, 2007, which is incorporated by reference as if fully set forth herein. The enhancements described herein include improvements to the corona source, Kelvin probe, measurement chamber, preparation and control of the wafer surface, surface photovoltage (SPV) measurements, and combinations of the contactless charge-based measurements with other analytical modules to characterize one or more properties of a product wafer.

Figure 39:
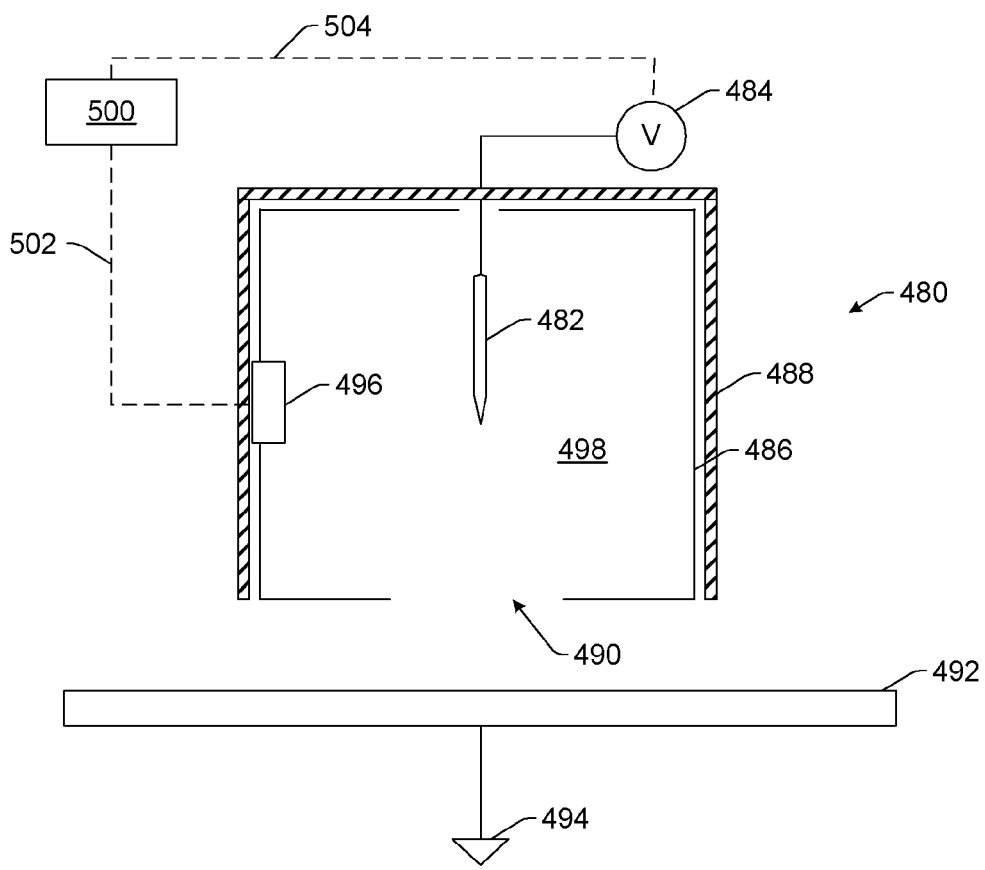
FIGS. 39-40 are schematic diagrams illustrating a cross-sectional view of different embodiments of a system that is configured to control deposition of a charge on a wafer for measuring one or more electrical properties of the wafer.

One embodiment of a system that is configured to control deposition of a charge on a wafer for measuring one or more electrical properties of a wafer is illustrated in FIG. 39. As shown in FIG. 39, the system includes corona source 480 that is configured to deposit the charge on the wafer. The corona source may include needle 482 coupled to voltage source 484. The corona source may also include one or more conductive electrodes such as conductive electrodes 486. Each of the electrodes may be maintained at a different voltage, or each of the electrodes may be maintained at substantially the same voltage. Alternatively, the conductive electrodes may be replaced with insulators. The corona source may also optionally include insulator 488, which may surround the conductive electrodes (or alternative insulators) and needle 482. In such configurations, corona species may exit the source through opening 490, or deposition aperture, and charged ions may be deposited onto a surface of a wafer (not shown) disposed proximate the opening. For example, the wafer may be disposed upon chuck 492, which may be coupled to grounding contact 494, and may be further configured as described above. The terms "chuck" and "stage" are used interchangeably herein.

The system also includes sensor 496 that is configured to measure one or more conditions within the corona source. In one embodiment, the one or more conditions that are measured by sensor 496 include one or more properties of one or more chemical species (not shown) in the corona source. In addition, the system may include one or more sensor elements integrated in discharge chamber 498 of corona source 480 to monitor the species in the corona source. One example of an appropriate sensor for monitoring one or more chemical species in the corona source includes a thin or thick film gas sensor. Such a sensor may include a heating element (not shown) to enhance the performance of the sensor. Different sensors may be included in the corona source, and each of the different sensors may be configured to measure one or more properties of different gases.

The system includes control subsystem 500 that is configured to alter one or more parameters of the corona source based on the one or more conditions. For example, control subsystem 500 is coupled to sensor 496 by transmission medium 502. The transmission medium may include any appropriate transmission medium known in the art. In addition, one or more components (not shown) may be interposed between the sensor and the control subsystem such as an analog-to-digital converter. Control subsystem 500 may also be coupled to one or more components of the corona source. For instance, as shown in FIG. 39, control subsystem 500 may be coupled to voltage source 484 by transmission medium 504. This transmission medium may also include any appropriate transmission medium known in the art. The control subsystem may be coupled to one or more other components of the corona source in a similar manner. The control subsystem is configured to receive signals from sensor 496 and any other such sensors included in the system and to adjust one or more operating parameters of the corona source. Operating parameters that may be altered by the control subsystem may include, but are not limited to, discharge voltage, voltages on the focusing elements of the corona source (not shown in FIG. 39), and gas composition in discharge chamber 498.

Figure 40:
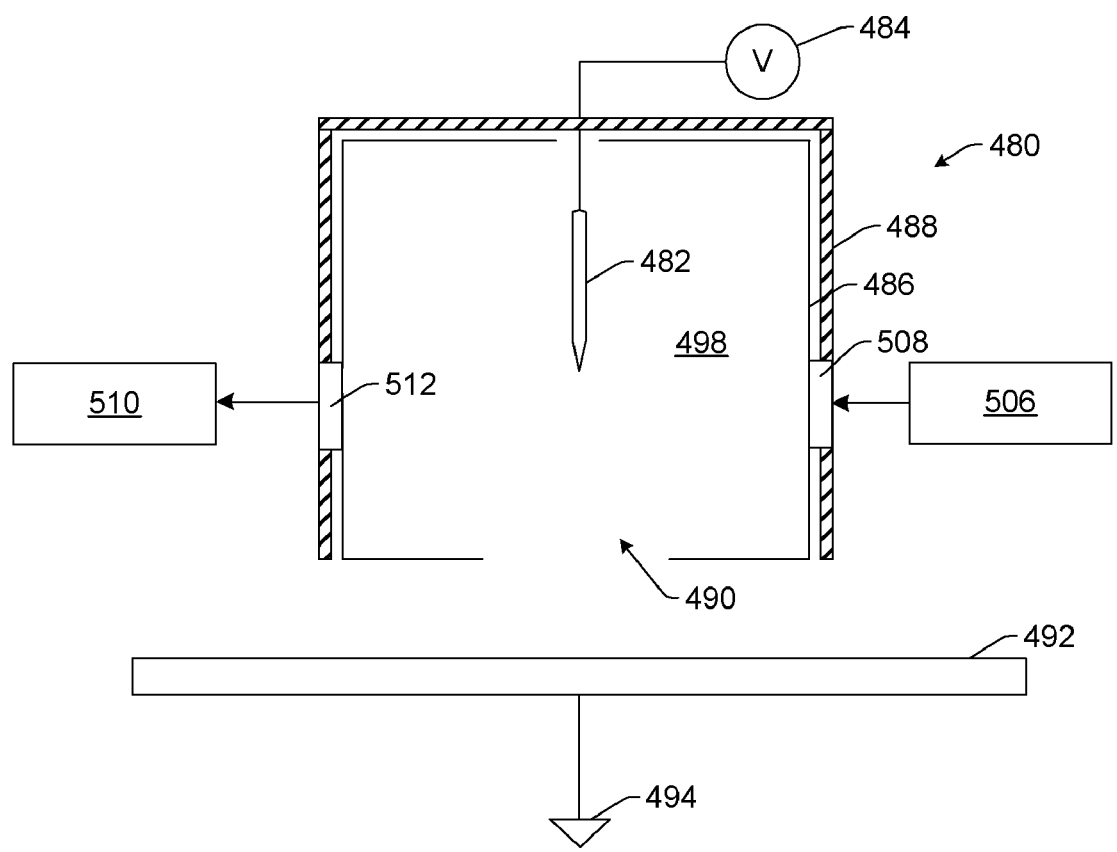

Another embodiment of a system that is configured to control deposition of a charge on a wafer for measuring one or more electrical properties of the wafer is illustrated in FIG. 40. As shown in FIG. 40, the system includes corona source 480, which may be configured as described above. For example, the corona source may include needle 482 coupled to voltage source 484, conductive electrodes 486, insulator 488, and opening 490. The systems also includes chuck 492 coupled to grounding contact 494, which may be further configured as described above.

In this embodiment, the system includes a sensor that is not disposed within the discharge chamber of the corona source. Instead, this embodiment of the sensor is configured to measure the one or more conditions in the corona source using an optical technique. In particular, the sensor includes light source 506, which is configured to direct light into discharge chamber 498 through window 508 disposed within an opening formed in insulator 488 and conductive electrodes 486. Window 508 may be formed of a material that will transmit a relatively large portion of the light generated by the light source. The material of the window may be selected such that the window may or may not alter one or more characteristics (e.g., polarization) of the light from the light source. The light source may include any suitable light source known in the art. For instance, the light source may be selected such that the light is at least partially absorbed by the one or more chemical species in discharge chamber 498.

The sensor also includes detector 510, which is configured to detect light transmitted through window 512. Window 512 may be configured as described above and may be disposed within an opening formed in insulator 488 and conductive electrodes 486. The detector may include any appropriate detector known in the art and may vary depending on the type of measurements that are performed. The sensor may be configured to monitor one or more conditions in the corona source using any appropriate technique known in the art such as atomic emission spectroscopy, laser-induced fluorescence, and Fourier Transform Infrared (FTIR) spectroscopy.

The sensor shown in FIG. 40 may include a number of additional optical components (not shown) such as, but not limited to, mirrors, lenses, and any other suitable refractive and/or reflective optical components known in the art. In the embodiment shown in FIG. 40, the light is coupled to and from the corona source through free space propagation. However, the sensor may include one or more fiber optics components that are configured to couple the light to and from the corona source.

In the embodiment shown in FIG. 40, the body of the corona source includes optical windows that can be used to monitor the chemical composition of the discharge of the corona source. However, in some embodiments, these optical windows may be eliminated from the corona source body. In such embodiments, the materials of the corona source body and/or the wavelengths at which the light source and the sensor operate may be selected such that light may be transmitted through the body of the corona source.

The system shown in FIG. 40 includes a control subsystem (such as that shown in FIG. 39), which is coupled to the optical sensor. In particular, the control subsystem may be coupled to detector 510 by a transmission medium as described above. In this manner, the control subsystem may be configured to receive output from detector 510, which is representative of one or more conditions in the corona source such as one or more properties of one or more chemical species in the corona source. In addition, the control subsystem may be configured to alter one or more parameters of the corona source based on the output from the detector. The control subsystem may be configured to alter one or more of the parameters described above in response to the output. In this manner, results of spectroscopic analysis may be used to adjust one or more operating parameters of the corona source. Operating parameters that may be altered by the control subsystem may include, but are not limited to, discharge voltage, voltages on the focusing elements of the corona source (not shown in FIG. 40), and gas compositions.

In another embodiment, the system may include an optical subsystem that is configured to control a reaction in the corona source. The optical subsystem may include light source 506 and window 508. The light source and the window may be configured as described above. In some embodiments, the light source and the window may also be used to monitor the one or more conditions in the corona source as described above in combination with window 512 and detector 510. In some such embodiments, the light source may have selectable characteristics such as wavelength such that different wavelengths can be used for monitoring and reaction control. Alternatively, the optical subsystem may include one or more optical components (not shown) such as filters that can be used to select the one or more characteristics of the light that is transmitted into the discharge chamber of the corona source for monitoring and reaction control. In another alternative, the optical subsystem may include two light sources (not shown) both of which are configured to direct light into the discharge chamber of the corona source through window 508. One of the light sources may be used for reaction control, and the other light source may be used for monitoring one or more conditions in the discharge chamber. In this manner, the light that is transmitted into the discharge chamber may be used to photo-initiate one or more chemical reactions. Light sources that are suitable for photo-initiating one or more chemical reactions in the discharge chamber of the corona source include, but are not limited to, pulsed or continuous (CW) lasers (tunable or fixed frequency) and pulsed or CW broadband sources. The reactions that are photo-initiated in this manner may include any suitable reactions known in the art.

Figure 41:
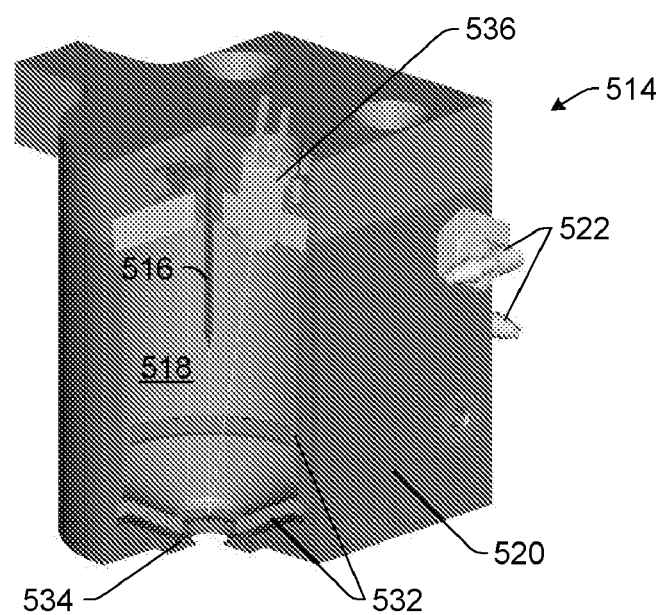
FIGS. 41-43 are schematic diagrams illustrating a perspective view of different embodiments of a corona source that is configured to deposit a charge on a wafer.
Figure 42:
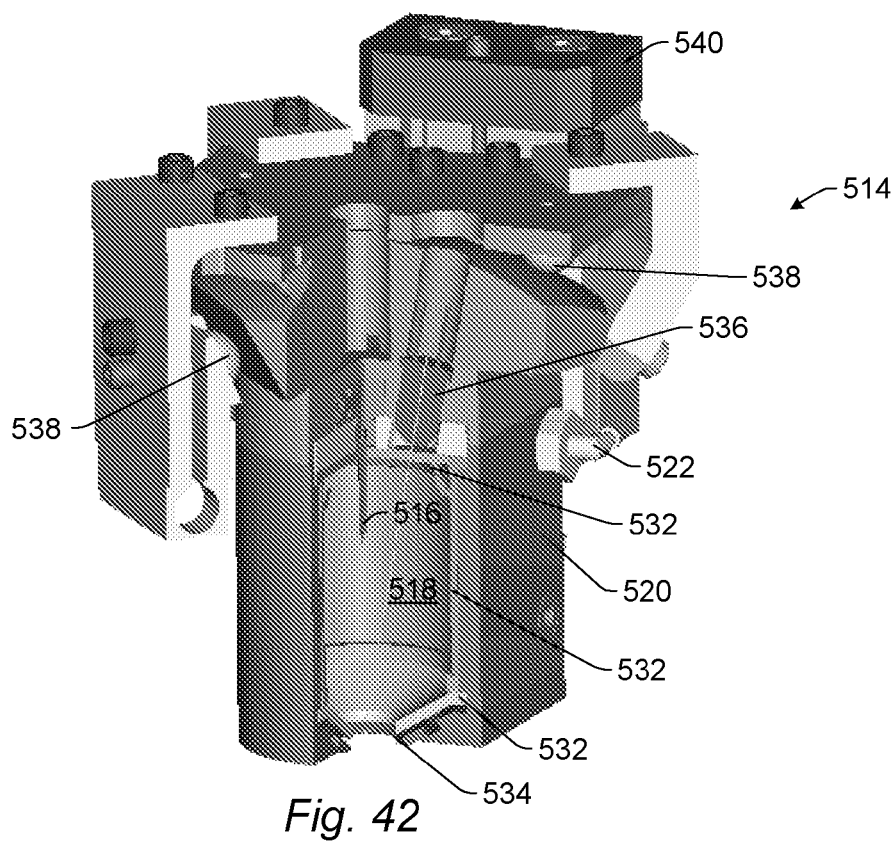
Figure 43:
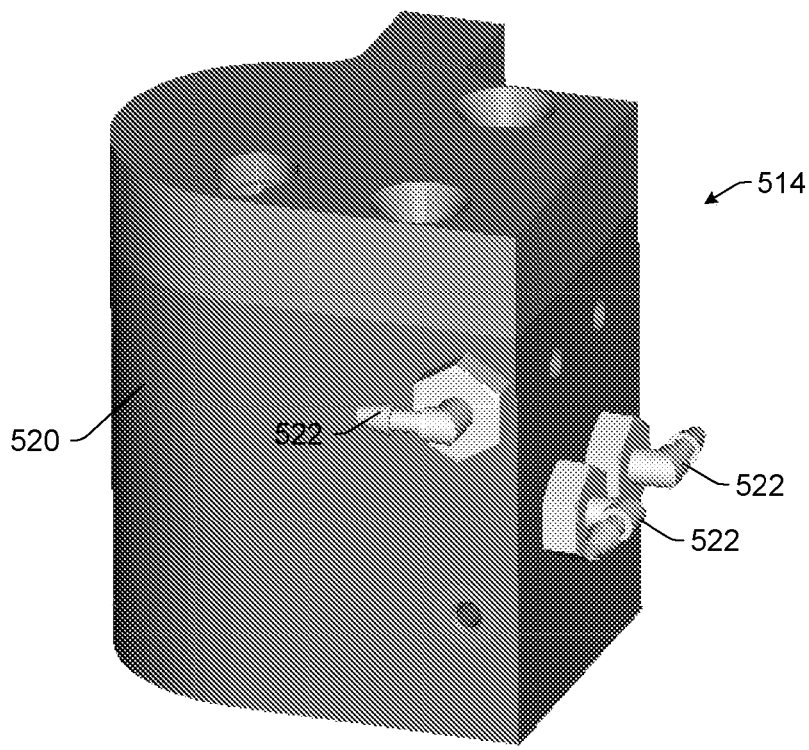

In some embodiments, the one or more parameters of the corona source that are altered based on the one or more conditions measured by the sensor include one or more parameters of one or more gas flow devices coupled to the corona source. FIGS. 41-43 illustrate one embodiment of a corona source coupled to gas flow devices, of which one or more parameters may be altered by the control subsystem described above. In particular, corona source 514 includes needle 516, which may be configured as described above. The needle is disposed within discharge chamber 518 within housing 520. Ports 522 are coupled to housing 520 such that gases may be introduced into or removed from discharge chamber 518 through the ports. As shown in FIGS. 41-43, three ports are coupled to the housing of the corona source. However, any suitable number of ports may be coupled to the housing of the corona source. For example, in the embodiments shown in FIGS. 41-43, two of the ports coupled to the housing may include one for introduction of one or more gases and one for exhaust of one or more gases in the discharge chamber. Alternatively, more than one port may be coupled to the housing, each of which is used for introduction of different gases to the discharge chamber. The third port shown in FIGS. 41-43 may be used for creating a vacuum in the discharge chamber.

In the embodiments shown in FIGS. 41-43, therefore, the chemistry of the corona discharge may be controlled by adding ports to the corona source for the entrance and exhaust of gases from the corona source. The locations of the ports can be arranged to optimize flow of the gases in the corona source, minimize turbulence, and/or achieve substantially homogeneous distribution of chemical species in the discharge chamber. A diffuser component (not shown) may be added to the corona source to achieve these results as well. One or more gases may be added to the discharge chamber of the corona source.

Examples of gases that may be introduced to the discharge chamber include, but are not limited to, nitrogen ($N_2$), clean dry air (CDA), forming gas (FG), oxygen ($O_2$), carbon monoxide (CO), carbon dioxide ($CO_2$), ammonia ($NH_3$), silane ($SiH_4$), chlorine ($Cl_2$), hydrogen chloride (HCl), one or more inert gases (e.g., helium (He), argon (Ar), krypton (Kr), xenon (Xe), etc.), and one or more organic gases (e.g., methane ($CH_4$), ethane ($C_2H_6$), tetramethylcyclotetrasiloxane ($C_4H_{16}O_4Si_4$; commonly referred to as "Tomcats"), octamethylcyclotetrasiloxane ($C_8H_2O_4Si_4$; commonly referred to as "Omcats"), etc.). Tomcats and Omcats are commercially available from Air Products and Chemicals, Inc., Allentown, Pa. Additionally, a gas may be passed over or bubbled through a vessel (not shown) containing liquid or solid organic, organometallic, or inorganic chemicals. A temperature control unit can surround the vessel to control the vapor pressure of the chemicals. These gases may enter the discharge chamber singly or in combination.

In one embodiment, therefore, a system configured to control deposition of a charge on a wafer for measurement of one or more electrical properties of the wafer includes a corona source, which may be configured as described further herein. One such embodiment of the system also includes a mixture of gases disposed within a discharge chamber of the corona source during the deposition of the charge. The mixture of gases may be produced in the discharge chamber of the corona source as described further herein. The mixture of gases alters one or more parameters of the charge deposited on the wafer. In other words, the presence and one or more properties of the mixture of gases in the discharge chamber may be used to control one or more parameters of the deposited charge such as, but not limited to, lateral diffusion of the charge on the surface of the wafer.

In one embodiment, the mixture includes $CO_2$ and Kr. In another embodiment, about 65 volume % to about 85 volume % of the mixture includes $CO_2$, and about 15 volume % to about 35 volume % of the mixture includes Kr. In a further embodiment, about 75 volume % of the mixture includes $CO_2$, and about 25 volume % of the mixture includes Kr. Such a mixture of gases suitable for use in the systems and methods described herein is commercially available from U.S. Airgas, Inc., Radnor, Pa., as part No. X02CD75CA840L6. This gas mixture is advantageous in that it is substantially homogeneous and will not substantially stratify. Furthermore, the mixture of gases may also or alternatively include any other gases described herein.

A broad range of flow rates and pressures may be used to move gases to and from the discharge chamber, and the parameters of gas flow may be controlled using any method and devices (not shown) known in the art (examples include, but are not limited to, needle valves and mass flow controllers). The gas flow devices may also include a manifold (not shown) and mixing chamber configured to combine gases prior to delivery of the gases to the corona source. In addition, the gas flow devices may include one or more mixing chambers coupled to an inlet of the corona source. The one or more mixing chambers are configured to mix the one or more chemical species prior to introduction of the one or more chemical species to the corona source.

Figure 44:
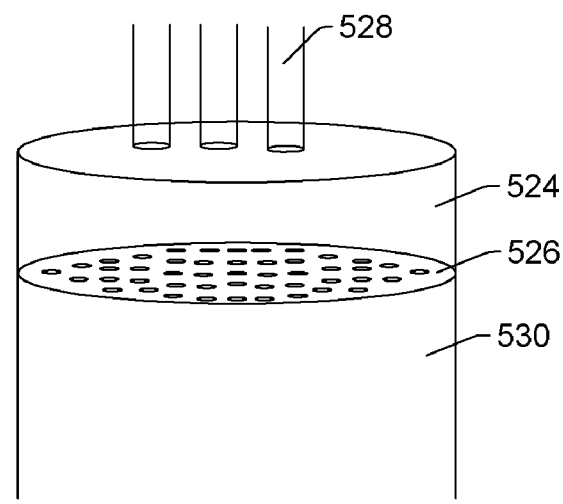
FIG. 44 is a schematic diagram illustrating a side view of one embodiment of a mixing chamber that can be coupled to an inlet of a corona source.

FIG. 44 illustrates a schematic side perspective view of one example of a mixing chamber that may be used as a gas flow device in the systems described herein. As shown in FIG. 44, mixing chamber 524 is coupled to showerhead distributor 526, which may also function as a diffuser as described above. One or more gases may be fed into mixing chamber 524 via one or more tubes 528. The one or more gases may mix in mixing chamber 524 due to the variations between the diameter of the mixing chamber and the diameters of the tubes. The mixed gases may flow from mixing chamber 524 through showerhead distributor 526 to a corona source coupled to an end of tube 530 downstream of the showerhead distributor. For example, tube 530 may be coupled to one of ports 522 shown in FIGS. 41-43. The mixing chamber may contain a temperature control unit (not shown). The gas flow devices described herein may also be configured to pass the gas(es) through one or more components (not shown) such as a filter, molecular sieves, and/or desiccant prior to delivery of the gas(es) to the discharge chamber. For example, such components may be disposed within tube 530 shown in FIG. 44, which may be coupled to ports 522 shown in FIGS. 41-43.

As further shown in FIGS. 41 and 42, corona source 514 may include one or more shielding components 532 disposed within the corona source. The one or more shielding components are configured to prevent interaction between a plasma generated in the corona source and components of the corona source. In this manner, the corona source body may include protective shielding components configured to prevent interaction of the corona plasma with metal or plastic components in the corona source. Examples of materials that could be used for the shielding component(s) include, but are not limited to, quartz and ceramic.

In a different embodiment, shielding components 532 may be replaced with a coating formed on surfaces of one or more components of the corona source. The surfaces are internal to the corona source. The coating may be selected to alter the one or more conditions within the corona source. In some such embodiments, the body, needle, and/or focusing elements of the corona source may be plated or coated. Examples of suitable plating/coating materials include, but are not limited to, copper, gold, platinum, palladium, nickel, rhodium, silver, zinc, and magnesium. The coating may enhance the discharge stability or the production or removal of chemical species in the corona source. In some embodiments, the corona source may include both shielding components and a coating. Some components of the corona source may protected by one or more shielding components while other components of the corona source may be coated with one or more of the materials described above. In another alternative, the shielding components shown in FIGS. 41 and 42 may have a coating formed thereon. Therefore, the shielding components in combination with a coating on the shielding component(s) may be used to both protect the corona source and to enhance the charge stability or production or removal of chemical species in the corona source.

Additional components may be included in the corona source as shown in FIGS. 41 and 42. For example, corona source 514 may include aperture 534. The aperture may be configured to define the size of the area on the wafer on which charge is deposited by the corona source. In addition, corona source 514 may include light source 536. Light source 536 may include, in some embodiments, a light emitting diode (LED) or any other suitable light source that can be used to illuminate the wafer during deposition. An LED may be particularly suitable for inclusion in the corona source due to the relatively small size of the LED.

As shown in FIG. 42, the corona source may be coupled to spherical bearings 538, which may be used for alignment of the corona source. In addition, the corona source may be coupled to positioning device 540, which may be configured to alter a position of the corona source with respect to the wafer on which the charge is being deposited. In some embodiments, the position of the corona source with respect to the wafer (i.e., the height of the corona source) may be measured using a front surface of aperture 534 as a capacitive sensor. In this manner, the control subsystem described above may be coupled to aperture 534 and may be configured to control positioning device 540 based on the aperture to adjust and control the position of the corona source. The control subsystem may be coupled to the aperture and the positioning device as described above.

Figure 45:
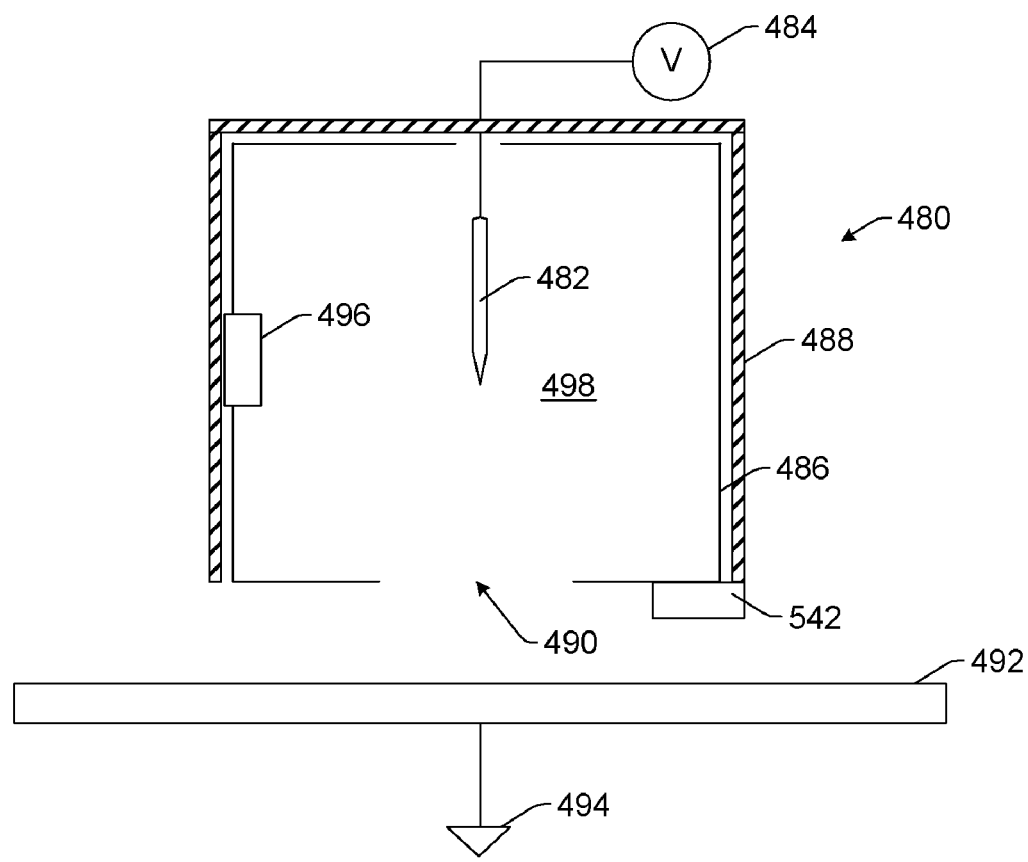
FIGS. 45-46 are schematic diagrams illustrating a cross-sectional view of various embodiments of a system that is configured to control deposition of a charge on a wafer for measurement of one or more electrical properties of the wafer.

In a different embodiment, the system may include an additional sensor that is configured to measure a position of the corona source with respect to the wafer. One embodiment of such a sensor is illustrated in FIG. 45. As shown in FIG. 45, sensor 542 may be coupled to a lowermost surface of the corona source. However, the position of the sensor with respect to the corona source may be varied depending on, for example, the configuration of the sensor. The sensor may be a capacitive sensor, an accelerometer, a laser interferometer, or any other suitable sensor known in the art. In some embodiments, the system may be configured to use both aperture 534 (shown in FIGS. 41-42) and sensor 542 to monitor a height of the corona source. In any case, the height of the corona source may be monitored and altered to maintain a particular height during charge deposition. In particular, the aperture and/or sensor 542 may be used to monitor changes in the height of the corona source due to vibration or other external disturbances, and the control subsystem may be configured to compensate for such disturbances to maintain a substantially constant corona source height during deposition. In some such embodiments, the control subsystem shown in FIG. 39 may be coupled to sensor 542 shown in FIG. 45 and may be configured to control positioning device 540 shown in FIG. 42 based on output from sensor 542. The system shown in FIG. 45 may be further configured as described herein with respect to the system shown in FIG. 39 or any other embodiments described herein.

In some embodiments, one or more of the sensors described herein may be configured to measure a temperature within the corona source. For example, sensor 496 shown in FIGS. 39 and 45 may be configured to measure a temperature within discharge chamber 498 of corona source 480. The control subsystem may be configured to alter a temperature within discharge chamber 498 based on output of the temperature sensor. For example, the control subsystem may be coupled to one or more temperature control devices (not shown), which may be used to alter and/or control a temperature within the discharge chamber. The temperature control device(s) may include, for example, one or more resistive heating elements and/or one or more cooling coils (through which liquids such as water, ethylene glycol, and liquid nitrogen may flow). Such temperature control devices may be coupled to a body of the corona source.

Figure 46:
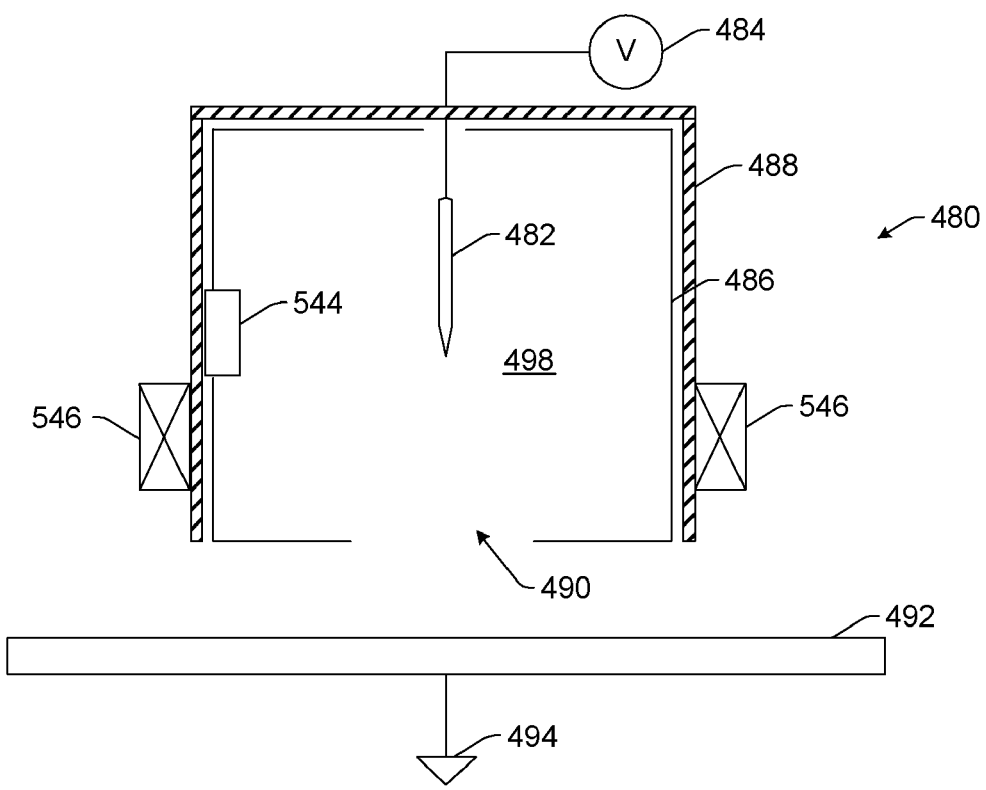

In additional embodiments, the system may include one or more sensors that are configured to measure one or more properties of a magnetic field in the corona source. In such embodiments, the one or more parameters of the corona source that are altered by the control subsystem may include one or more parameters of a magnetic device coupled to the corona source. One example of such an embodiment is illustrated in FIG. 46. In this example, the system includes sensor 544, which is disposed within corona source. Sensor 544 is configured to measure one or more properties of a magnetic field in the corona source. In this manner, the sensor may be disposed in any location within or proximate to the corona source such that the properties of the magnetic field in the corona source can be measured. For example, the magnetic sensor may be disposed external to the corona source in a magnetic fringe field area of the magnetic field proximate to opening 490 through which charge is deposited on a wafer disposed on stage 492. The magnetic sensor may include any appropriate sensor known in the art such as a Hall effect sensor.

The control subsystem described herein may be coupled to sensor 544. In addition, the system may include magnetic device 546 coupled to corona source 480. In this example, the magnetic device is coupled to an external surface of the corona source. However, the magnetic device may be disposed within the body of the corona source. Magnetic device 546 may include, for example, one or more permanent magnets and electromagnetic coils. The control subsystem may be configured to alter one or more parameters of magnetic device 546 based on output of sensor 544. In this manner, the system may include one or more elements configured to vary and control the magnetic field in the corona source preferably to enhance the charge deposition characteristics. For example, the magnetic field may be used to focus the charge deposition on the wafer and/or to increase ionization efficiency of the species in the corona source. The system shown in FIG. 46 may be further configured as described herein.

The systems described above that are configured to control deposition of a charge on a wafer for measurement of one or more electrical properties of the wafer provide the ability to adjust and control the discharge, to enhance or suppress the production of one or more species, to control lateral motion of charges on the wafer surface, to enhance the safe operation of the corona source, to enhance the reliability and/or lifetime of the corona source, and to prepare, passivate, and/or modify the surface of the wafer as described further herein. One or more parameters of the corona source may be altered as described above before a charge deposition is performed by the corona source. In addition, if multiple charge depositions are performed for a measurement, the parameter(s) of the corona source may be altered between the charge depositions. Furthermore, it is possible to control one or more parameters of a corona source as described herein during deposition.

Although embodiments are described herein with respect to a corona source, it is to be understood that the systems described herein may include a different charge deposition source (e.g., a glow discharge, hot and cold cathode discharges, filament discharges, etc.). The systems described herein may also be configured to control deposition of a charge on a wafer by controlling such deposition sources, which may be performed as described herein.

Figure 47:
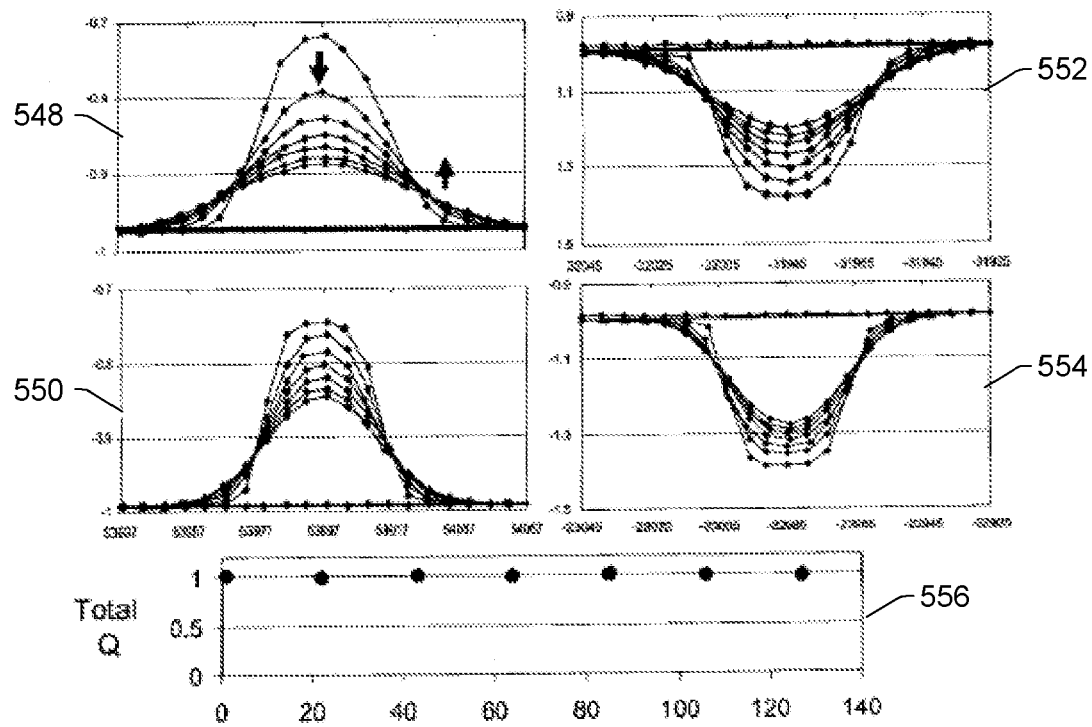
FIG. 47 includes a number of plots illustrating how lateral diffusion of a charge deposited on a wafer varies depending on one or more conditions within a corona source.

One example illustrating how the lateral motion of charge deposited on a surface can be controlled is shown in the graphs of FIG. 47. In particular, charge was deposited on a wafer with different gases in the discharge chamber of a corona source. Both positive and negative charges were deposited on the wafer, and the voltage was measured across the charge deposition area. The graphs illustrate voltage measurement as a function of position within the charge deposition area at different times. The different gases in the discharge chamber during charge deposition are CDA and carbon dioxide.

As shown by comparison between plot 548 for negative charge depositions on a wafer while CDA was in the discharge chamber and plot 550 for negative charge depositions on the wafer while carbon dioxide was in the discharge chamber, the lateral diffusion of the charge on the surface of the wafer was lower when carbon dioxide was in the discharge chamber during charge deposition. In particular, as shown in plot 548, the voltage measurements near the center of the charge deposition area decrease dramatically over time while the voltage measurements proximate the edge of the charge deposition area increase dramatically over time. In contrast, in plot 550, the voltage measurements at different points across the charge deposition area change relatively little over time indicating much less lateral diffusion of the charge than in plot 548.

Similar results were observed for positive charges. In particular, plot 552 of voltage measurements performed after a positive charge was deposited on the wafer while CDA was in the discharge chamber illustrates relatively large changes in the voltage measurements at different points across the charge deposition area over time. Therefore, a relatively large amount of lateral diffusion was observed for a positive charge deposition performed with CDA in the discharge chamber of the corona source. In contrast, plot 554 of voltage measurements performed after a positive charge deposition on the wafer while carbon dioxide was in the discharge chamber illustrates that the voltage measurements across the charge deposition area charged very little over time indicating very little lateral diffusion of the charge. As shown in plot 556, the amount of charge that was deposited for the measurements shown in plots 548, 550, 552, and 554 was substantially constant over time. In this manner, the plots shown in FIG. 47 indicate that controlling the gas in the discharge chamber of the corona source can be used to alter and control the lateral diffusion of a charge deposition on the wafer. The gas in the discharge chamber can be altered and controlled using the systems described above.

Figure 48:
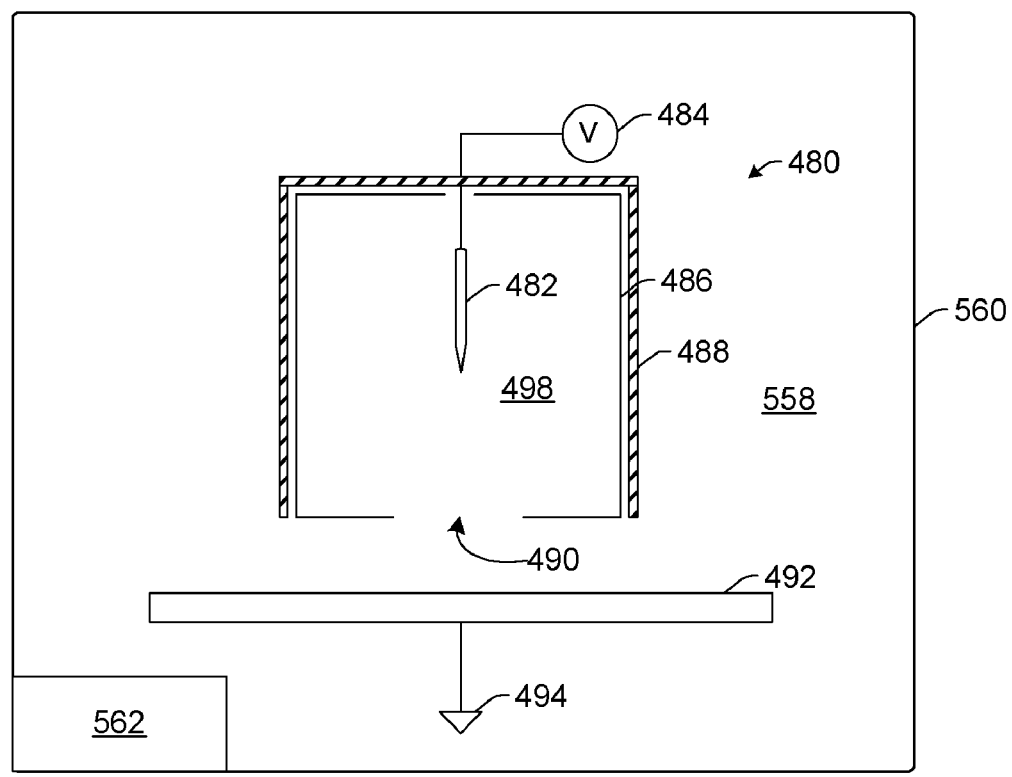
FIG. 48 is a schematic diagram illustrating a cross-sectional view of another embodiment of a system that is configured to control deposition of a charge on a wafer for measurement of one or more electrical properties of the wafer.

In another embodiment, the control subsystem described above may be configured to control one or more parameters of a measurement chamber in which the corona source is disposed. FIG. 48 illustrates one such embodiment of a system that is configured to control parameter(s) of a measurement chamber. As shown in FIG. 48, corona source 480, which may be configured as described with respect to FIG. 39, is disposed within measurement chamber 558. In addition, stage 492 may be disposed within measurement chamber 558. In this manner, the measurement chamber may be used to control the environment around the wafer on which a charge is being deposited. In particular, the measurement chamber includes housing 560, which may substantially surround the corona source and the stage during charge depositions to substantially prevent any fluctuations in the ambient conditions outside of the measurement chamber from affecting the charge depositions. Such a measurement chamber may also be configured to provide relatively stable conditions for the environment surrounding the corona source thereby making control and alteration of the parameters of the corona source more predictable.

In some currently used systems, the conditions within the measurement chamber may not be controlled, and the measurement chamber may still provide some benefits for the charge deposition and measurements. However, it may be advantageous to control one or more conditions within the measurement chamber to provide further stability for the charge depositions and measurements. In one such embodiment, the system may include sensor 562. As shown in FIG. 48, sensor 562 may be included in measurement chamber 558. In this manner, the sensor may be directly exposed to one or more conditions in the measurement chamber such that substantially accurate measurements of the condition(s) may be acquired. In addition, the system may include one or more such sensors, each of which may be disposed in the measurement chamber. Each of the different sensors may be used to measure a different condition in the measurement chamber (e.g., one sensor for temperature, one sensor for humidity, etc.). Each of the sensors included in the system may be coupled to a control subsystem such as that shown in FIG. 39 and described further above. In addition, the control subsystem may be coupled to one or more components (not shown) of the measurement chamber as described above such as one or more gas flow devices coupled to the measurement chamber to alter and control the conditions in the measurement chamber by altering one or more parameters of such components. The gas flow devices may be configured as described above.

In this manner, the system may be configured to control one or more conditions within the measurement chamber in a number of different ways. For example, the sensor and control subsystem may form a temperature control unit that is configured to maintain a substantially constant temperature in the measurement chamber. The temperature in the measurement chamber may be above, below, or substantially the same as the ambient temperature outside of the measurement chamber. In another example, the sensor and the control subsystem may form a humidity control unit that is configured to maintain a relatively constant humidity in the measurement chamber. The measurement chamber humidity may be above, below, or substantially the same as the ambient humidity outside of the measurement chamber.

In an additional example, the sensor, the control subsystem, and one or more gas flow devices coupled to the measurement chamber may be configured to control the flow of one or more gases into the measurement chamber. The gases may include, but are not limited to $N_2$, CDA, $O_2$, or inert gases such as those described above. The gases may be introduced singly or in combination. In addition, the gas flow devices may be controlled by the control subsystem to evacuate the gases from the measurement chamber. The gas flow devices may be configured as described above. For example, the gas flow devices may be configured to substantially maximize laminar flow and minimize turbulence in the measurement chamber. In yet another embodiment, the sensor and the control subsystem may form a pressure control unit configured to control a pressure in the measurement chamber. The pressure in the measurement chamber may be above, below, under vacuum, or substantially the same as the pressure outside of the measurement chamber. The pressure may be controlled using any method and devices known in the art.

In some embodiments, the system and/or the measurement chamber may also include one or more "passive" components that are configured to control the conditions in the measurement chamber. For instance, the system may include one or more elements disposed within the measurement chamber that are configured to preferentially remove one or more species from the environment in the measurement chamber. Examples of such elements include desiccant to remove water and gettering materials. In another example, the measurement chamber may be configured to substantially eliminate light entering the chamber. The purpose of the light blocking design of the measurement chamber may be to control surface photovoltages induced in the wafer by ambient light. The system shown in FIG. 48 may be further configured as described herein.

As described above with respect to FIG. 38, the system includes a probe (e.g., probe tip 460 coupled to cantilever 458) that is configured to measure a voltage of the wafer after the charge is deposited on the wafer. In some embodiments, a control subsystem as described herein (e.g., control subsystem 500 shown in FIG. 39) may be configured to select a geometry of the probe based on one or more characteristics of test structures formed on the wafer.

Figure 49:
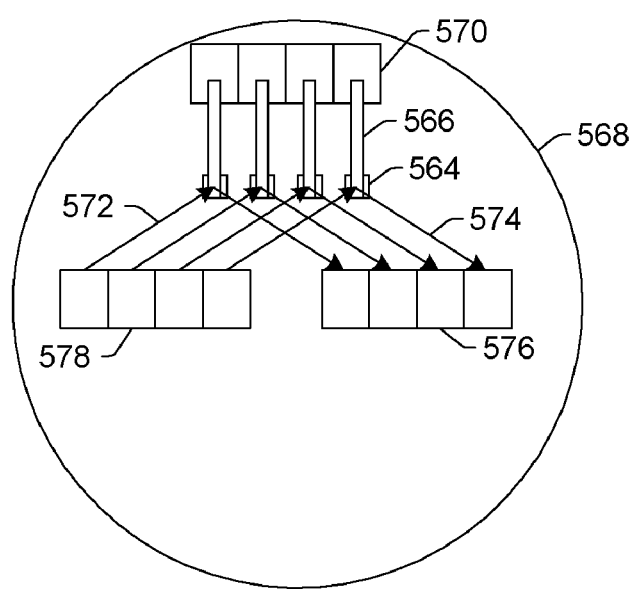
FIG. 49 is a schematic diagram illustrating a top view of one embodiment of multiple probes that are configured to measure one or more electrical properties of a wafer after a charge is deposited on the wafer.

One embodiment of a system that is configured to measure one or more electrical properties of a wafer includes multiple probes, as shown in FIG. 49. In particular, the system includes probe tips 564. Each of the probe tips is coupled to one of cantilevers 566. Each of the probe tips may have a different geometry. For example, one probe tip may be a sharp AFM type probe tip, and another of the probe tips may be a relatively dull probe tip. Depending on the test structure being measured, the control subsystem may determine an appropriate geometry of the probe tip for the measurement and may be configured to move the appropriate probe tip to a position above the test structure (not shown) on wafer 568. For example, cantilevers 566 may each be coupled to one of carrier bases 570. In addition, the carrier bases may be coupled to a coarse positioning actuator (not shown in FIG. 49), which may be configured as described above with respect to FIG. 38. The control subsystem may be coupled to the coarse positioning actuator such that the control subsystem can control the coarse positioning actuator to alter the position of probe tips 564 with respect to test structures formed on wafer 568. The control subsystem may be coupled to the coarse positioning actuator as described further above.

In one embodiment, therefore, the system may include more than one voltage probe. The probes may be configured as described above. For example, the probes may be configured as Kelvin Force Probes. In addition, the geometry of the probe tip may be varied as described above to enhance the detection efficiency of voltage changes on test structures, which may be located in scribe lines on patterned wafers. Probe tips having different geometries may also be used to measure the voltage of a single test structure. In this manner, the control subsystem may be configured to alter the position of the probes as described above with respect to the test structure between different voltage measurements. In one embodiment, the probe tip may be substantially planar. However, the probe tip may have any suitable geometry known in the art.

As described above with respect to FIG. 38, stacked PZT 466 may be configured to move the probe toward or away from the wafer. In some embodiments, the probe system may include a sensor (not shown) such as a capacitive sensor, accelerometer, or laser interferometer that is configured to determine a height of the probe (i.e., a distance between the probe and the wafer surface). The sensor may be coupled to the probe in any suitable manner. For instance, the sensor may be coupled to the surface of stacked PZT 466 closest to the wafer surface. A control subsystem as described herein may be coupled to the sensor. In this manner, the control subsystem may be configured to receive output from the sensor and to determine the height of the probe using the output. In addition, the control subsystem may be coupled to stacked PZT 466 such that the control subsystem can control stacked PZT 466 based on the output of the height sensor to alter a position of the probe with respect to the wafer surface. The control subsystem may be coupled to stacked PZT 466 as described above. Alternatively, any other suitable subsystem such as a servo control subsystem may be controlled by the control subsystem to alter the height of the probe with respect to the wafer surface. In this manner, the systems described herein may be configured to maintain the height of the probe during voltage measurements. As such, the system may be used to compensate for vibration or other external disturbances to maintain a substantially constant probe height during measurement.

As shown in FIG. 49, the system may include multiple probes, each of which includes one of probe tips 564 coupled to one of cantilevers 566. As described above, each or some of the probe tips may have different geometries that may be used for voltage measurements of differently configured test structures. In an alternative embodiment, the probe tips may have the same geometry. In either embodiment, the multiple probes may be configured to measure a voltage of multiple test structures (not shown) formed on wafer 568 substantially simultaneously after a charge is deposited on the wafer.

In one such embodiment, the spacing between the probe tips may be selected and/or altered such that each of the probe tips is arranged above a different test structure on the wafer. The position of the probe tips may be altered as described above using a control subsystem described herein. In addition, the system may be configured to measure a voltage of each of the test structures resulting from the charge deposition as described above. For instance, the system may be configured to illuminate each of the cantilevers with light 572 substantially simultaneously such that variations in light 574 reflected from the cantilevers can be detected substantially simultaneously. As described further above, upon capacitive coupling of the tip with the surface, the oscillation frequency and phase of movement of the probe may vary. The shift in the oscillation frequency and phase may be proportional to a surface potential of a test structure formed on a wafer. In one embodiment, the cantilever is vibrated at or near its resonant frequency, $\omega_0$, and is brought in proximity to the sample surface. The cantilever's amplitude is measured by a laser deflection system such as that shown in FIG. 38.

While the probe is maintained at a constant distance above the sample surface, an AC voltage bias at a different frequency, $\Omega$, is applied to the probe. This ac bias generates electric interaction forces between the probe and surface, which is given by:

$$F_e = F_0 + F_\Omega + F_{2\Omega} = F_0 + V_0 V_\Omega \sin(\Omega t) \frac{\partial C}{\partial z} + \frac{1}{4} V_\Omega^2 \cos(2\Omega t) \frac{\partial C}{\partial z} \quad (18)$$

where $V_0 = V_s - V_p$ is the potential difference between the surface and the probe. The force component $F_\Omega$ is proportional to $V_0$. The cantilever's amplitude, $A(\Omega)$, which is caused by this force component can be measured through a lock-in amplifier (not shown). The output of the lock-in amplifier is used as the input in a voltage servo loop (not shown) to minimize $V_0$ by changing surface potential, $V_s$, or probe potential, $V_p$. When $V_0=0$, $V_s=V_p$. The lock-in amplifier and the voltage servo loop may be included in the control subsystem described further herein.

In another embodiment, the probe is brought to the sample surface until a predetermined probe-surface gap is reached. Then, an AC voltage with frequency at or near the resonant frequency of the cantilever is applied to the probe. At this time, there is no mechanical drive to excite the cantilever. The force component $F_\Omega$ in Equation 18 is now $F_{107}$. If there was a small potential difference, $V_0$, between the probe ($V_p$) and the sample surface ($V_s$), this electrical force component will act as the excitation force driving the cantilever's vibration. Again, the vibration amplitude $A(\omega)$ is detected through the lock-in amplifier and is used as an error signal for a feedback control loop, which applies a DC bias to the cantilever in order to minimize the cantilever vibration at the AC bias frequency. In other words, when the cantilever amplitude $A(\omega)=0$, $V_0=0$, and thus the surface potential ($V_s$) equals the probe potential ($V_p$). In this manner, signals generated by detector 576 may be used to determine the surface potential of each of the test structures substantially simultaneously.

In one embodiment, detector 576 may include a linear array of photosensitive elements, and each photosensitive element may generate output signals corresponding to the light reflected from one of the cantilevers. Alternatively, detector 576 may include a plurality of individual detectors, each of which is configured to detect light reflected from one of the cantilevers. Each of the individual detectors may be further configured as described above. In addition, light 572 may be generated by light source 578. Light source 578 may include any light source that can be used to illuminate each of the cantilevers substantially simultaneously. For instance, the light source may include a plurality of light sources arranged such that light from each of the light sources is directed to a different cantilever. The plurality of light sources may include any suitable light sources known in the art such as lasers and LEDs. Alternatively, the light source may include a single light source coupled to a beam multiplier (not shown). The beam multiplier may include any suitable optical component known in the art such as a grating or a plurality of beam splitters that can be used to generate multiple beams of light from a single beam of light. Each of the individual beams of light is directed to one of the cantilevers.

Although the multiple probes are shown in FIG. 49 to be arranged in a linear array, it is to be understood that the probes may be configured in any suitable arrangement. For example, the probes may be configured in a staggered array that includes two linear arrays that are spatially separated from each other. In addition, the position of the probes within the arrangement may be fixed. Alternatively, the position of each of the probes may be altered independently of one another using one or more positioning devices described herein, which can be controlled by a control subsystem described herein. In any case, the system may be configured to use the multiple probes to perform simultaneous voltage measurements on multiple test structures. Such a system may be particularly advantageous for performing measurements of multiple test structures since the throughput of the measurement process may be substantially higher than measurement processes in which each test structure is measured serially. In addition, such a system may be particularly advantageous for performing measurements by scanning across the wafer to substantially improve the throughput of the process.

In some embodiments, the one or more electrical properties of the wafer or test structures on the wafer may be determined using an SPV measurement. In such embodiments, the system includes an illumination subsystem that is configured to direct light to the wafer during voltage measurements. In one embodiment, the illumination subsystem may include focused light source 478 as shown in FIG. 38, which is configured to generate a photovoltage within a focused spot on a wafer. In this manner, the system may be configured to couple light to the wafer during voltage measurements to measure the SPV. As described further above, the probe may be configured such that light used for SPV measurements can be passed through the probe. In addition, the illumination subsystem may be configured such that the light used for SPV measurements can be directed to the wafer at any appropriate angle of incidence (e.g., normal incidence, oblique incidence, etc.).

The illumination subsystem may include a number of additional optical components (not shown) that can be coupled to light source 478 shown in FIG. 38 or any other light source that is used for SPV measurements. For instance, the illumination subsystem may be configured to direct the light to the surface of the wafer through free space using reflective and/or refractive elements (e.g., mirrors, lenses, etc.) or through fiber optics. Sources that may be included in the illumination subsystem may include pulsed or CW lasers (tunable and/or fixed frequency) and/or pulsed or CW broadband sources. In addition, the illumination subsystem may include filter elements that are configured to restrict the frequencies and/or to alter the intensity of the light that is directed to the wafer for SPV measurements. Alternatively, the light source itself may include one or more components that are configured to alter light intensity to vary the injection level in the sample. In one embodiment, the SPV measurement is equal to the voltage difference between the wafer in the dark and illuminated by the illumination subsystem. The illumination subsystem may be configured to modulate the light from the light source using any suitable device or method known in the art such as a chopper wheel and transistor-transistor logic (TTL) modulation of the laser controller. In such instances, the signals corresponding to light reflected from the probe may be demodulated using a lock-in amplifier.

In some embodiments, two or more wavelengths of light (e.g., generated by a multi-wavelength laser) may be modulated at the same frequency and may be simultaneously directed to the sample to determine the minority carrier diffusion length. Examples of methods for determining the minority carrier diffusion length are described in co-pending, commonly assigned U.S. patent application Ser. No. 11/078, 669 filed on Mar. 10, 2005, by Shi et al., which is incorporated by reference as if fully set forth herein. The systems and methods described herein may be further configured as described in this patent application.

Figure 50:
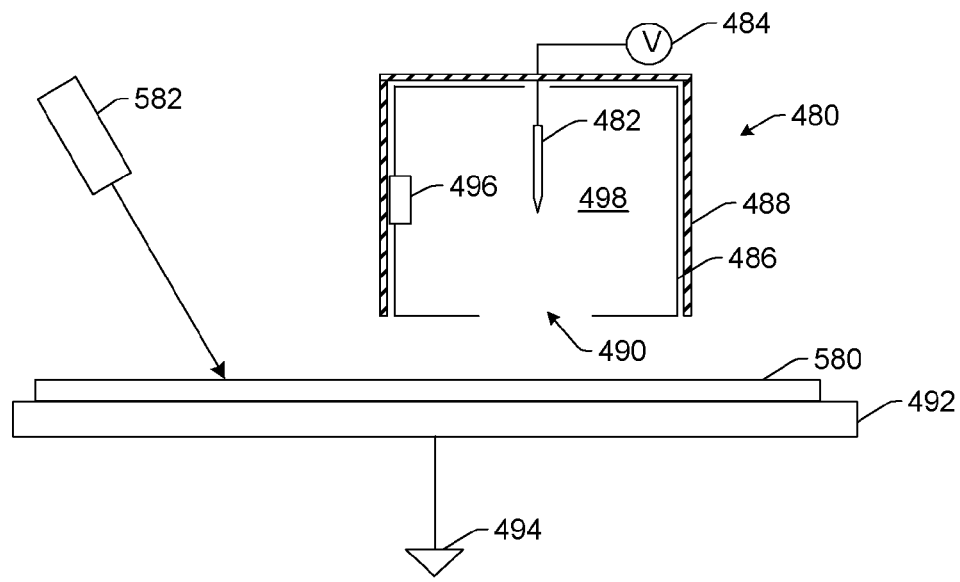
FIGS. 50-51 are schematic diagrams illustrating a cross-sectional view of additional embodiments of a system that is configured to control deposition of a charge on a wafer for measurement of one or more electrical properties of the wafer.

In additional embodiments, the system may include a sample preparation subsystem that is configured to alter one or more characteristics of the wafer before the charge is deposited on the wafer. One such embodiment of the system is illustrated in FIG. 50. In particular, the system includes corona source 480, which may be configured as described above. In addition, the system includes stage 492, which may be configured as described above. Wafer 580 may be disposed on stage 492. The wafer may be configured as described herein.

The system also includes sample preparation subsystem 582. In this embodiment, the sample preparation subsystem includes a laser that is configured to illuminate a portion of the wafer thereby causing removal of one or more materials from the surface of the illuminated portion of the wafer. The material(s) that can be removed in this manner may include, for example, water vapor and contamination. The sample preparation subsystem may be used to treat the surface of the wafer to provide measurement stability.

After sample preparation, the position of the wafer may be altered such that the prepared portion of the wafer may be positioned under corona source 480 for charge deposition. In this manner, any materials that are removed from the wafer during sample preparation may not enter the corona source due to the spacing between the sample preparation subsystem and the corona source. In some embodiments, the system may include one or more gas flow devices (not shown) to evacuate any removed material from the environment surrounding the wafer and the corona source. In an alternative embodiment, the sample preparation subsystem may be configured to alter a portion of the wafer that is positioned under the corona source. In this manner, the position of the wafer may not be altered after sample preparation. In some embodiments, the systems described herein may include one or more sample preparation subsystems that are configured to prepare, passivate, and/or modify the surface or material of the wafer.

The sample preparation subsystem shown in FIG. 50 may include a pulsed or CW laser that is configured to remove contamination from the surface of the wafer. The laser may be a single wavelength laser or a multi-wavelength laser. Additional examples of sample preparation subsystems that may be included in the systems described herein are illustrated in co-pending, commonly assigned U.S. patent application Ser. Nos. 10/056,271 filed on Jan. 23, 2002 published as U.S. Patent Application Publication No. 2003/0137662 by Janik et al. and Ser. No. 11/021,555 filed on Dec. 22, 2004 by McWhirter et al., both of which are incorporated by reference as if fully set forth herein.

The sample preparation subsystem shown in FIG. 50 may alternatively or additionally include a broadband light source that is configured to heat a portion of the wafer. Additional sources that can be used to heat a portion of the wafer include, but are not limited to, tungsten halogen lamps, deuterium ($D_2$) lamps configured to emit VUV or UV light, infrared (IR) light sources, synchrotron sources, x-ray radiation sources, electron beam sources, gamma and beta radiation sources, etc. Alternative embodiments of the sample preparation subsystem may use radio frequency (RF) or microwave radiation to heat the portion of the wafer. In a different embodiment, the system may include a thermal unit (not shown) that may be configured to raise and/or lower the temperature of the wafer prior to measurements. For example, stage 492 may be configured to support the wafer during measurements and may also include a thermal unit that may be configured in such a manner. For example, the stage may include a plurality of elements, some of which are configured to raise the temperature of the wafer, and some of which may be configured to lower the temperature of the wafer. In addition, the systems described herein may be configured to perform sample preparation using more than one source of heat. In this manner, surface preparation using one or some combination of the above sources may be used to generate the desired surface conditions for charge deposition based voltage measurements and to enable extremely precise and stable measurements.

In additional embodiments, the sample preparation subsystem may be configured to alter one or more characteristics of the wafer before the charge is deposited on the wafer such that different locations on the wafer have different values of the one or more characteristics. For example, the sample preparation subsystem shown in FIG. 50 may be configured to scan across the wafer and/or to sequentially illuminate different locations on the wafer. Each or some of the different locations may be illuminated differently such that the characteristics of the surface at different locations may be different. In another example, the stage may be configured to alter the temperature of the wafer locally at a measurement site, to alter the temperature of the wafer such that the temperature is substantially the same across the wafer, and/or alter the temperature of different locations on the wafer differently.

Any of the sample preparation methods described above may be performed before, during, and/or after charge deposition and/or voltage measurement. The system shown in FIG. 50 may be further configured as described herein. For example, the control subsystem shown in FIG. 39 may be coupled to the sample preparation subsystem such that the control subsystem may control the sample preparation subsystem based on, for example, the characteristics of the wafer and/or the measurements that will be performed on the wafer.

Figure 51:
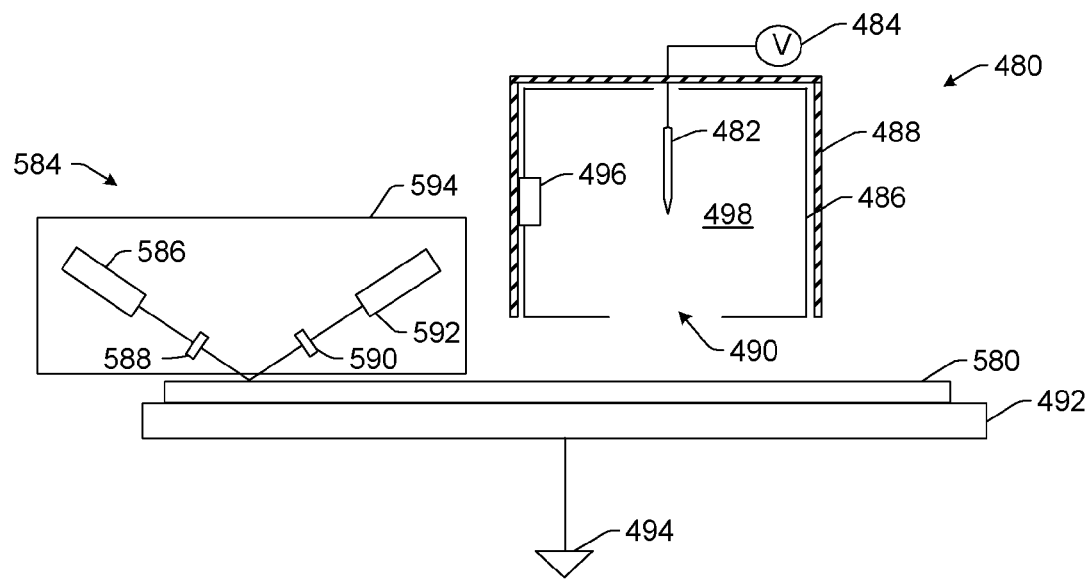

In another embodiment, the systems described herein may include an additional measurement subsystem that is configured to measure one or more different properties of the wafer. One such embodiment of a system is shown in FIG. 51. As shown in FIG. 51, the system includes corona source 480, which may be configured as described above. In addition, the system includes stage 492, which may also be configured as described herein. Wafer 580 may be disposed on stage 492 during measurements. Wafer 580 may be configured as described herein.

The system shown in FIG. 51 also includes measurement subsystem 584. In this embodiment, measurement subsystem 584 includes light source 586, polarizer 588, analyzer 590, and detector 592. The light source, polarizer, analyzer, and detector may include any such suitable components known in the art. In this manner, the measurement subsystem is configured as an ellipsometer. The ellipsometer may be configured as any type of ellipsometer known in the art such as a spectroscopic ellipsometer, a rotating polarizer ellipsometer, and a rotating analyzer ellipsometer. As shown in FIG. 51, the components of the measurement subsystem may be disposed within housing 594. Housing 594 may serve a variety of purposes such as substantially preventing stray light from other components of the system from affecting the measurements performed by measurement subsystem 584 and preventing materials removed from the wafer by a sample preparation subsystem such as those described above from affecting the optical components of the measurement subsystem and/or the measurements. Alternatively, the measurement subsystem may be disposed in the environment of the system such as the environment of measurement chamber 558 shown in FIG. 48.

A control subsystem such as those described herein may also be coupled to one or more components of measurement subsystem 584. For example, the control subsystem may be coupled to one or more optical components of the measurement subsystem such that the control subsystem can control the measurements that are performed by the measurement subsystem. In another example, the control subsystem may be coupled to one or more sensors (not shown) and one or more devices (not shown) coupled to housing 594. In this manner, the one or more sensors may be configured to monitor one or more conditions within housing 594, and the control subsystem may be configured to control the one or more devices coupled to housing 594 to alter the condition(s) within the housing. The sensor(s) and the device(s) coupled to housing 594 may include any of those described herein. In this manner, the system may be configured to monitor, alter, and control conditions within the housing of measurement subsystem 584 such as temperature, humidity, pressure, and properties of one or more gases in housing 594.

As shown in FIG. 51, therefore, the system may include one additional measurement subsystem. In addition, the measurement subsystem shown in FIG. 51 is configured to perform one type of measurements (e.g., ellipsometric measurements). However, the additional measurement subsystem may be configured to perform multiple types of measurements of the wafer (e.g., ellipsometric and reflectometric measurements). Examples of suitable systems that can be used as an additional measurement subsystem in the embodiments described herein are illustrated in U.S. patent application Ser. No. 09/956,844 filed Sep. 20, 2001 by Fielden et al. published as U.S. Patent Application Publication No. 2002/0179864 on Dec. 5, 2002, which is incorporated by reference as if fully set forth herein. In another alternative, the system may include more than one additional measurement subsystem. Examples of appropriate measurement subsystems that may be included in the systems described herein include, but are not limited to, optical subsystems (e.g., ellipsometer, spectroscopic ellipsometer, reflectometer, spectroscopic reflectometer, FTIR, surface enhanced raman spectroscopy (SERS), infrared reflectance absorbance spectroscopy (IR-RAS), etc.), electron beam subsystems (e.g., SEM, electron stimulated x-ray (ESX), etc.), x-ray based subsystems (e.g., grazing incidence x-ray reflectometer, x-ray fluorescence (XRF), etc.), and scanning probe microscope based subsystems (e.g., AFM, near field scanning optical microscopy (NSOM), etc.). The properties of the wafer that can be measured by such measurement subsystems include, but are not limited to, optical thickness, index of refraction, CD, sidewall profile, roughness, and composition.

These measurement subsystems may be configured as stand alone units (which may be coupled to the system by a transmission medium), one or more modules combined in a single measurement chamber (e.g., housing 594), or one or more modules integrated into a process tool such as those described further herein. In addition, as shown in FIG. 51, the additional measurement subsystem and corona source 480 may be coupled to the same stage. In this manner, the additional measurement subsystem may be configured to measure one or more properties of the wafer during a charge deposition and/or subsequent voltage measurements. In addition, the voltage measurements and the additional measurements may be performed in a serial manner at one or more measurement sites on a wafer while the wafer is disposed on the same stage. Alternatively, the measurement subsystem and the corona source may be coupled to different stages. In this manner, the voltage measurements and the additional measurements may be performed sequentially for a single wafer. The wafer may be moved from one stage to the other by a common wafer handler (not shown) that may be included in the system. The common wafer handler may include any suitable mechanical or robotic components known in the art.

Another embodiment is related to a method for controlling deposition of a charge on a wafer for measurement of one or more electrical properties of the wafer. The wafer may be configured as described herein. The method may be performed by any of the systems described herein. For example, the method includes measuring one or more conditions within a corona source. Measuring the condition(s) within the corona source may be performed as described herein. The corona source may be configured as described herein. The method also includes altering one or more parameters of the corona source based on the one or more conditions. Altering the parameter(s) of the corona source may be performed as described herein.

The method described above may also include any other step(s) described herein. For example, the one or more conditions that are measured may include one or more properties of one or more chemical species in the corona source. In addition, the one or more parameters of the corona source that are altered may include one or more parameters of one or more gas flow devices coupled to the corona source. The one or more gas flow devices may be configured as described above. The method may also include mixing the one or more chemical species prior to introduction of the one or more chemical species to the corona source.

The method may include measuring the one or more conditions in the corona source using an optical technique. Some embodiments of the method may include controlling a reaction in the corona source using an optical subsystem such as those described above.

In another embodiment, the one or more conditions in the corona source that are measured may include one or more properties of a magnetic field in the corona source. Such an embodiment of the method may include altering one or more parameters of a magnetic device coupled to the corona source.

Some embodiments of the method may include measuring a position of the corona source with respect to the wafer. Such a method may also include altering the position of the corona source with respect to the wafer as described above. In another embodiment, the method may include selecting a geometry of a probe based on one or more characteristics of test structures formed on the wafer. The probe may be configured as described above to measure the one or more electrical properties of the wafer after the charge is deposited on the wafer. An additional embodiment of the method includes measuring one or more electrical properties of multiple test structures on the wafer substantially simultaneously after the charge is deposited on the wafer. Such measurements may be performed using multiple probes, which may be configured as described above.

One embodiment of the method includes controlling one or more parameters of a measurement chamber in which the corona source is disposed. The parameter(s) of the measurement chamber may be controlled as described above. In some embodiments, the method includes altering one or more characteristics of the wafer before the charge is deposited on the wafer. The characteristic(s) may be altered using a sample preparation subsystem that is configured as described above. In addition, the method may include altering one or more characteristics of the wafer before the charge is deposited on the wafer such that different locations on the wafer have different values of the one or more characteristics. Such altering may also be performed using a sample preparation subsystem described herein. In another embodiment, the method includes measuring one or more different properties of the wafer using an additional measurement subsystem. The additional measurement subsystem may be configured as described herein.

An additional embodiment of the method includes directing light to the wafer during voltage measurements. The light may be directed to the wafer using an illumination subsystem configured as described herein. In such an embodiment, the one or more electrical properties of the wafer that are measured may include an SPV of the wafer or a test structure formed on the wafer. Each of the steps of the embodiments of the method described above may be performed as described herein. Each of the embodiments of the method described above may include any other step(s) described herein.

Another embodiment of a method for controlling deposition of a charge on a wafer for measurement of one or more electrical properties of the wafer includes producing a mixture of gases in a discharge chamber of a corona source. The mixture of gases may be produced in the discharge chamber of the corona source as described further above. In addition, the corona source may be configured as described above. The method also includes depositing the charge on the wafer using the corona source while the mixture of gases is in the discharge chamber. The mixture of gases alters one or more parameters of the charge deposited on the wafer. The charge may be deposited on the wafer as described above. In addition, the mixture of gases may alter the one or more parameters of the charge deposited on the wafer as described further above. For example, the mixture of gases may control the lateral diffusion of the charge deposited on the wafer.

In one embodiment, the mixture includes $CO_2$ and Kr. In another embodiment, about 65 volume % to about 85 volume % of the mixture includes $CO_2$, and about 15 volume % to about 35 volume % of the mixture includes Kr. In an additional embodiment, about 75 volume % of the mixture includes $CO_2$, and about 25 volume % of the mixture includes Kr. The gas mixture may also or alternatively include one or more of the gases described herein. Each of the embodiments of the method described above may include any other step(s) described herein.

Each of the systems described herein may include a processor (not shown). The processor may be configured to receive output from a detector coupled to a probe as described herein. The output from the detector may be responsive to a property such as a potential or a photovoltage of the wafer as measured by the detector. The processor may also be configured to determine a property of the wafer from the output. The processor may also be configured to monitor the properties of multiple wafers to monitor processes used to form the wafer. In addition, the processor may be configured to determine if the process is reproducible and/or within acceptable limits from the property of the wafer and/or the properties of multiple wafers. Therefore, such a system may be used to monitor and/or evaluate a process tool during process tool qualification, process development, manufacturing, or some combination thereof.

In an embodiment, the processor may also be configured to alter a parameter of a process tool in response to the property using a feedback control technique, a feedforward control technique, and/or an in situ control technique. For example, the processor may be coupled to a process tool such that the processor may send control signals to various instruments of the process tool. The control signals may be responsive to the property of the wafer determined by a system as described herein. As such, the system may be configured to automatically alter a parameter of a process tool in response to a determined property of a wafer. In addition, the processor may be configured to generate an output signal if the property is outside of a predetermined range for the property. The output signal may have any suitable configuration.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, a processor may be configured to execute the program instructions to perform a method according to the above embodiments. The processor may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Further modifications and alternative embodiments of various aspects of the invention may be apparent to those skilled in the art in view of this description. For example, test pads, methods, and systems for measuring properties of a wafer and systems and methods for controlling deposition of a charge on a wafer for measurement of one or more electrical properties of the wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to control deposition of a charge on a wafer for measurement of one or more electrical properties of the wafer, comprising:

a corona source configured to deposit the charge on the wafer, wherein the corona source comprises a needle disposed within a discharge chamber, wherein the discharge chamber and the needle are disposed within a housing of the corona source, wherein the corona source further comprises one or more shielding components disposed within the housing and around the discharge chamber such that the discharge chamber is within the one or more shielding components, wherein the corona source is configured to generate a plasma in the discharge chamber such that the plasma is generated within the one or more shielding components, and wherein the one or more shielding components are configured to prevent interaction between the plasma and components of the corona source;

a sensor configured to measure one or more conditions within the corona source, wherein the one or more conditions comprise one or more properties of two or more chemical species in the corona source during deposition of the charge on the wafer;

one or more gas flow devices coupled to the corona source, wherein the one or more gas flow devices comprise one or more mixing chambers coupled to an inlet of the corona source, and wherein the one or more mixing chambers are configured to mix the two or more chemical species prior to introduction of the two or more chemical species to the corona source; and a control subsystem configured to alter one or more parameters of the corona source based on the one or more conditions.

2. The system of claim 1, wherein the one or more parameters comprise one or more parameters of the one or more gas flow devices coupled to the corona source.

3. The system of claim 1, wherein the sensor is further configured to measure the one or more conditions within the corona source using an optical technique.

4. The system of claim 1, further comprising an optical subsystem configured to control a reaction in the corona source.

5. The system of claim 1, further comprising a coating formed on surfaces of one or more components of the corona source, wherein the surfaces are internal to the corona source, and wherein the coating is selected to alter the one or more conditions within the corona source.

6. The system of claim 1, wherein the one or more conditions comprise one or more properties of a magnetic field in the corona source, and wherein the one or more parameters comprise one or more parameters of a magnetic device coupled to the corona source.

7. The system of claim 1, further comprising an additional sensor configured to measure a position of the corona source with respect to the wafer.

8. The system of claim 1, further comprising multiple probes configured to measure the one or more electrical properties of multiple test structures on the wafer substantially simultaneously after the charge is deposited on the wafer.

9. The system of claim 1, wherein the control subsystem is further configured to control one or more parameters of a measurement chamber in which the corona source is disposed.

10. The system of claim 1, further comprising a sample preparation subsystem configured to alter one or more characteristics of the wafer before the charge is deposited on the wafer.

11. The system of claim 1, further comprising a sample preparation subsystem configured to alter one or more characteristics of the wafer before the charge is deposited on the wafer such that different locations on the wafer have different values of the one or more characteristics.

12. The system of claim 1, further comprising an additional measurement subsystem configured to measure one or more different properties of the wafer.

13. The system of claim 1, wherein the one or more electrical properties comprise a surface photovoltage, and wherein the system further comprises an illumination subsystem configured to direct light to the wafer during voltage measurements.

14. The system of claim 1, wherein the wafer comprises a patterned wafer.

15. The system of claim 1, further comprising multiple probes configured to measure the one or more electrical properties of the wafer after the charge is deposited on the wafer, wherein each of the multiple probes has a different geometry, and wherein the control subsystem is further configured to select one of the probes for measurement of the one or more electrical properties based on one or more characteristics of test structures formed on the wafer.

16. A method for controlling deposition of a charge on a wafer for measurement of one or more electrical properties of the wafer, comprising:

measuring one or more conditions within a corona source, wherein the one or more conditions comprise one or more properties of two or more chemical species in the corona source during deposition of the charge on the wafer, wherein the corona source is configured to deposit the charge on the wafer, wherein the corona source comprises a needle disposed within a discharge chamber, wherein the discharge chamber and the needle are disposed within a housing of the corona source, wherein the corona source further comprises one or more shielding components disposed within the housing and around the discharge chamber such that the discharge chamber is within the one or more shielding components, wherein the corona source is configured to generate a plasma in the discharge chamber such that the plasma is generated within the one or more shielding components, and wherein the one or more shielding components are configured to prevent interaction between the plasma and components of the corona source;

mixing the two or more chemical species in one or more mixing chambers prior to introduction of the two or more chemical species to the corona source, wherein the one or more mixing chambers are coupled to an inlet of the corona source; and altering one or more parameters of the corona source based on the one or more conditions.

17. A method for controlling deposition of a charge on a wafer for measurement of one or more electrical properties of the wafer, comprising:

producing a mixture of gases in a discharge chamber of a corona source; and depositing the charge on the wafer using the corona source while the mixture of gases is in the discharge chamber, wherein the mixture of gases alters one or more parameters of the charge deposited on the wafer, wherein only between 65 volume % to 85 volume % of the mixture comprises carbon dioxide, and wherein only between 15 volume % to 35 volume % of the mixture comprises krypton.

18. The method of claim 17, wherein 75 volume % of the mixture comprises carbon dioxide, and wherein 25 volume % of the mixture comprises krypton.

* * * * *